United States Patent
Choi et al.

(10) Patent No.: US 9,276,074 B2
(45) Date of Patent: Mar. 1, 2016

(54) METHODS OF FABRICATING SEMICONDUCTOR DEVICES HAVING BURIED CHANNEL ARRAY

(71) Applicants: Jay-Bok Choi, Gyeonggi-do (KR); Yoo-Sang Hwang, Suwon-si (KR); Ah-Young Kim, Seoul (KR); Ye-Ro Lee, Seoul (KR); Gyo-Young Jin, Seoul (KR); Hyeong-sun Hong, Gyeonggi-do (KR)

(72) Inventors: Jay-Bok Choi, Gyeonggi-do (KR); Yoo-Sang Hwang, Suwon-si (KR); Ah-Young Kim, Seoul (KR); Ye-Ro Lee, Seoul (KR); Gyo-Young Jin, Seoul (KR); Hyeong-sun Hong, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 264 days.

(21) Appl. No.: 13/761,376

(22) Filed: Feb. 7, 2013

(65) Prior Publication Data

US 2013/0288472 A1 Oct. 31, 2013

(30) Foreign Application Priority Data

Apr. 30, 2012 (KR) .................. 10-2012-0045696

(51) Int. Cl.
*H01L 21/44* (2006.01)
*H01L 21/336* (2006.01)
*H01L 29/423* (2006.01)
*H01L 29/66* (2006.01)
*H01L 27/108* (2006.01)
*H01L 27/02* (2006.01)

(52) U.S. Cl.
CPC .... *H01L 29/42312* (2013.01); *H01L 27/10814* (2013.01); *H01L 27/10823* (2013.01); *H01L 27/10855* (2013.01); *H01L 27/10876* (2013.01); *H01L 27/10885* (2013.01); *H01L 27/10888* (2013.01); *H01L 29/4236* (2013.01); *H01L 29/66621* (2013.01); *H01L 27/0207* (2013.01)

(58) Field of Classification Search
CPC ............... H01L 29/66621; H01L 29/4236; H01L 27/0207; H01L 27/10823; H01L 27/10876; H01L 29/42312; H01L 27/10814; H01L 27/10855; H01L 27/10885; H01L 27/10888
USPC .......................................... 438/589
See application file for complete search history.

(56) References Cited

U.S. PATENT DOCUMENTS

| 7,034,352 | B2 |  | 4/2006 | Seitz et al. |
|---|---|---|---|---|
| 7,091,537 | B2 | * | 8/2006 | Ozaki ........................ 257/295 |
| 7,319,255 | B2 | * | 1/2008 | Hwang et al. ................ 257/330 |

(Continued)

FOREIGN PATENT DOCUMENTS

| JP | 2004-095745 | 3/2004 |
|---|---|---|
| KR | 1020100092241 | 8/2010 |

(Continued)

*Primary Examiner* — Mary Wilczewski
(74) *Attorney, Agent, or Firm* — F. Chau & Associates, LLC

(57) ABSTRACT

A method of fabricating a semiconductor device comprises forming a first and a second parallel field regions in a substrate, the parallel field regions are extended in a first direction, forming a first and a second gate capping layer in a first and a second gate trench formed in the substrate respectively, removing the gate capping layers partially so that a first landing pad hole is expanded to overlap the gate capping layers buried in the substrate partially, forming a landing pad material layer in the first space, and forming a bit line contact landing pad by planarizing the landing pad material layer to the level of top surfaces of the capping layers.

12 Claims, 73 Drawing Sheets

(56) References Cited

U.S. PATENT DOCUMENTS

| | | | |
|---|---|---|---|
| 7,675,110 B2 | 3/2010 | Uchiyama | |
| 8,115,246 B2 | 2/2012 | Kim et al. | |
| 8,174,064 B2 * | 5/2012 | Jang | 257/330 |
| 8,466,052 B2 * | 6/2013 | Baek et al. | 438/589 |
| 8,716,124 B2 * | 5/2014 | Schultz | 438/622 |
| 9,087,721 B2 * | 7/2015 | Juengling | |
| 2001/0044188 A1 * | 11/2001 | Heo et al. | 438/268 |
| 2002/0100923 A1 * | 8/2002 | Lanzerstorfer et al. | 257/249 |
| 2004/0119117 A1 * | 6/2004 | Kushida | 257/342 |
| 2005/0121709 A1 * | 6/2005 | Ozaki | 257/295 |
| 2007/0111455 A1 * | 5/2007 | Kim et al. | 438/286 |
| 2008/0160740 A1 | 7/2008 | Ahn et al. | |
| 2010/0314659 A1 * | 12/2010 | Yilmaz et al. | 257/139 |
| 2010/0330775 A1 | 12/2010 | Shin et al. | |
| 2011/0024830 A1 | 2/2011 | Hong | |
| 2011/0042733 A1 | 2/2011 | Komeda et al. | |
| 2011/0049608 A1 * | 3/2011 | Kidoh et al. | 257/324 |
| 2011/0133261 A1 | 6/2011 | Kim | |
| 2011/0147834 A1 | 6/2011 | Taniguchi | |
| 2012/0012912 A1 | 1/2012 | Kwon | |
| 2012/0119290 A1 | 5/2012 | Kim et al. | |
| 2012/0153383 A1 | 6/2012 | Shin et al. | |
| 2012/0211813 A1 * | 8/2012 | Taketani | 257/296 |
| 2013/0020622 A1 * | 1/2013 | Saino | 257/296 |
| 2013/0119474 A1 * | 5/2013 | Schultz | 257/368 |
| 2013/0288472 A1 * | 10/2013 | Choi et al. | 438/587 |
| 2013/0344666 A1 * | 12/2013 | Moon et al. | 438/259 |
| 2014/0054721 A1 * | 2/2014 | Nam et al. | 257/401 |
| 2014/0291755 A1 * | 10/2014 | Baek et al. | 257/330 |
| 2014/0346592 A1 * | 11/2014 | Soeno et al. | 257/333 |
| 2014/0367774 A1 * | 12/2014 | Yoo et al. | 257/330 |
| 2015/0008535 A1 * | 1/2015 | Juengling | 257/401 |
| 2015/0021658 A1 * | 1/2015 | Lee et al. | 257/140 |
| 2015/0055401 A1 * | 2/2015 | Kim et al. | 365/149 |

FOREIGN PATENT DOCUMENTS

| | | |
|---|---|---|
| KR | 1020100112901 | 10/2010 |
| KR | 1020100132196 | 12/2010 |
| KR | 1020110003040 | 1/2011 |
| KR | 1020110016214 | 2/2011 |

* cited by examiner

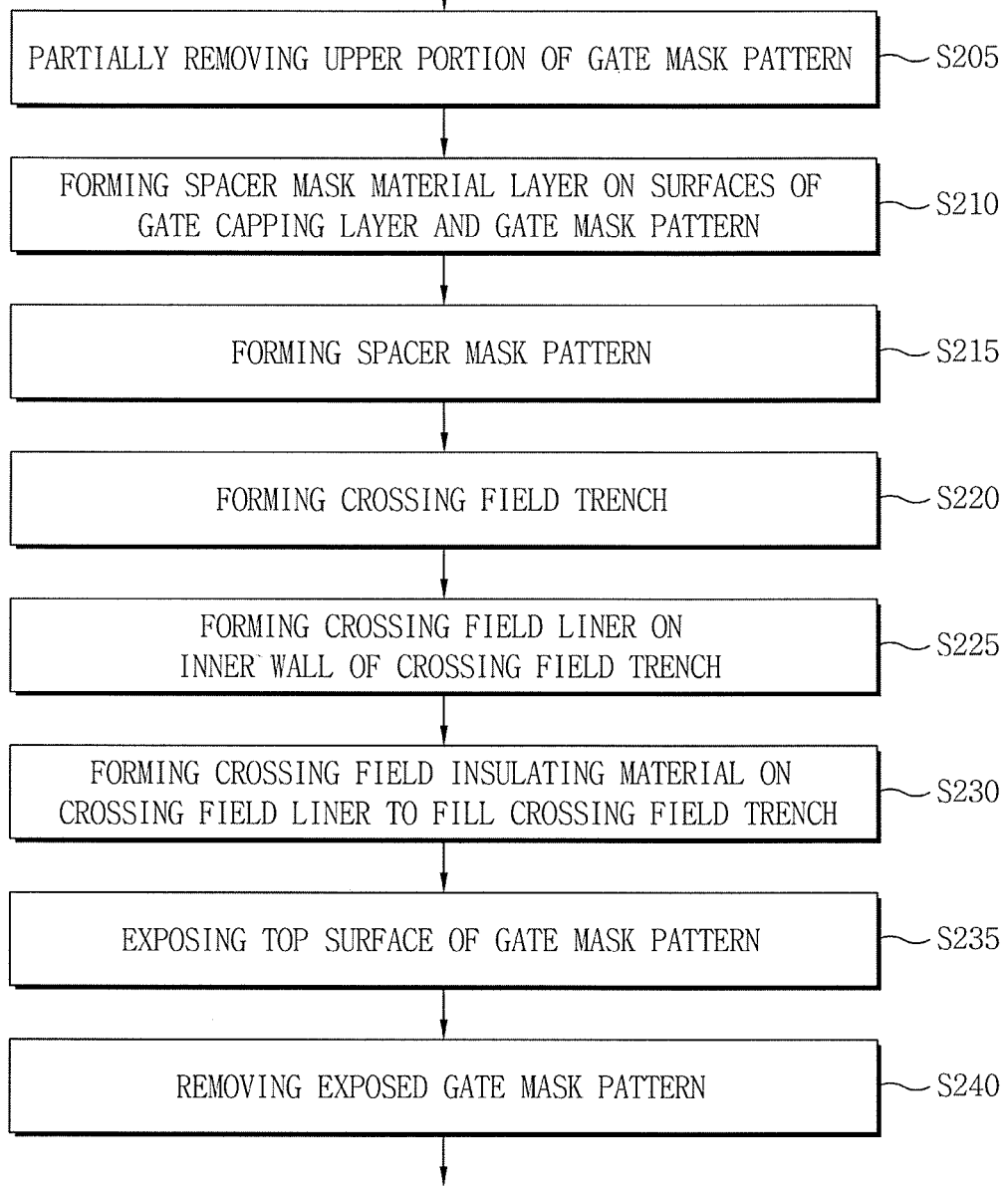

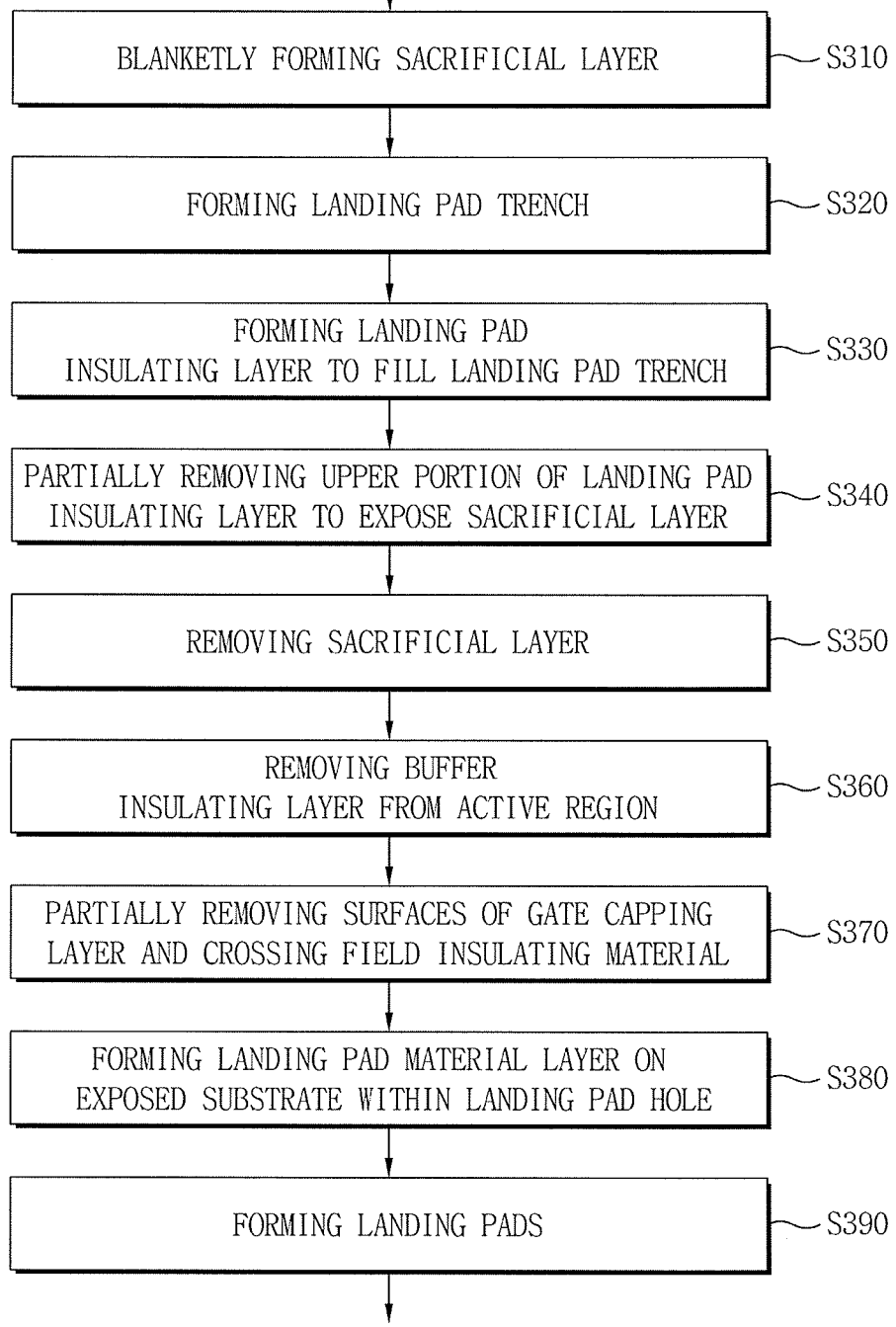

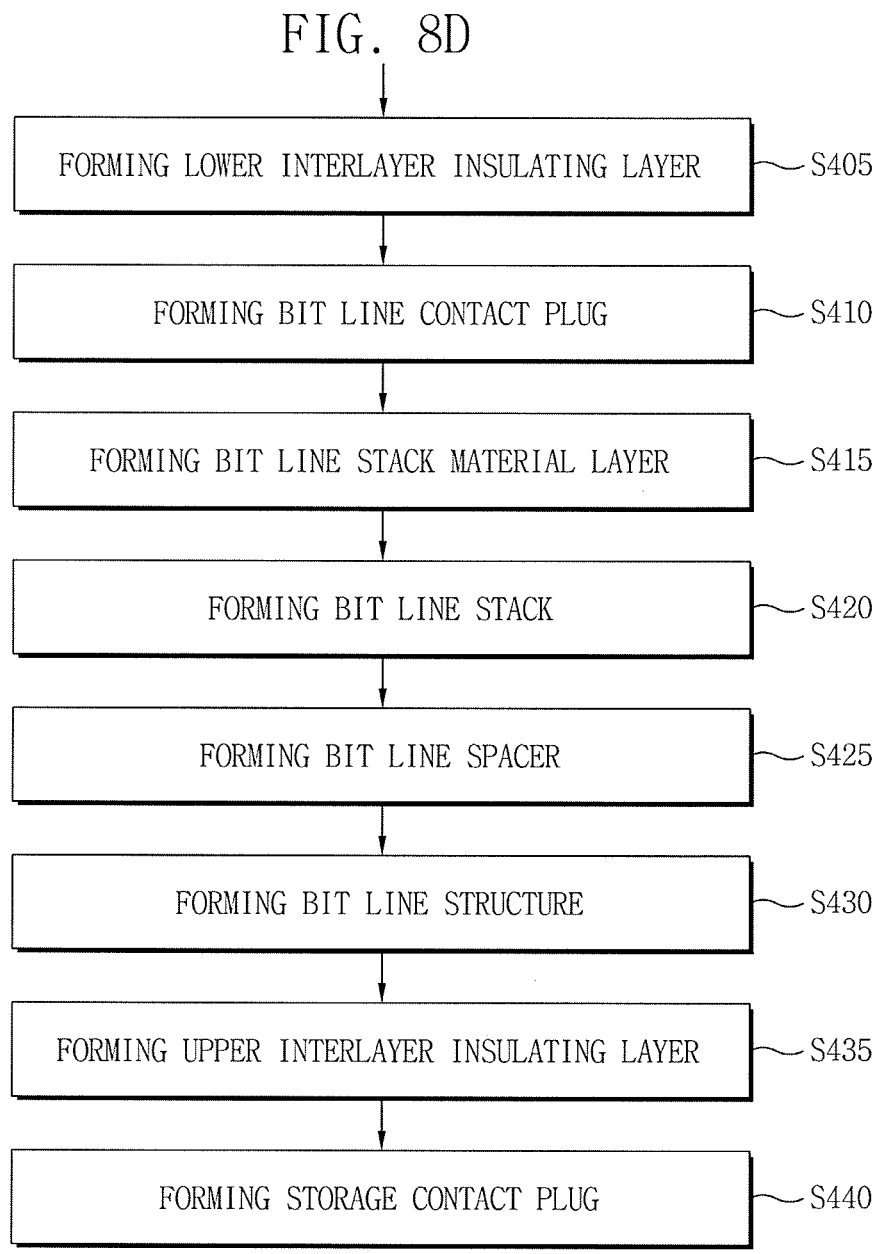

METHODS OF FABRICATING SEMICONDUCTOR DEVICES HAVING BURIED CHANNEL ARRAY

CROSS-REFERENCE TO RELATED APPLICATION

This application claims priority under 35 U.S.C. §119 to Korean Patent Application No. 10-2012-0045696 filed on Apr. 30, 2012, the disclosure of which is hereby incorporated by reference in its entirety.

TECHNICAL FIELD

Embodiments of the inventive concept relate to semiconductor devices having a buried channel array and methods of fabricating the same.

DISCUSSION OF THE RELATED ART

To improve integration density of semiconductor devices, research into a semiconductor device having a gate structure buried in a substrate is being conducted.

SUMMARY

In an exemplary embodiment, a method of fabricating a semiconductor device may include forming a first field region extending in a first direction in a substrate, forming a pair of buried gate structures extending across the first field region at a predetermined angle with respect to the first direction, and forming a second field region extending in substantially parallel with the buried gate structure.

The first field region may intersect with the second field region at an intersection region.

The intersection region may have greater depth than that of the first and the second field regions.

The forming the pair of buried gate structure may include forming a gate mask pattern having a pair of gate trench holes on the substrate, forming a pair of gate trenches in the substrate using the gate mask pattern as an etch mask, and forming a pair of gate capping layers to fill the pair of gate trenches.

The forming the second field region may include recessing the gate mask pattern partially so that each of the gate capping layers includes an upper portion exposed from the recessed the gate mask pattern, forming a spacer mask pattern on side surfaces of the upper portions of the gate capping layers and on the recessed gate mask pattern, etching the substrate using the spacer mask pattern as an etch mask to form a second field trench in the substrate, and forming a second field insulating material to fill the second field trench.

The forming the spacer mask pattern may include forming a spacer mask material layer to cover the gate capping layers and the recessed gate mask pattern, etching the spacer mask material layer to expose a portion of the gate mask pattern, and etching the exposed portion of the gate mask pattern to form a field trench hole exposing the surface of the substrate.

The forming the gate mask pattern may include forming a pad insulating layer on the substrate, forming a buffer insulating layer on the pad insulating layer, and forming the gate mask pattern on the buffer insulating layer.

The method may further include removing the spacer mask pattern to expose the gate mask pattern after forming the second field insulating material.

The method may further include removing the exposed gate mask pattern so that the buffer insulating layer is exposed, the upper portions of the pair of gate capping layers are exposed, and an upper portion of the second field insulating material is exposed.

The method may further include forming a sacrificial layer on the exposed buffer insulating layer, the exposed upper portions of the pair of gate capping layers and the exposed upper portion of the second field insulating material.

The method may further include removing the sacrificial layer over the first field region to form a landing pad trench.

The method may further include forming a landing pad insulating layer including silicon nitride to fill the landing pad trench.

The method may further include removing the landing pad insulating layer partially so that top surfaces of the landing pad insulating layer, the gate capping layer and the second field insulating material are substantially planarized.

The method may further include removing a remaining portion of the sacrificial layer to form a landing pad hole defined by the landing pad insulating layer and the pair of gate capping layers.

The method may further include removing the landing pad insulating layer and the gate capping layers partially so that the landing pad hole is expanded and overlap the buried gate structures partially.

The method may further include forming a landing pad in the landing pad hole, the landing pad overlapping the buried gate structures partially.

In an exemplary embodiment, a method of fabricating a semiconductor device may include forming a pair of first field regions in a substrate, the first field regions extending in a first direction, forming a first gate capping layer and a second gate capping layer in a first gate trench and a second gate trench formed in the substrate respectively, the first and second gate trenches extending in a second direction different from the first direction, the first and second gate capping layer including upper portions protruding from the substrate, respectively, so that a first landing pad hole is formed between the protruding upper portions of the first and the second gate capping layers, removing the first and the second gate capping layers partially so that the first landing pad hole is expanded to overlap partially with the first and the second gate capping layers, forming a landing pad material layer in the first landing pad hole, and forming a bit line contact landing pad by planarizing the landing pad material layer to a same level of top surfaces of the first and the second capping layers.

The forming a first gate capping layer and a second gate capping layer may include forming a gate mask pattern having gate trench holes on the substrate, and etching the substrate using the gate mask pattern as an etch mask to form the first and the second gate trenches in the substrate.

The method may further include forming a second field trench hole in the gate mask pattern, forming a second field trench in the substrate using the gate mask pattern having the second field trench hole, forming a second field insulating material to fill the second field trench, the second field insulating material having an upper portion protruding from the substrate, so that a second landing pad hole is formed between the protruding upper portions of the second field insulating material and the first gate capping layer, removing the first gate capping layer and the field insulating material partially so that the second landing pad hole is expanded to overlap partially with the first gate capping layer and the field insulating material buried in the substrate, forming the landing pad material layer in the second landing pad hole, and forming a storage contact landing pad by planarizing the landing pad material layer to a same level of top surfaces of the first gate capping layer and the second field insulating material.

The forming the second field trench hole may include forming a third gate capping layer having an upper portion protruding from the substrate in a third gate trench, forming a spacer mask pattern on the protruding upper portions of the third and the first gate capping layers, etching the spacer mask pattern to expose the gate mask pattern between the third and first gate capping layers, and etching the gate mask pattern to form the second field trench hole.

The method may further include forming a sacrificial layer on the first and the second gate capping layers and on the second field insulating material protruding from the substrate, removing the sacrificial layer on the pair of first field regions, thereby forming landing pad trenches between the first and second gate capping layers and between the second field insulating material and the first gate capping layer so that a remaining sacrificial layer is present between the pair of first field regions, forming a landing pad insulating layer to fill the landing pad trenches, and removing the remaining sacrificial layer to form the first and the second landing pad holes.

In an exemplary embodiment, a method of fabricating a semiconductor device may include forming a first field region adjacent to a long side of an active region in a substrate, forming a gate structure across the active region and the first field region, and forming a second field region to extend parallel to the gate structure, the forming of the gate structure including forming a gate mask pattern having a gate trench hole on the substrate and the first field region, forming a gate trench in the substrate using the gate mask pattern as an etch mask to cross the active region and a parallel field region, and forming a gate capping layer to fill the gate trench, the gate capping layer filling the gate trench hole to protrude over a surface of the active region, the forming of the second field region including partially recessing an upper portion of the gate mask pattern to expose an upper side surface of the gate capping layer, forming a spacer mask pattern on the exposed upper side surface of the gate capping layer and the recessed gate mask pattern, etching a portion of the active region using the spacer mask pattern as an etch mask to form a second field trench in the substrate, and forming a second field insulating material to fill the second field trench.

In an exemplary embodiment, a semiconductor device may include a first field region and second field regions disposed in a substrate to define active regions, and gate structures crossing the active regions and the first field region and disposed parallel to the second field regions.

The first field region may include a first field trench formed in the substrate, and a first field insulating material filling the first field trench.

Each of the second field regions may include a second field trench formed in the substrate and configured to extend to cross the first field trench, and a second field insulating material filling the second field trench.

Each of the gate structures may include a gate trench disposed in the substrate to cross the first field trench, a gate electrode filling a lower region of the gate trench, and a gate capping layer filling an upper region of the gate trench.

A top surface of the first field insulating material may be disposed at a different level from a top surface of the second field insulating material.

A top surface of the gate capping layer may be disposed at the same level as the top surface of the second field insulating material.

The top surface of the first field insulating material may be disposed at substantially the same level as a top surface of the substrate.

Two second field regions may define one active region. The one active region may cross two gate structures. A surface of the one active region may be divided into three portions by the two gate structures. The device may further include landing pads formed directly on the three portions of the surface of the one active region, respectively.

The second field insulating material may fill both a lower region and an upper region of the second field trench.

The first field insulating material may include silicon oxide, and the second field insulating material and the gate capping layer include silicon nitride.

The top surface of the second field insulating material may be disposed at a higher level than the top surface of the first field insulating material.

The top surface of the second field insulating material may be disposed at a lower level than the top surface of the first field insulating material.

The gate insulating material may include a lower portion filling the gate trench, and an upper portion protruding over the substrate. The upper portion of the gate insulating material may have a smaller horizontal width than the lower portion thereof.

The semiconductor device may further include landing pads formed directly on the surface of the substrate corresponding to the active region.

The landing pads may further include a first landing pad formed between the gate capping layers, and a second landing pad formed between the second field insulating material and one of the gate capping layers.

The semiconductor device may further include a first interlayer insulating layer formed on the gate structures, the second field regions, and the landing pads, and a first contact plug configured to vertically penetrate the first interlayer insulating layer and contact the first landing pad.

The semiconductor device may further include a bit line structure connected to the first contact plug.

The bit line structure may include a bit line barrier layer configured to directly contact the first contact plug and the first interlayer insulating layer, a bit line electrode disposed on the bit line, a bit line capping layer disposed on the bit line electrode, and bit line spacers formed on side surfaces of the bit line barrier layer, the bit line electrode, and the bit line capping layer, and the device further including a second contact plug configured to vertically penetrate the first interlayer insulating layer, partially contact the bit line spacers, and contact the second landing pad.

The landing pads may have a greater horizontal width than the surface of the substrate disposed under the landing pads.

Top surfaces of the landing pads may be disposed at the same level as top surfaces of the gate capping layer and the second field insulating material.

The landing pads may include single crystalline silicon.

The semiconductor device may further include a landing pad insulating layer formed on the first field region, the landing pad insulating layer including silicon nitride.

A top surface of the landing pad insulating layer, top surfaces of the landing pads, and a top surface of the gate capping layer may be disposed at the same level.

In an exemplary embodiment, a semiconductor device may include at least two field regions formed in a substrate and configured to straightly extend in a first direction to define both ends of one active region, two gate structures formed in the substrate and configured to cross the one active region and extend parallel to the field regions in the first direction, and landing pads formed directly on a plurality of surfaces of the one active region into which a surface of the one active region is divided by the two gate structures.

The landing pads may include a first landing pad interposed between the gate structures, and a second landing pad interposed between one of the field regions and one of the gate structures, and the landing pads have a greater horizontal width than the corresponding surfaces of the active regions disposed thereunder.

In an exemplary embodiment, a semiconductor device may include a first field region formed in a substrate, the first field region including a first field trench and a first field insulating material filling the first field trench, a second field region and a gate structure configured to cross the first field region and extend parallel to one another, the second field region including a second field trench and a second field insulating material filling the second field trench, the gate structure including a gate trench and a gate capping layer filling the gate trench, and an insulating layer formed on the first field region.

A top surface of the second field insulating material, a top surface of the gate capping layer, and a top surface of the insulating layer may be disposed at the same level.

In an exemplary embodiment, a semiconductor device may include an active region in a substrate, the active region being defined by a pair of parallel field regions extending in a first direction and a pair of crossing field regions extending in a second direction different from the first direction, a pair of buried gate structures extending in parallel with the pair of crossing field regions and running across the active region and the pair of parallel field regions, a bit line contact landing pad disposed on the active region between the pair of buried gate structures and overlapping the pair of buried gate structures partially, and a storage contact landing pad disposed on the active region between one of the pair of crossing field regions and one of the pair of buried gate structures and overlapping the one of the pair of crossing field regions and the one of the pair of buried gate structures partially.

Each of the buried gate structures may be disposed in a gate trench of the active region and include a gate insulating layer conformally disposed on inner walls of the gate trench, a gate electrode disposed on the gate insulating layer filled in a lower portion of the gate trench, and a gate capping layer disposed on the gate electrode filled in an upper portion of the gate trench.

The pair of parallel field regions and the pair of crossing field regions may intersect each other in the substrate, thereby forming an intersection region having a greater depth than that of the field regions.

A top surface of the gate capping layer may be disposed at substantially the same level as that of the bit line contact landing pad.

A top surface of the gate capping layer may be disposed at a level between a top surface and a bottom surface of the bit line contact landing pad.

A top surface of the gate capping layer may be disposed at substantially the same level as a bottom surface of the bit line contact landing pad.

A top surface of the gate capping layer may be disposed below a bottom surface of the bit line contact landing pad.

A bottom surface of the bit line contact landing pad may be in contact with an end of the gate insulating layer.

The semiconductor device may further include a bit line contact plug disposed on the bit line contact landing pad.

The bit line contact plug may have a rounded end, the rounded end being surrounded by the bit line contact pad.

The semiconductor device may further include a bit line structure disposed on the bit line contract plug.

The bit line structure may include a padding unit protruding toward the bit line contact plug, the padding unit being disposed on the bit line contact plug.

The semiconductor device may further include a protection layer disposed on the bit line contact plug.

The bit line contact landing pad and the storage contact landing pad may have tapered sidewalls and a protection layer may be disposed on the tapered sidewalls.

The gate capping layer may include silicon nitride.

The semiconductor device may further include a lower interlayer insulating layer disposed on the bit line contact landing pad, the storage contact landing pad, and the buried gate structure.

The lower interlayer insulating layer may have a lower dielectric constant than that of the gate capping layer.

BRIEF DESCRIPTION OF THE DRAWINGS

The foregoing and other features of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIGS. 2A through 7A and 2B through 7B are cross-sectional views taken along lines I-I', II-II', or III-III' of FIG. 1, which illustrate semiconductor devices according to embodiments of the inventive concept;

FIGS. 8A through 8D are flowcharts illustrating methods of fabricating semiconductor devices according to embodiments of the inventive concept;

FIGS. 9A through 33A and 9B through 33B are cross-sectional views taken along lines I-I' and II-II' of FIG. 1, illustrating a method of fabricating a semiconductor device according to an embodiment of the inventive concept;

FIGS. 34A through 36A and 34B through 36B are cross-sectional views taken along lines I-I' and II-II' of FIG. 1, illustrating methods of fabricating semiconductor devices according to embodiments of the inventive concept;

FIGS. 38A through 42A and 38B through 42B are cross-sectional views taken along lines I-I' and II-II' of FIG. 1, illustrating methods of fabricating semiconductor devices according to embodiments of the inventive concept;

DETAILED DESCRIPTION OF THE EMBODIMENTS

Figure 1:
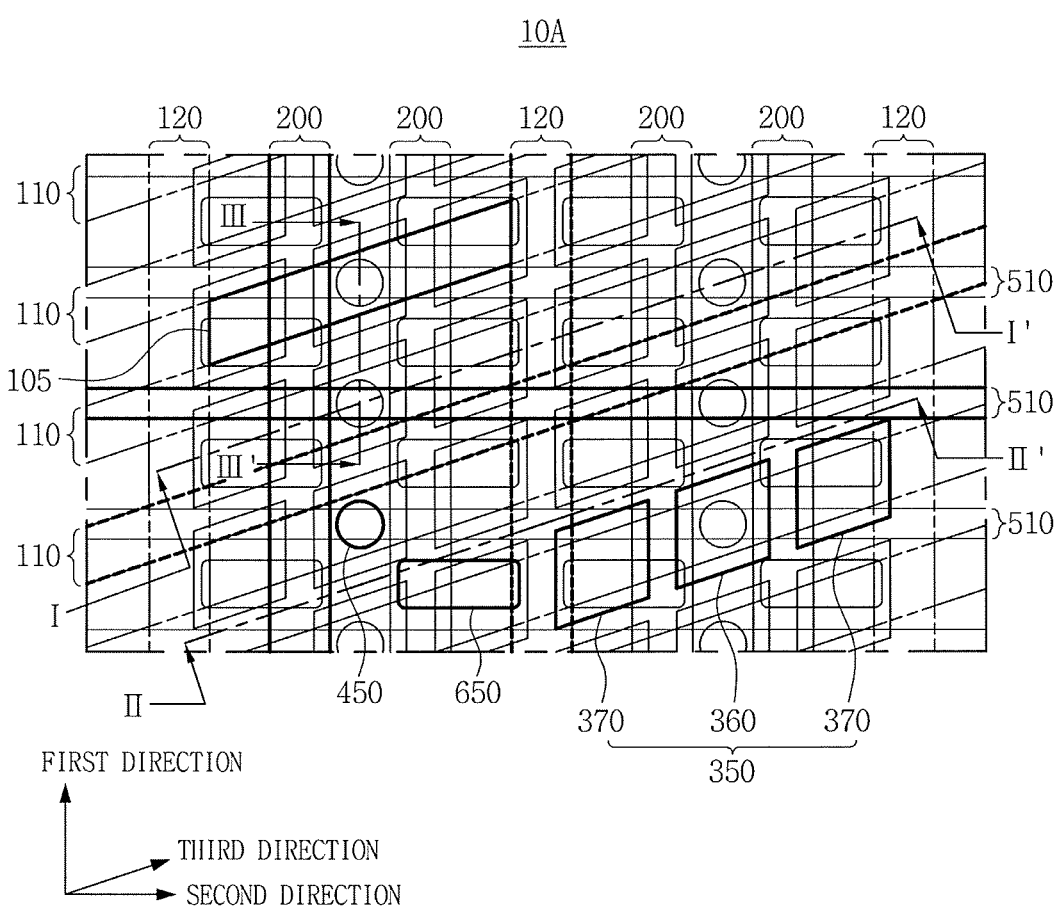
FIG. 1 is a layout of a semiconductor device according to an embodiment of the inventive concept.

The inventive concept will now be described more fully hereinafter with reference to the accompanying drawings, in which exemplary embodiments of the inventive concept are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to" or "coupled with" another element or layer, it can be directly or indirectly on, connected or coupled with the other element or layer or intervening elements or layers may be present. In contrast, when an element is referred to as being "directly on," "directly connected to" or "directly coupled with" another element or layer, there are no intervening elements or layers present. Like numbers refer to like elements throughout. As used herein, the term "and/or" includes any and all combinations of one or more of the associated listed items.

Spatially relative terms, such as "below", "beneath", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Exemplary embodiments of the inventive concept are described herein with reference to cross-section and/or plan illustrations that are schematic illustrations of idealized embodiments of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the inventive concept.

The same reference numerals are used to denote the same component throughout the specification. Thus, even if not mentioned or described in the corresponding drawing, the same reference numerals or similar reference numerals may be described with reference to other drawings. Also, even if no reference is used to denote a component, the component may be described with reference to other drawings.

FIG. 1 is a layout of a semiconductor device 10A according to an embodiment of the inventive concept. FIGS. 2A, 3A, 4A, 5A, 6A and 6B are cross-sectional views taken along a line of I-I' of the semiconductor device 10A of FIG. 1 according to embodiments of the inventive concept. FIGS. 2B, 3B, 4B, and 5B are cross-sectional views taken along a line of II-II' of the semiconductor device 10A of FIG. 1 according to embodiments of the inventive concept. FIGS. 7A and 7B are cross-sectional views taken along a line of the semiconductor device 10A of FIG. 1 according to embodiments of the inventive concept.

Referring to FIG. 1, a semiconductor device 10A may include parallel field regions 110 and crossing field regions 120 configured to define active regions 105, gate structures 200 disposed parallel to the crossing field regions 120 to cross the active regions 105 and the parallel field regions 110, and landing pads 350 configured to be disposed on the active regions 105. The semiconductor device 10A may also include bit line stacks 510. The landing pads 350 may include bit line contact landing pads 360 and storage contact landing pads 370.

The parallel field regions 110 may extend or run parallel to one another in the same direction as a direction in which the active regions 105 are elongated. The crossing field regions 120 may extend or run in parallel with one another in a first direction. The active regions 105 may be defined by the parallel field regions 110 and the crossing field regions 120. For example, the parallel field regions 110 may be trench isolation regions and run parallel to one another in a third direction. The active regions may be disposed between the parallel field regions 110. The crossing field regions 120 may be in a straight line shape in the first direction. The parallel field regions 110 may be discontinuously disposed between the crossing field regions 120. As a result, the active regions are surrounded by the parallel field regions 110 and the crossing field regions 120.

The active regions 105 may have tilted bar shapes elongated in the third direction. The active regions 105 are surrounded by the parallel field regions 110 and the crossing field regions 120 and separated from one another by the parallel field regions 110 and the crossing field regions. For example, the parallel field regions 110 may define short sides of the active regions 105, and the crossing field regions 120 may define long sides of the active regions 105. In the present embodiment, terms "parallel" and "crossing" may be defined according to the direction in which the active regions 105 are elongated. For instance, the parallel field regions 110 may extend in the same direction as the direction in which the active regions 105 are elongated, and the crossing field regions 120 may extend at an angle to the direction in which the active regions 105 are elongated. For example, the active regions 105 are elongated along the third direction as shown in FIG. 1.

The gate structures 200 may be disposed on the active regions 105. For example, two gate structures of the gate structures 200 are disposed on each of the active regions 105. Landing pads 350 may be formed on the active regions 105 respectively. Each of the landing pads 350 may include a bit line contact landing pad 360 and two storage contact landing pads 370. The bit line contact landing pad 360 is formed on the active regions 105 between the two gate structures 200. The two storage contact landing pads 370 are formed on each of the active regions 105 between the gate structures 200 and the crossing field regions 120.

Bit line contact plugs 450 are disposed on the bit line contact landing pads 360 respectively. The bit line stacks 510 are disposed on the bit line contact plugs 450, respectively. The bit line stacks 510 may extend or run over the active regions 105 along a second direction between the first and third direction which is perpendicular to the first direction and at a predetermined angle to the third direction. The bit line contact plugs 450 are disposed on the bit line contact landing pads 360 respectively. The bit line contact landing pads 360 are arranged in repetition in the third direction. The bit line stacks 510 may partially overlap the storage contact landing pad 370.

Figure 2A:
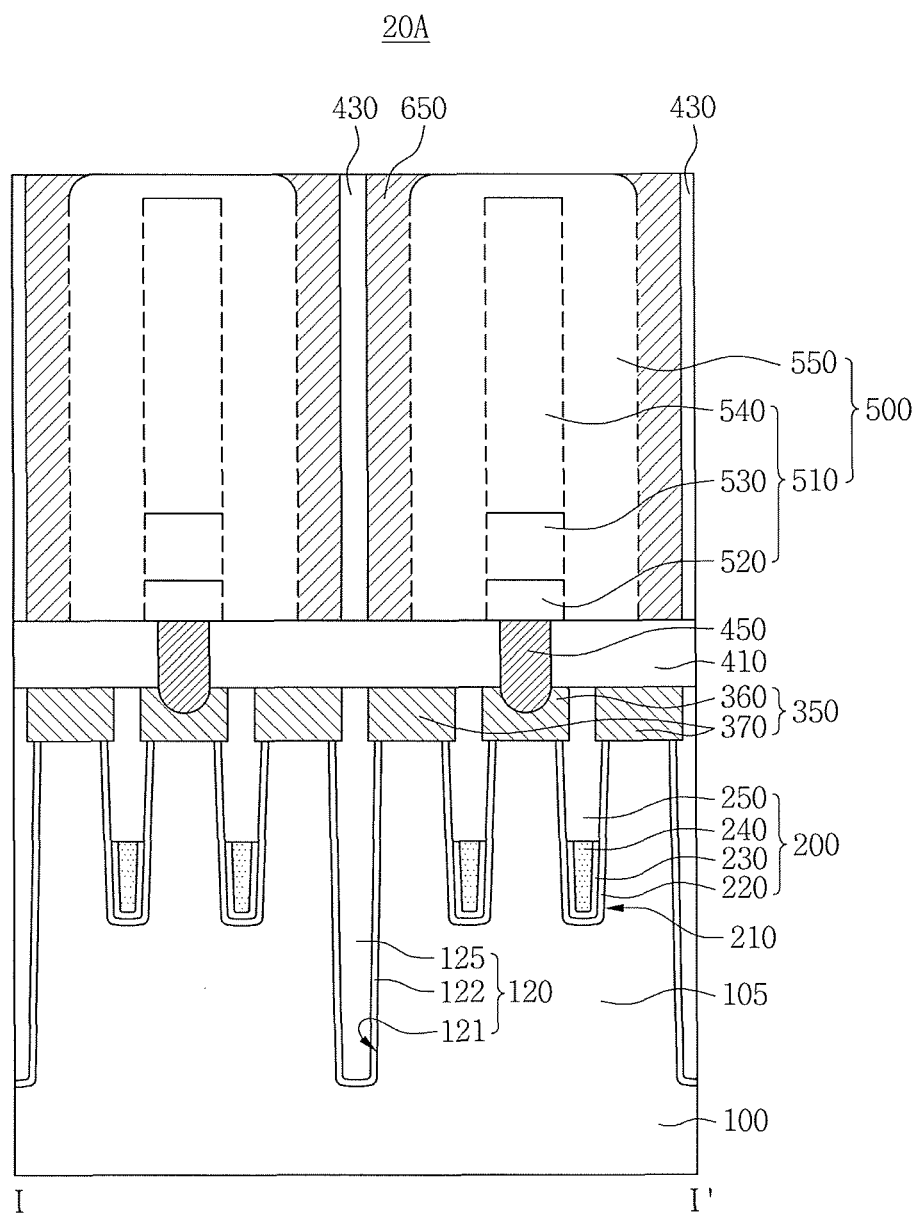
Figure 2B:
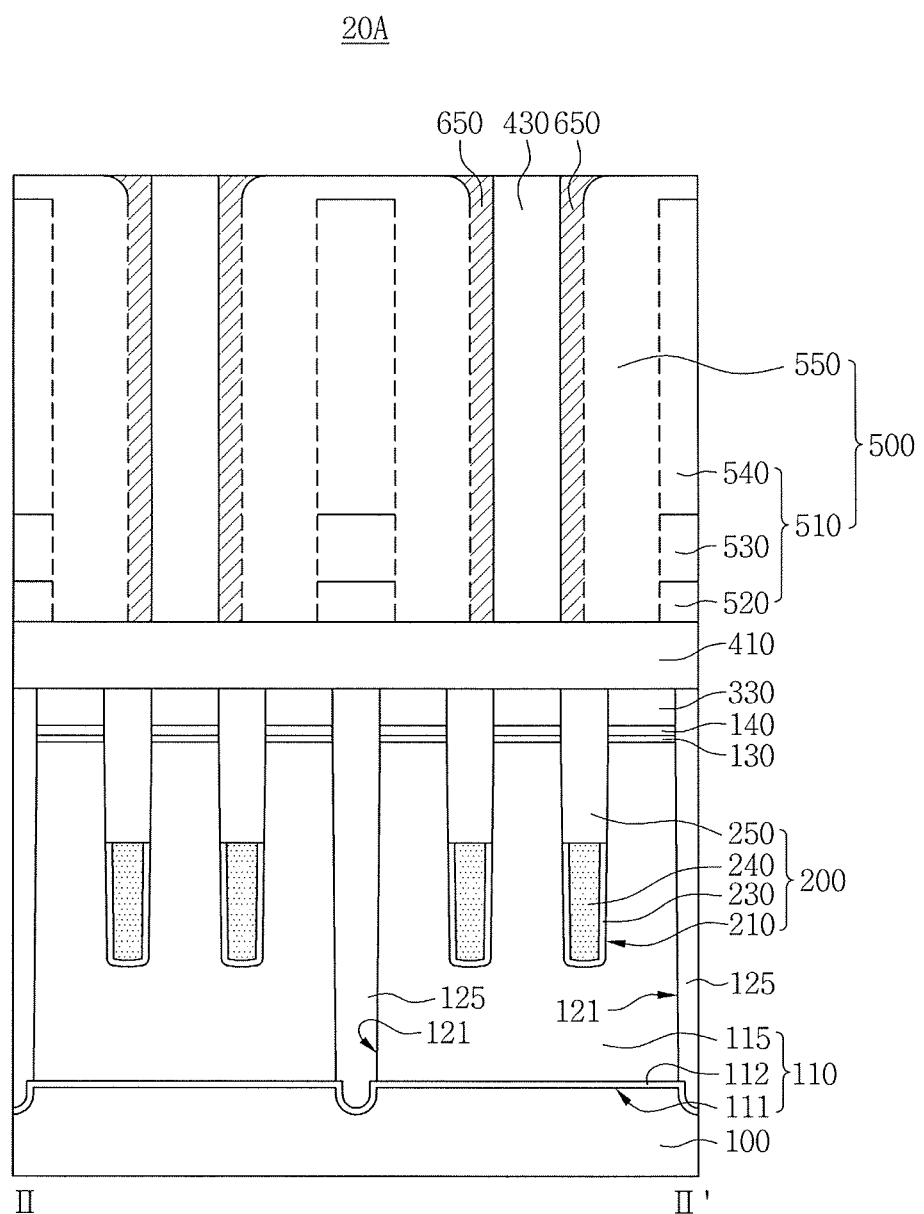

Referring to FIGS. 2A and 2B, a semiconductor device 20A according to an embodiment of the inventive concept may include field regions 110 and 120 formed in a substrate 100 to define active regions 105, gate structures 200, and bit line structures 500 formed on the substrate 100. The semiconductor device 20A may further include landing pads 350, bit line contact plugs 450, and/or storage contact plugs 650.

The field regions 110 and 120 may include a parallel field region 110 and a crossing field region 120. The parallel field region 110 may include a parallel field liner 112 formed on inner walls and bottom surface of a parallel field trench 111, and a parallel field insulating material 115 formed on the parallel field liner 112 to fill the parallel field trench 111. The parallel field liner 112 may include silicon oxide or silicon nitride, and the parallel field insulating material 115 may include silicon oxide. For example, the parallel field liner 112 may include thermally oxidized silicon or radical-oxidized silicon. A top surface of the parallel field insulating material 115 is substantially the same as or similar to a surface of the substrate 100.

The crossing field region 120 may include a crossing field liner 122 formed on inner walls and a bottom surface of a crossing field trench 121, and a crossing field insulating material 125 formed on a crossing field liner 122 to fill the crossing field trench 121. An intersection region where the crossing field trench 121 and the parallel field trench 111 intersect each other is recessed to a deeper depth than the parallel field trench 111 and the crossing field trench 121. The crossing field liner 122 may include silicon oxide or silicon nitride, and the crossing field insulating material 125 may include silicon nitride or silicon oxide. For instance, the crossing field liner 122 may include thermally oxidized silicon, radical-oxidized silicon, and/or silicon oxide deposited using an atomic layer deposition (ALD) process, and the crossing field insulating material 125 includes silicon nitride.

The crossing field liner 122 may not be formed on the inner walls of the crossing field trench 121 formed in the parallel field region 110. For example, the parallel field insulating material 115 may be in direct contact with the crossing field insulating material 125 in the parallel field region 110.

The crossing field insulating material 125 may protrude from the substrate 100. For example, a top surface of the crossing field insulating material 125 is disposed at a higher level than that of the parallel field insulating material 115. In FIG. 2A, the protruding portion of the crossing field insulating material 125 has smaller width than the maximum width of the crossing field insulating material 125 buried in the substrate 100 between the parallel field regions 110. In FIG. 2B, the protruding portion of the crossing field insulating material 125 may have a width substantially equal to or similar to a width of the crossing field insulating material 125 buried in the substrate 100 in the parallel region. For example, side surfaces of the portion of the crossing field insulating material 125 protruding from the substrate 100 are vertically aligned with those of the crossing field insulating material 125 buried in the substrate 100.

The gate structures 200 are formed parallel to the crossing field regions 120 in the substrate 100. Two gate structures 200 are formed in one active region 105. In the active region 105, the gate structures 200 may include gate trenches 210, gate insulating layers 220 disposed conformally on inner walls and bottom surfaces of the gate trenches 210, and gate electrodes 240 disposed in lower regions of the gate trenches 210. For example, the gate insulating layers 220 may include thermally oxidized silicon or radical-oxidized silicon.

The gate structures 200 may further include gate barrier layers 230 in the active region 105. The gate barrier layers are formed between the gate insulating layers 220 and the gate electrodes 240. The gate barrier layers 230 are disposed on the gate electrodes 240. In the parallel field region 110 as shown in FIG. 2B, the gate insulating layers 220 of the gate structures 200 may not be formed. For example, the gate barrier layers 230 and the gate electrodes 240 are disposed in lower regions of the gate trenches 210. For example, the gate barrier layers 230 are in direct contact with the parallel field insulating material 115.

The gate trench 210 may be shallower than the crossing field trench 121. The gate trenches 210 may intersect the parallel field region and active region. The gate trenches 210 may be deeper in the parallel field region 110 than in the active region 105.

A top surface of the gate electrode 240 may be lower than half of the gate trench 210. The gate electrodes 240 may have top surfaces at substantially the same level or at similar levels in both the active region 105 and the parallel field region 110. The gate electrodes 240 may have lower ends disposed at a lower level in the parallel field region 110 than in the active region 105. For example, the gate electrodes 240 may have a greater vertical height in the parallel field region 110 than in the active region 105.

The gate structures 200 may further include gate capping layers 125 formed on the gate electrodes 240 to fill upper regions of the gate trenches 210. Upper portions of the gate capping layers 250 may protrude from the surface of the substrate 100 and the surface of parallel field insulating material 115. In the active region 105, the protruding portion of the gate capping layer 250 from the substrate may have smaller width than a maximum horizontal width of the gate capping layer 250 buried in the substrate 100. In the parallel field region 110, the protruding portion of the gate capping layer 250 may protrude from the parallel field insulating material 115 may have a width substantially equal to or greater than a maximum width of the gate capping layer 250 buried in the parallel field insulating material 115. The gate capping layers 250 and the parallel field region 110 may have a substantially planarized surface. The gate capping layers 250 may include silicon nitride.

Landing pads 350 are formed on the surface of the substrate 100 in the active region 105. Each of the landing pads 350 may include a bit line contact landing pad 360 and two storage contact landing pads 370. For example, the bit line contact landing pad 360 is formed directly on the exposed surface of the substrate 100 between the gate structures 200. The storage contact landing pads 370 are formed directly on the exposed surface of the substrate 100 between the crossing field regions 120 and one of the gate structures 200. The bit line contact landing pad 360 and the storage contact landing pads 370 disposed on either side of the bit line contact landing pad 360 are isolated and spaced apart from one another by the gate capping layers 250. Both side surfaces of the bit line contact landing pad 360 may be in direct contact with side surfaces of the gate capping layer 250. Storage contact landing pads 370 disposed on either side of the crossing field insulating material 125 are isolated and spaced apart from one another by the crossing field insulating material 125. One of side surfaces of the storage contact landing pads 370 are in direct contact with the side surfaces of the gate capping layer 250, and the other side surfaces thereof may be in direct contact with side surfaces of the crossing field insulating material 125. Each of the landing pads 350, which contacts the surface of the substrate 100, may have bottom surface wider than the surface of the substrate 100 disposed under the landing pad. For example, the bottom surfaces of the bit line contact landing pads 360 are in direct contact with the ends of the gate insulating layer 220 and/or the gate capping layers 250. The bottom surfaces of the storage contact landing pads 370 may be in direct contact with the ends of gate insulating layers 220, the gate capping layers 250, the ends of crossing field liner 122, and the crossing field insulating material 125. On the active region 105, top surfaces of the landing pads 350, the gate capping layers 250, and/or the crossing field insulating materials 125 may be disposed at substantially the same level or similar levels. The landing pads 350 may include a conductive material. For instance, the landing pads 350 include a doped single crystalline silicon or doped poly-crystalline silicon (poly-Si).

A pad insulating layer 130, a buffer insulating layer 140, and a landing pad insulating layer 330 are formed on the surfaces of the parallel field regions 110 isolated from one another by the gate capping layers 250 and/or the crossing field insulating materials 125. On the parallel field region 110, the top surface of the landing pad insulating layer 330 may be disposed at substantially the same level as or a similar level to that of the gate capping layer 250 and/or the crossing field insulating material 125 disposed adjacent thereto. The pad insulating layer 130 may include silicon oxide, the buffer insulating layer 140 may include silicon nitride, and the landing pad insulating layer 330 may include silicon nitride. When the pad insulating layer 130 includes silicon oxide, a boundary between the pad insulating layer 130 and the parallel field insulating material 115 may not be identified.

On the active region 105, a lower interlayer insulating layer 410 is formed on the landing pads 350, the gate capping layers 250, and/or the crossing field insulating materials 125. On the parallel field region 110, the lower interlayer insulating layer 410 is formed on the landing pad insulating layers 330, the gate capping layers 250, and/or the crossing field insulating materials 125. The lower interlayer insulating layer 410 may include silicon oxide.

Bit line contact plugs 450 are formed on the bit line contact landing pads 360 respectively. The top surfaces of the bit line contact plugs 450 are at substantially the same level as or a similar level to that of the lower interlayer insulating layer 410. The bit line contact plugs 450 may include a conductive material. For example, the bit line contact plug 450 may include doped single crystalline silicon, doped poly-Si, a metal silicide, or a metal. The bottom surface of the bit line contact plugs 450 are rounded and disposed at a lower level than the top surface of the bit line contact landing pad 360. For instance, the top surface of the bit line contact plug 450 is recessed, and the lower portion of the bit line contact plug 450 may protrude downwardly.

On the active region 105, bit line structures 500 are formed on the lower interlayer insulating layer 410 and the bit line contact plug 450. On the parallel field region 110, the bit line structure 500 are formed on the lower interlayer insulating layer 410 and the crossing field insulating material 125. The bit line structure 500 may include a bit line stack 510 and bit line spacers 550. The bit line spacers 550 may be formed on the side surfaces of the bit line stack 510. The bit line spacers 550 may cover a top surface of the bit line stack 510. The bit line stack 510 may include a bit line barrier layer 520 formed directly on the bit line contact plug 450 and/or the lower interlayer insulating layer 410, a bit line electrode 530 formed on the bit line barrier layer 520, and a bit line capping layer 540 formed on the bit line electrode 530. Side surfaces of the bit line barrier layer 520, the bit line electrode 530, and the bit line capping layer 540 may be vertically aligned. The bit line barrier layer 520 may include, for example, a metal silicide, Ti, TiN, Ta, TaN, TiW, or various other barrier metals. The bit line electrode 530 may include, for example, a metal such as tungsten (W), aluminum (Al), or copper (Cu). The bit line capping layer 540 may include, for example, a material (e.g., silicon nitride) denser than the lower interlayer insulating layer 410. To show that the bit line stack 510 has a longitudinal section taken in a slant direction with further reference to FIG. 1, the side surfaces of the bit line stack 510 and the bit line spacers 550 are illustrated with dotted lines.

The semiconductor device 20A may further include an upper interlayer insulating layer 430 disposed on a top surface of the lower interlayer insulating layer 410 and side surfaces of the bit line structures 500. The upper interlayer insulating layer 430 may cover the top surfaces of the bit line structures 500. The upper interlayer insulating layer 430 may include silicon oxide.

The semiconductor device 20A may further include storage contact plugs 650 that are disposed on the storage contact landing pads 370. The storage contact plugs 650 may be in contact with the bit line spacers 550. The storage contact plugs 650 may include a conductor, such as doped silicon, a metal silicide, or a metal. For example, the storage contact plugs 650 may include poly-Si or single crystalline silicon.

The semiconductor device 20A according to the present embodiment may include a gate capping layer 250 and a crossing field insulating material 125 that may protrude from the substrate 100. The landing pads 350 formed on the substrate 100 are isolated and spaced apart from one another by the protruding portion of the gate capping layer 250 and the crossing field insulating material 125. For example, the protruding portion of the gate capping layer 250 may isolate the bit line contact landing pad 360 from the storage contact landing pad 370, and the protruding portion of the crossing field insulating material 125 may isolate the storage contact landing pads 370 from one another. The gate capping layer 250 and the crossing field insulating material 125 may include a material denser than the lower interlayer insulating layer 410.

Accordingly, the structure of the landing pads 350 may accommodate process variations of subsequent processes such as forming a bit line plug or a storage contact plug. Buried-gate structures may reduce space between adjacent buried-gate structures and in turn, lead to reduce process margins for the subsequent processes. In the structure of the landing pads 350, each of the landing pads 350 may have enough area for the subsequent processes and adjacent landing pads 350 are isolated and spaced apart from each other electrically and/or physically. For example, during a process of forming a contact hole in the lower interlayer insulating layer 410 to expose the bit line contact landing pad 360, the gate capping layer 250 may serve as a shielding layer so that the contact hole is not be expanded to adjacent storage contact landing pads 370 when misalignment occurs in a photolithography process. In a process of forming a contact hole to expose the storage contact landing pad 370 in the lower interlayer insulating layer 410, the gate capping layer 250 or the crossing field insulating material 125 may serve as a shielding layer so that the contact hole is not be expanded to adjacent bit line contact landing pads 360 or other storage contact landing pads 370 when misalignment occurs in a photolithography.

Figure 3A:
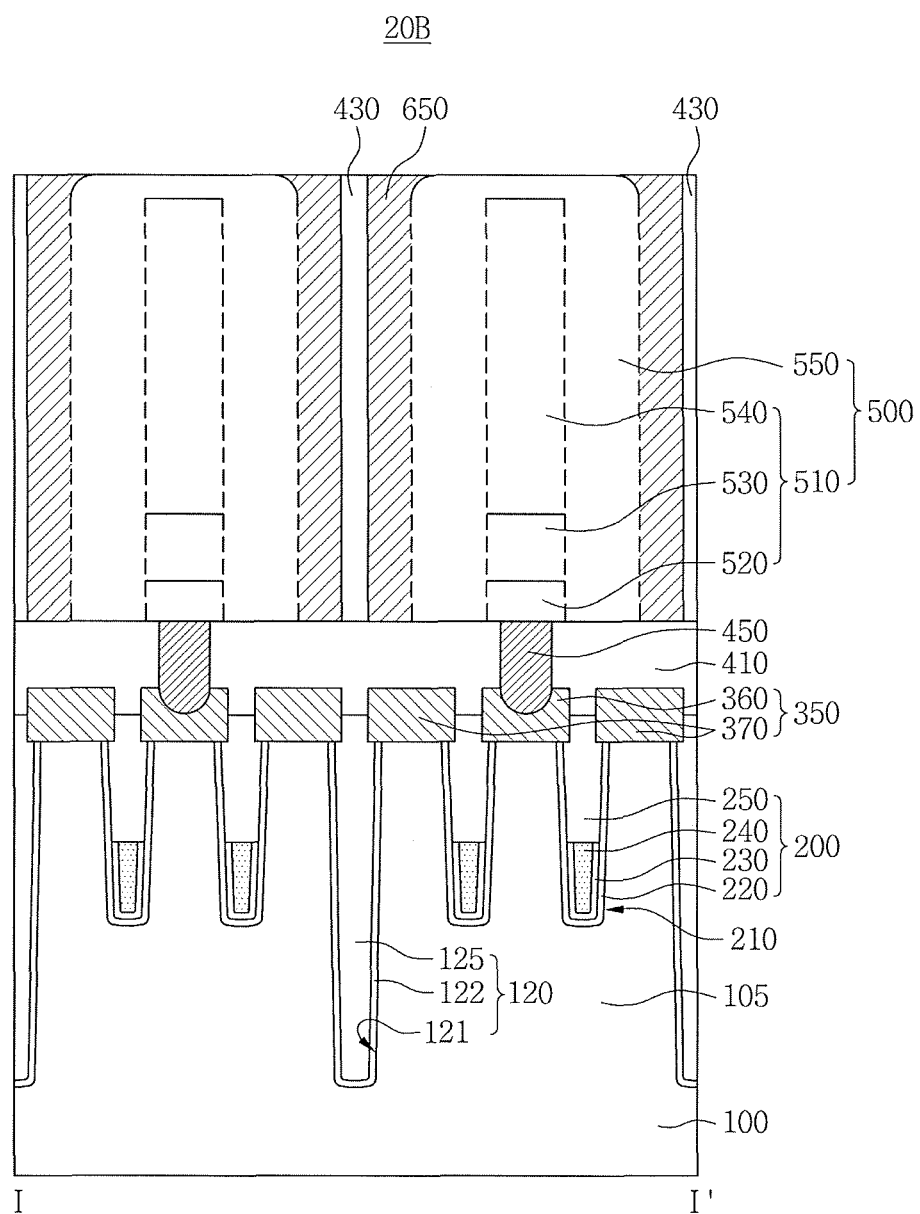
Figure 3B:
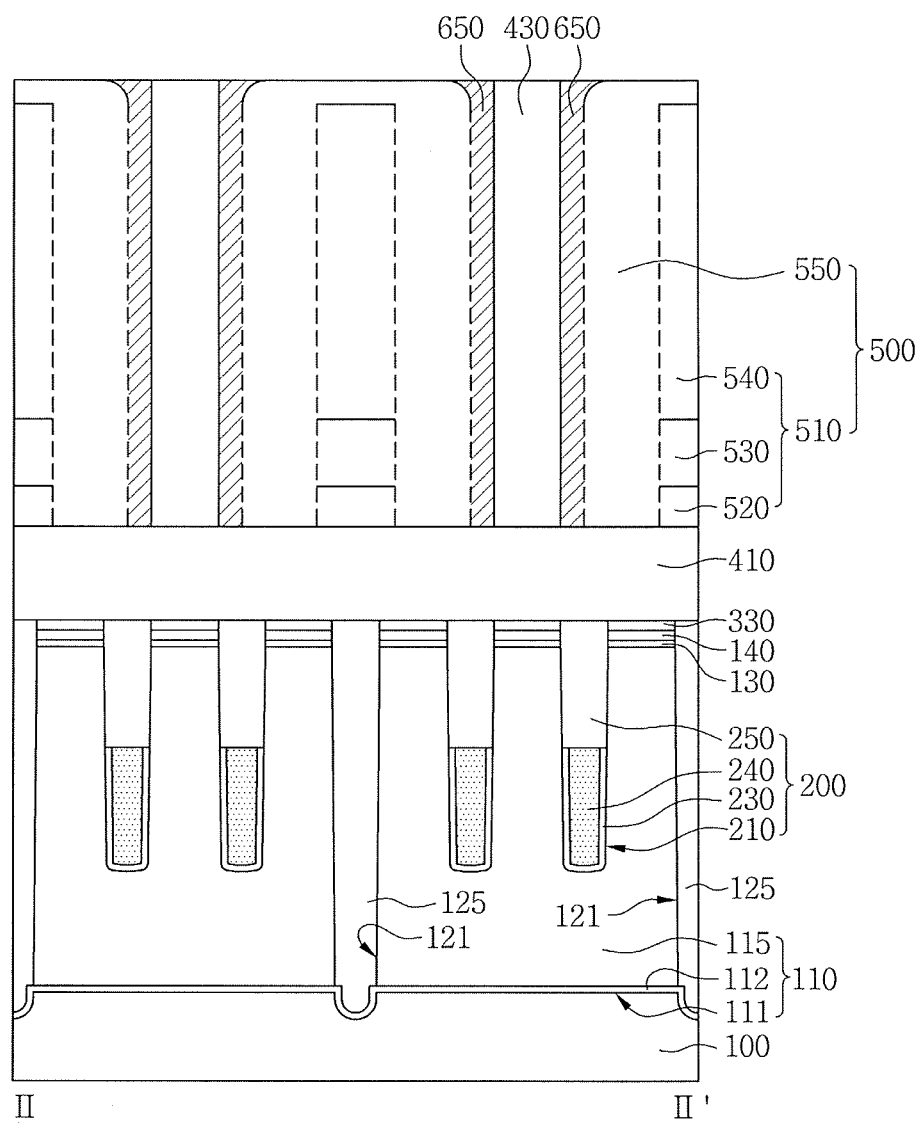

Referring to FIGS. 3A and 3B, a semiconductor device 20B according to an embodiment of the inventive concept may have substantially the same structure as that of the semiconductor device 20A and 20B of FIGS. 2A and 2B except for the structure of the gate capping layers 250. The top surface of the gate capping layers 250 are disposed at a level between the top surfaces of the adjacent bit line landing pad 360 and the storage contact landing pad 370. The top surface of the crossing field insulating materials 125 are disposed at a level between the top surfaces of the adjacent storage contact landing pads 370. A lower interlayer insulating layer 410 is filled on the top surfaces of the gate capping layers 250 and/or the crossing field insulating materials 125 between the landing pads 350. Like numerals may refer to like elements and any further descriptions with respect to the same element is omitted for brevity.

Figure 4A:
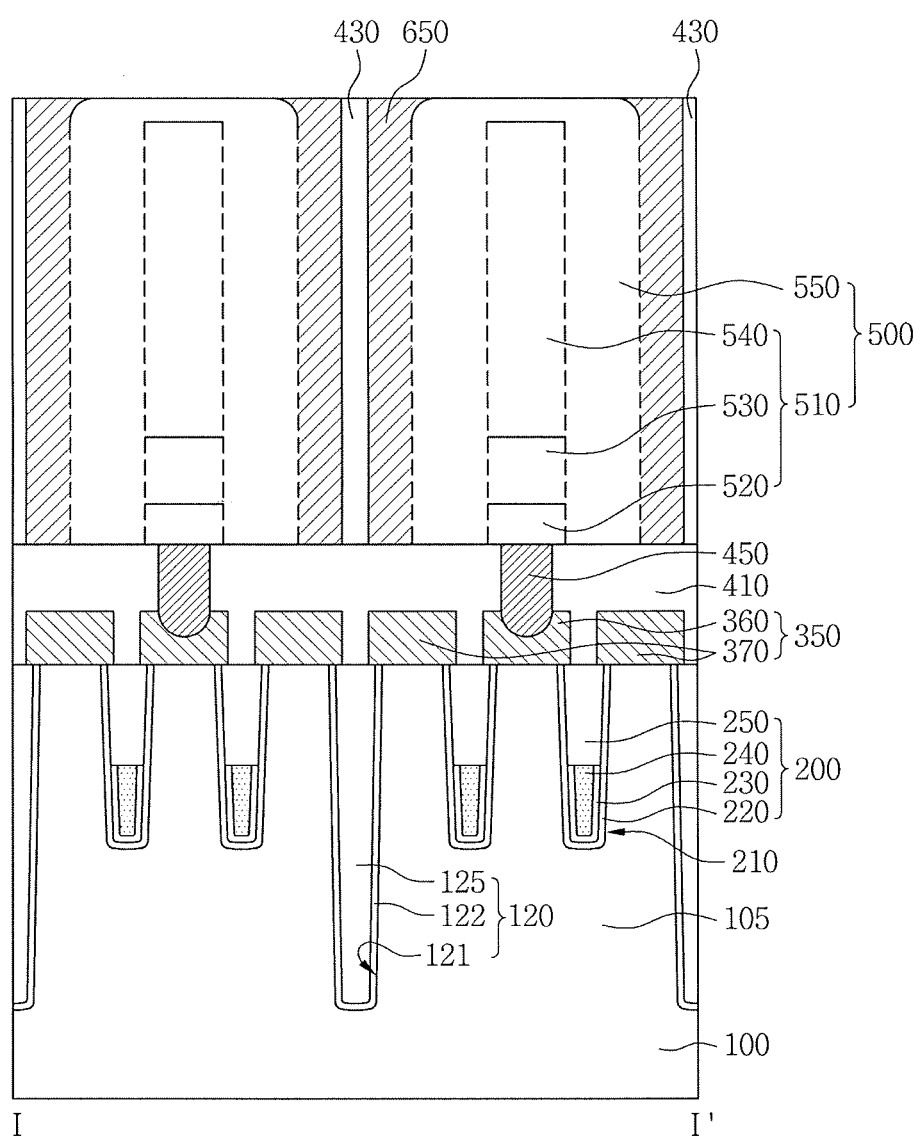
Figure 4B:
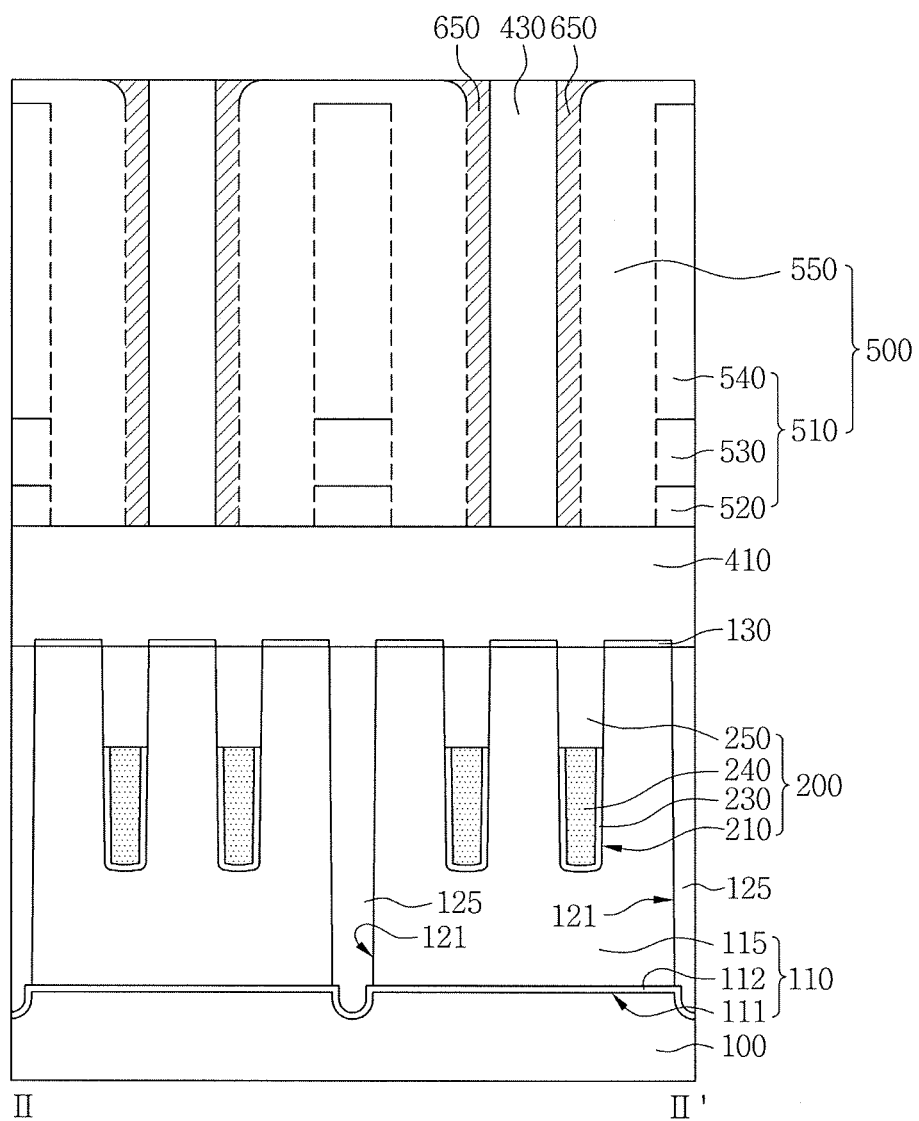

Referring to FIGS. 4A and 4B, a semiconductor device 20C according to an embodiment of the inventive concept may have substantially the same structure as that of the semiconductor device 20A and 20B of FIGS. 2A and 2B except for the structure of the gate capping layers 250. The top surface of the gate capping layers 250 is disposed at a level of the bottom surfaces of the landing pads 350. The top surface of the crossing field insulating materials 125 is disposed at a level of the bottom surfaces of the landing pads 350. A lower interlayer insulating layer 410 is filled on the top surfaces of the gate capping layers 250 and/or the crossing field insulating materials 125 between the landing pads 350. Like numerals may refer to like elements and any further descriptions with respect to the same element is omitted for brevity.

Figure 5A:
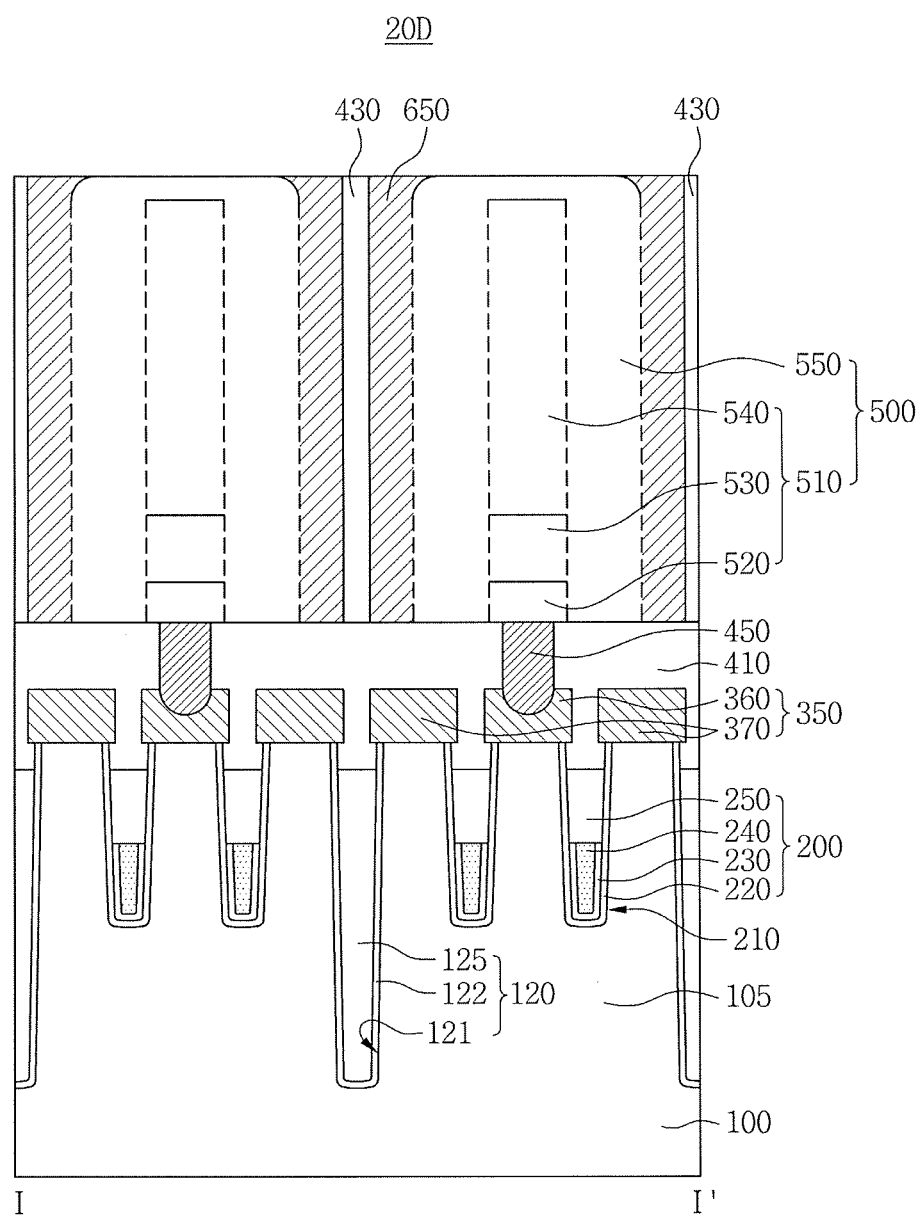
Figure 5B:
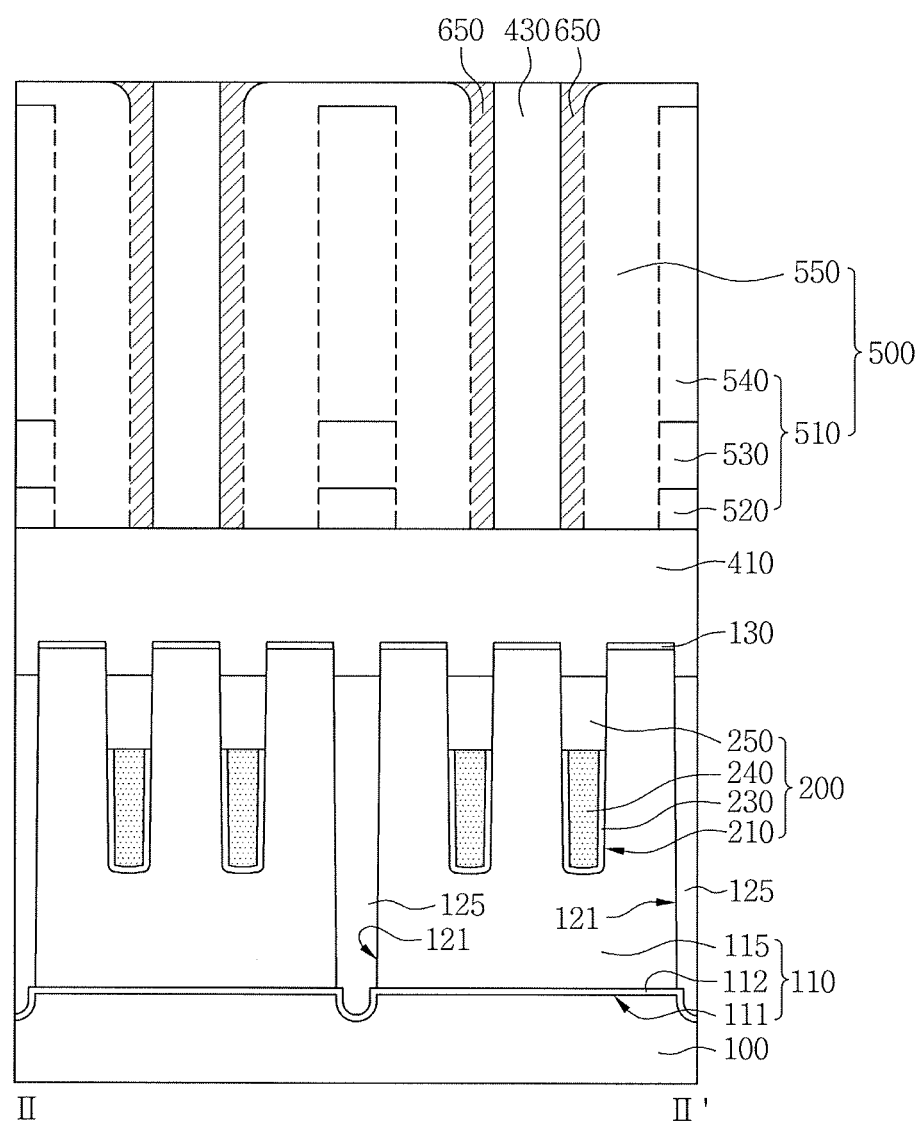

Referring to FIGS. 5A and 5B, a semiconductor device 20D according to an embodiment of the inventive concept may have substantially the same structure as that of the semiconductor device 20A and 20B of FIGS. 2A and 2B except for the structure of the gate capping layers 250. The top surface of the gate capping layers 250 is disposed below the bottom surfaces of the landing pads 350. The top surface of the crossing field insulating materials 125 is disposed below the bottom surfaces of the landing pads 350. A lower interlayer insulating layer 410 is filled on the top surfaces of the gate capping layers 250 and/or the crossing field insulating materials 125 between the landing pads 350. Like numerals may refer to like elements and any further descriptions with respect to the same element is omitted for brevity.

In the semiconductor devices 20B to 20D described with reference to FIGS. 3A through 5B, the lower interlayer insulating layer 410 or an additional insulating layer may be partially or wholly formed between the landing pads 350. When the lower interlayer insulating layer 410 or the additional insulating layer has a lower dielectric constant than the gate capping layers 250 or the crossing field insulating materials 125, parasitic capacitance, leakage current, and current consumption between the landing pads 350 may be reduced, and a resistance-capacitance (RC) delay is prevented or alleviated.

Figure 6A:
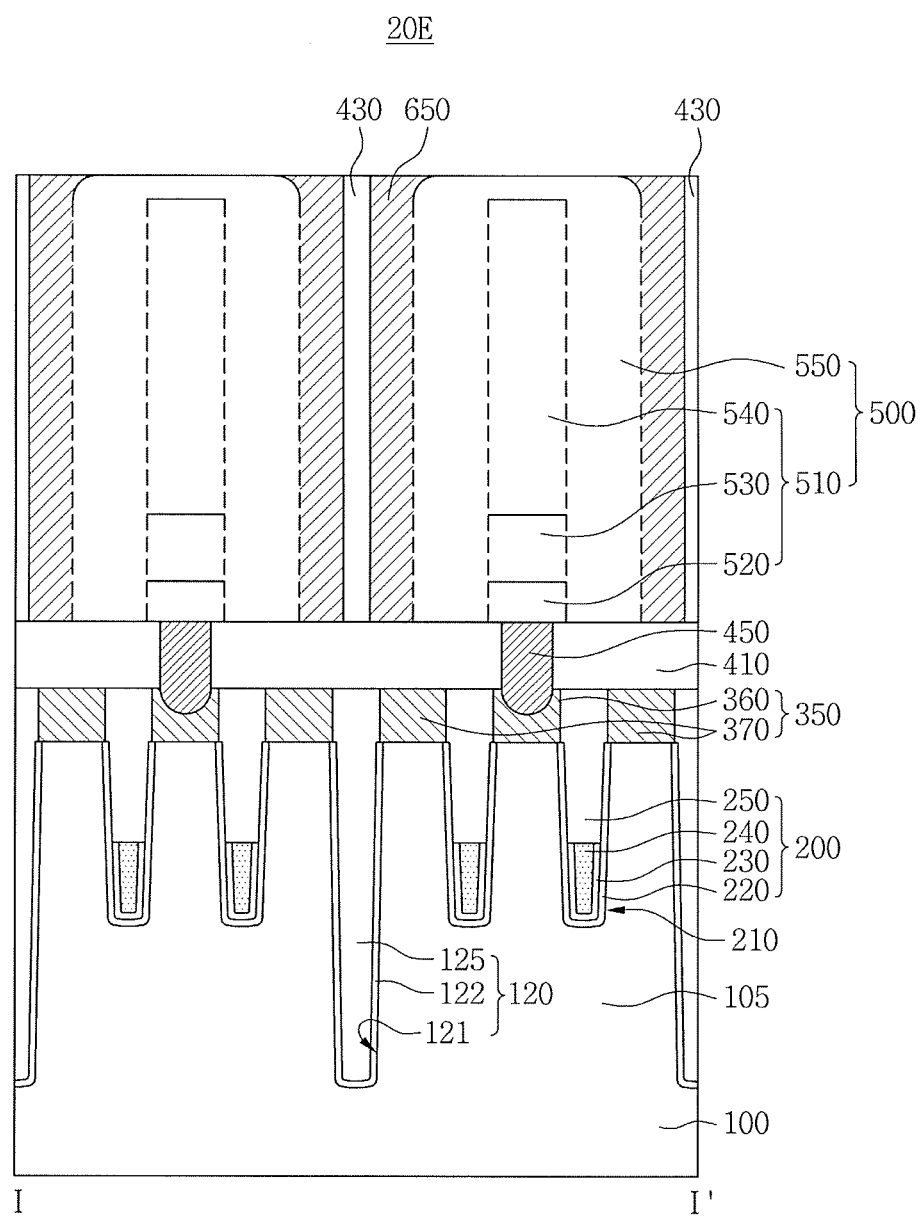
Figure 7A:
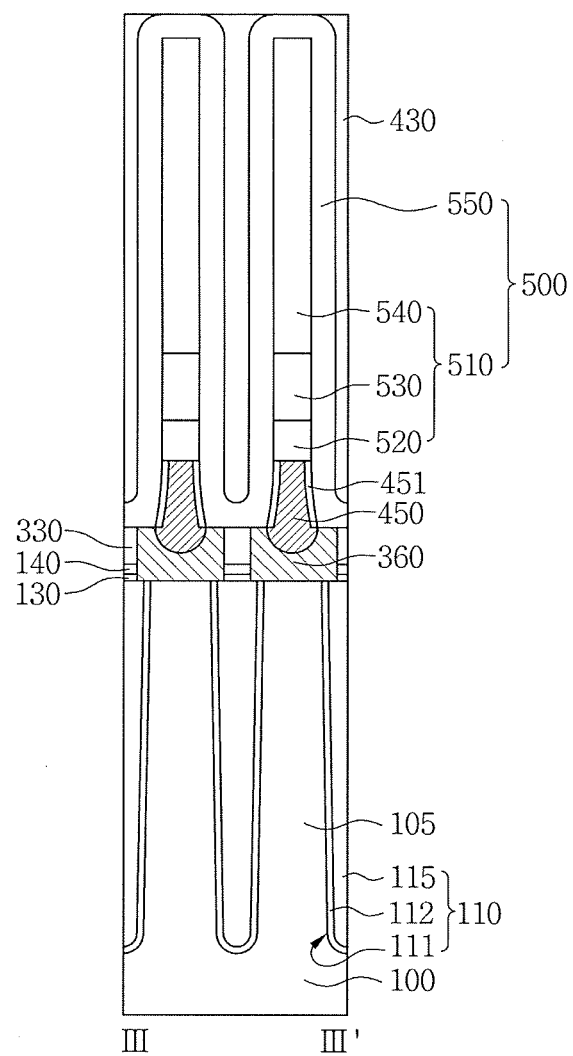
Figure 7B:
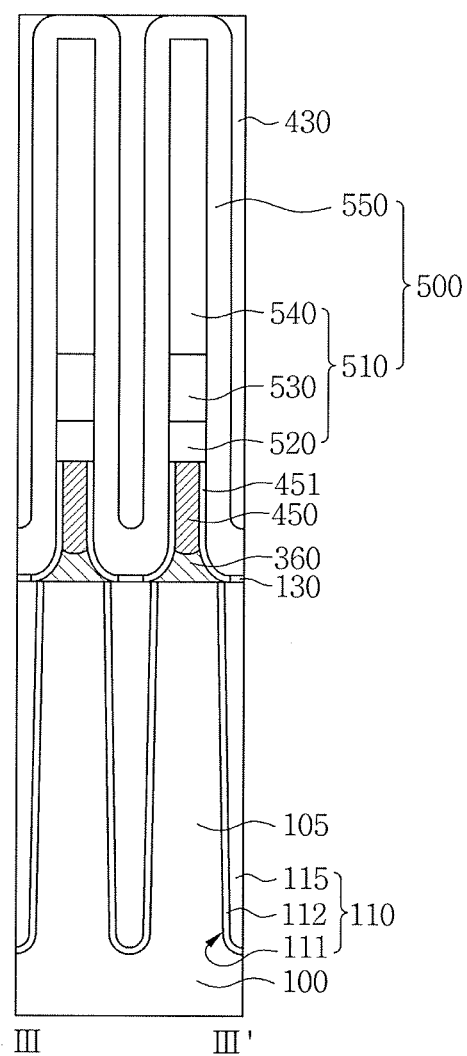

Referring to FIG. 6A, a semiconductor device 20E according to an embodiment of the inventive concept may have substantially the same structure as that of the semiconductor device 20A and 20B of FIGS. 2A and 2B except for the structure of the landing pads 350. The gate structures 200 may include gate capping layers 250 protruding from the substrate 100 and have portions vertically aligned with inner walls of gate trenches 210 or gate insulating layers 220. The crossing field regions 120 may include a crossing field insulating material 125 protruding from the substrate 100 having a crossing field trench 121 and have a portion vertically aligned with an inner wall of the crossing field trench 121 or a crossing field insulating layer 122. Like numerals may refer to like elements and any further descriptions with respect to the same element is omitted for brevity.

Since the semiconductor device 20E according to the present embodiment may include the gate capping layers 250 and the crossing field insulating material 125 having relatively great widths, the landing pads 350 may be electrically and/or materially protected and isolated in a more stable manner during processes for exposing or patterning the landing pads 350. As the alignment margin increases, the manufacturing process of the semiconductor device 20E may be stabilized. Since a distance between the landing pads 350 become relatively great, parasitic capacitance between the landing pads 350 is reduced.

Figure 6B:
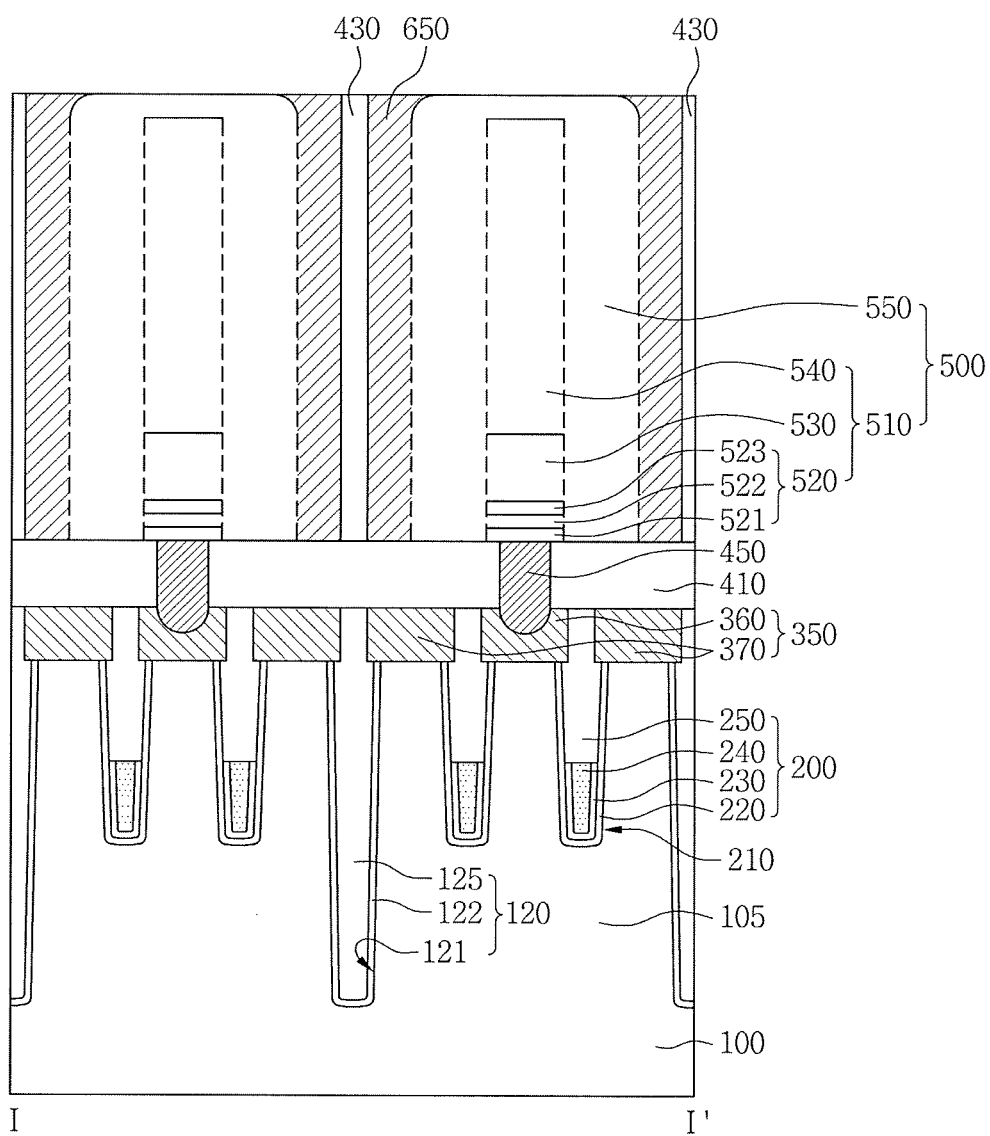

Referring to FIG. 6B, a semiconductor device 20F according to an embodiment of the inventive concept may have substantially the same structure as that of the semiconductor device 20A and 20B of FIGS. 2A and 2B except for the structure of the multilayered bit line barrier layer 520. Each of the bit line structures 500 may include a multilayered bit line barrier layer 520. For example, the bit line barrier layer 520 may include a lower metal silicide layer 521, a barrier metal layer 522, and an upper metal silicide layer 523. The lower metal silicide layer 521 may be in direct contact with top surfaces of bit line contact plugs 450 and/or lower interlayer insulating layers 410. The lower metal silicide layer 521 may include, for example, tungsten silicide (WSi), titanium silicide (TiSi), nickel silicide (NiSi), cobalt silicide (CoSi), or various other metal silicides. The barrier metal layer 522 may include, for example, titanium (Ti), titanium nitride (TiN), tantalum (Ta), tantalum nitride (TaN), or titanium tungsten (TiW). The upper metal silicide layer 523 may include, for example, tungsten WSi, TiSi, or NiSi. The lower metal silicide layer 521 and the upper metal silicide layer 523 may improve the adhesive strength of a bit line stack 510. For example, the adhesion of the bit line barrier layer 520 to the bit line contact plug 450, the lower interlayer insulating layer 410, and/or the bit line electrode 530 may be improved.

The lower metal silicide layer 521 may increase the adhesion of the bit line barrier layer 522 to the bit line contact plug 450 and the lower interlayer insulating layer 410. The upper metal silicide layer 523 may increase the adhesion of the bit line barrier layer 522 to the bit line electrode 530. Like numerals may refer to like elements and any further descriptions with respect to the same element is omitted for brevity.

Referring to FIGS. 1 and 7A, a semiconductor device 20G according to an embodiment of the inventive concept may include landing pad insulating layers 330 formed on parallel field regions 110 to define active regions 105. Landing pad insulating layers 330 may have a smaller horizontal width than parallel field insulating materials 115 buried in a substrate 100. A pad insulating layer 130 and a buffer insulating layer 140 may be interposed between the parallel field insulating materials 115 and the landing pad insulating layers 330. Bit line contact plugs 450 may have a bulb-shaped structure having a narrow upper horizontal width and a wide lower horizontal width. For instance, side surfaces of the bit line contact plugs 450 may be tapered. Upper portions of the bit line contact plugs 450 may be vertically aligned with the bit line stack 510. Bottom surfaces of the bit line contact plugs 450 may be disposed at a lower level than the surfaces of the bit line contact landing pads 360. For example, the top surfaces of the bit line contact plug 450 may be recessed and lower portions of the bit line contact plugs 450 may have a rounded end and protrude downward. A protection layer 451 may be formed on side surfaces of the bit line contact plugs 450. For example, the protection layer 451 may be interposed between the bit line contact plugs 450 and gate spacers 550. The protection layer 451 may include silicon oxide. For example, the protection layer 451 may be formed by oxidizing the surfaces of the bit line contact plugs 450. The gate spacer 550 may be in direct contact with the landing pad insulating layers 330.

Referring to FIGS. 1 and 7B, a semiconductor device 20H according to an embodiment of the inventive concept may include bit line contact landing pads 360 having tapered sidewalls. The protection layer 451 may cover tapered side surfaces of the bit line contact landing pads 360. For example, the protection layer 451 may be formed to extend between the bit line contact landing pads 360 and the gate spacers 550. Upper portions of the bit line landing pads 360 may have side surfaces vertically aligned with the bit line contact plugs 450. The gate spacers 550 may be in direct contact with the landing pad insulating layer 330, the buffer insulating layer 140, the pad insulating layer 130, or the parallel field insulating material 115. For example, in FIG. 7B, the landing pad insulating layer 330, the buffer insulating layer 140, and/or the pad insulating layer 130 may not be present compared with the semiconductor device 20G of FIG. 7A.

In FIGS. 7A and 7B, the protection layer 451 and/or the gate spacers 550 may improve process margin of a photolithography process for patterning the bit line contact plugs 450 and/or the bit line contact landing pads 360. When the bit line contact plugs 450 and/or the bit line contact landing pads 360 are excessively etched or misaligned during a photolithography process, the protection layer 451 and/or the gate spacers 550 may cover the surfaces of the bit line contact plugs 450 and/or the bit line contact landing pads 360 so that the bit line contact plugs 450 and/or the bit line contact landing pads 360 may be reliably electrically insulated from other adjacent conductive components, such as the storage contact plug 650.

Figure 8A:
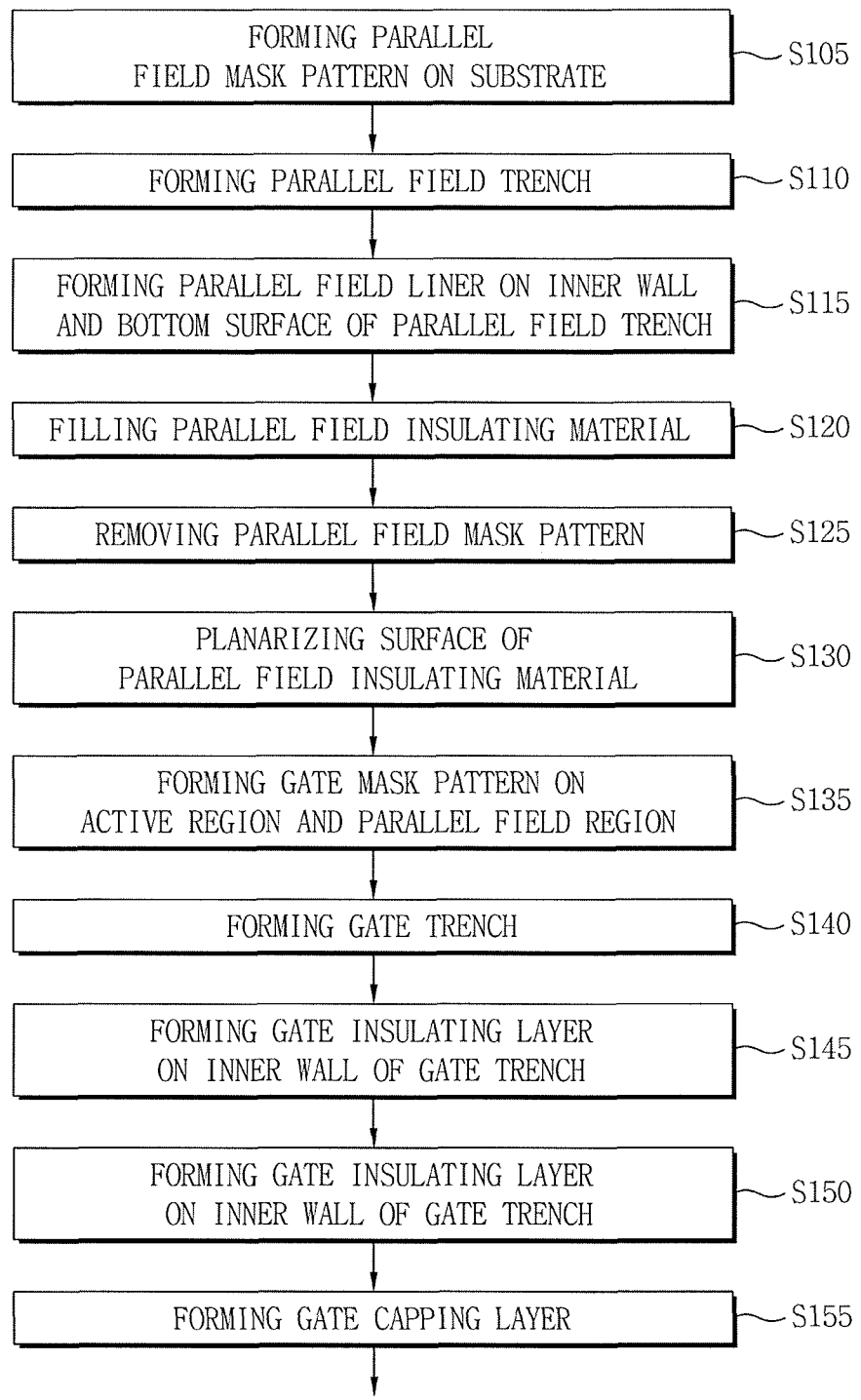
Figure 9A:
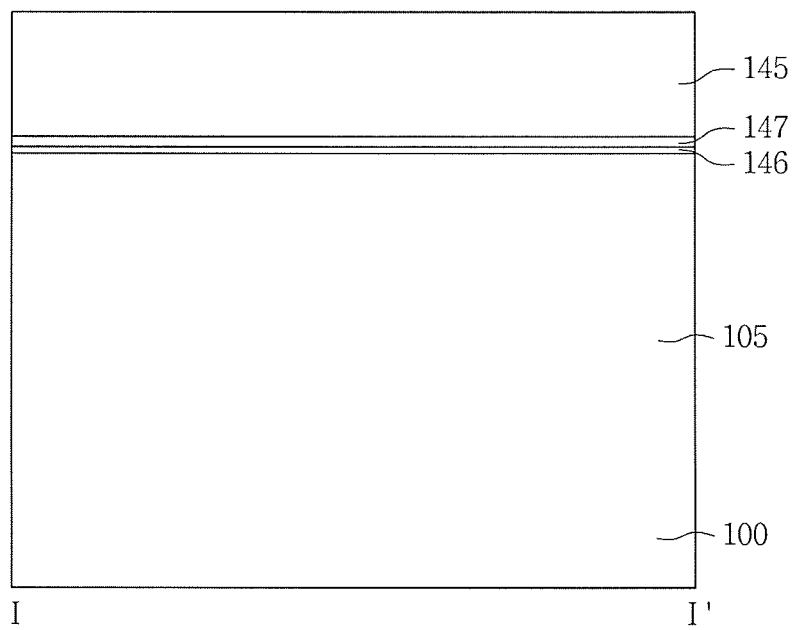
Figure 9B:
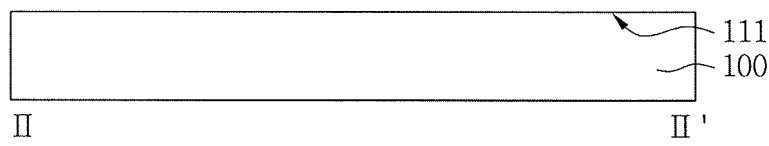
Figure 10A:
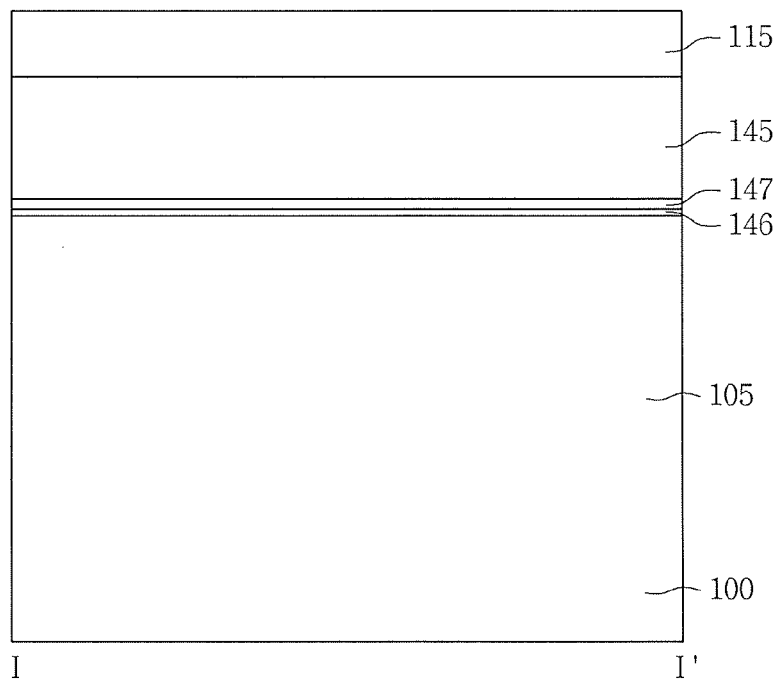
Figure 10B:
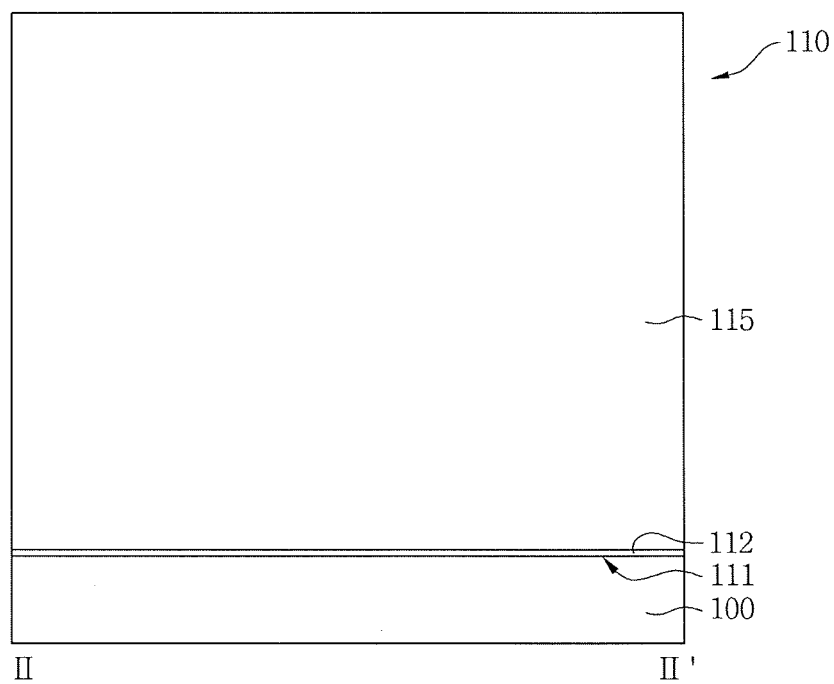
Figure 11A:
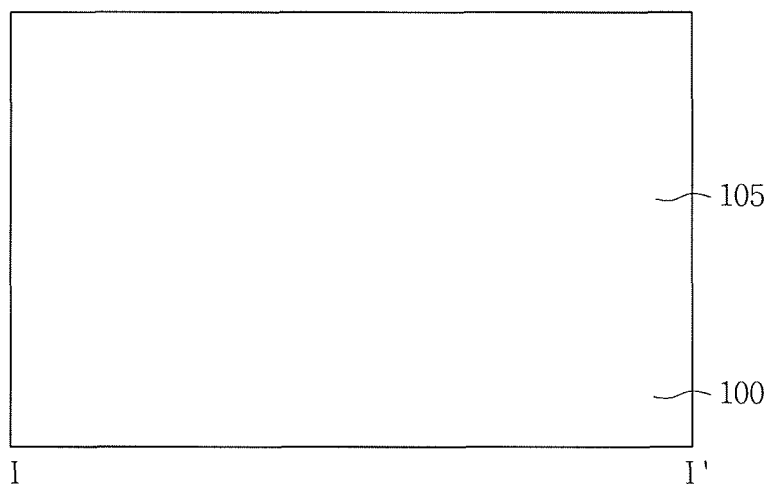
Figure 11B:
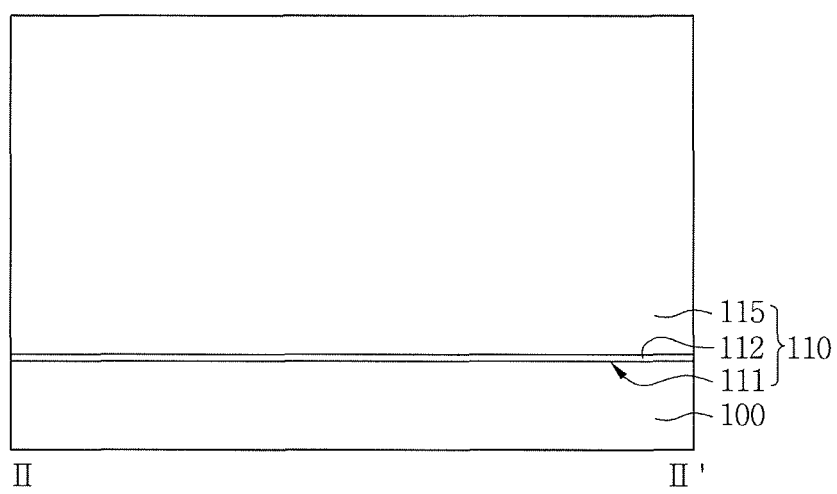
Figure 12A:
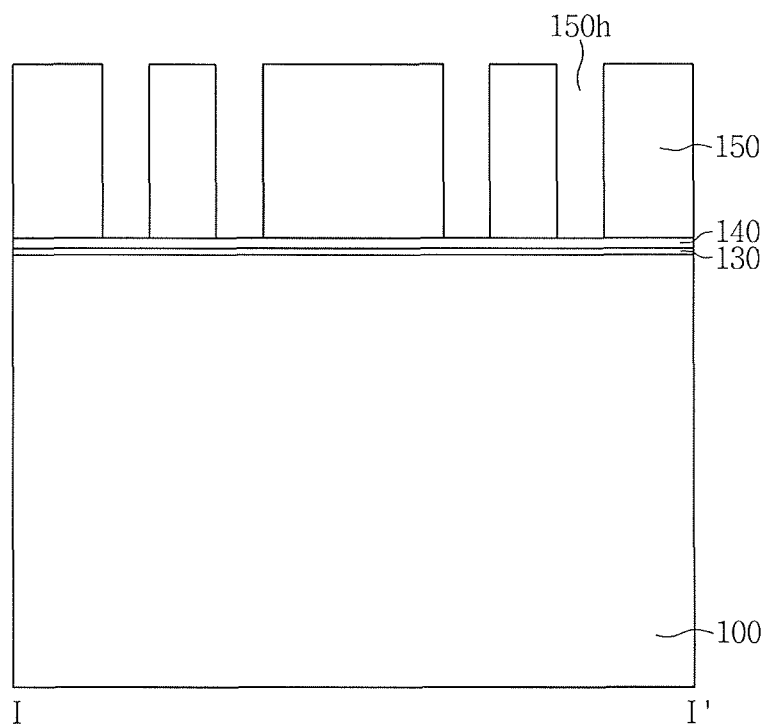
Figure 12B:
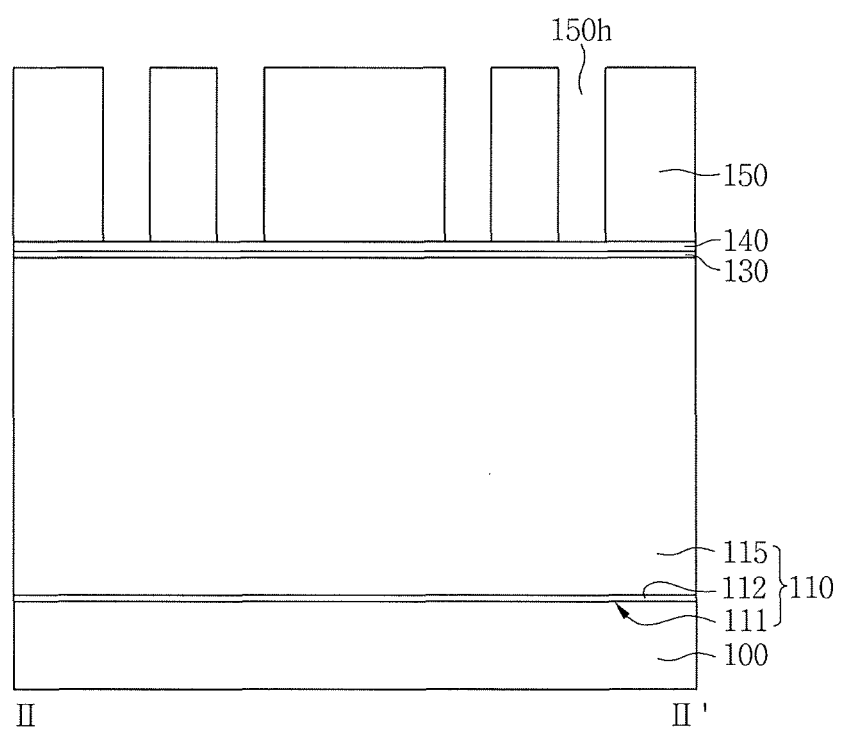

FIGS. 8A through 8D are a flowchart illustrating a method of fabricating semiconductor devices according to an embodiment of the inventive concept. For example, FIG. 8A illustrates a method of forming a parallel field region and a gate structure, FIG. 8B illustrates a method of forming a crossing field region, FIG. 8C illustrates a method of forming landing pads, and FIG. 8D illustrates a method of forming a bit line structure.

FIGS. 9A through 33A are cross-sectional views taken along a line I-I' of FIG. 1, and FIGS. 9B through 33B are cross-sectional views taken along a line II-II' of FIG. 1 according to an embodiment of the inventive concept. Corresponding pairs of the FIGS. 9A through 33A and the FIGS. 9B through 33B illustrate cross-sectional views of the semiconductor devices resulted from process steps of the flowchart of FIGS. 8A through 8D.

Referring to FIGS. 1, 8A, 9A, and 9B, process steps S105 and S106 will be described. In the process step S105, a parallel field mask pattern 145 is formed on a substrate 100. With the parallel field mask pattern 145 as an etch mask, a parallel field trench 111 is formed by etching the substrate 100 in the process step S110. The parallel field mask pattern 145 is formed on the substrate 100. An active region 105 is defined under the parallel field mask pattern 145. A parallel field mask pad insulating layer 146 and a parallel field mask buffer insulating layer 147 may be formed between the parallel field mask pattern 145 and the substrate 100. The parallel field mask pad insulating layer 146 may include silicon oxide, the parallel field mask buffer insulating layer 140 may include silicon nitride, and the parallel field mask pattern 145 may include silicon oxide, such as middle temperature oxide (MTO).

Referring to FIGS. 1, 8A, 10A, and 10B, process steps S115 and S120 will be described. In the process step S115; a parallel field liner 112 is formed on inner walls and bottom surface of the parallel field trench 111. For example, the liner 112 is formed by thermally oxidizing or radical-oxidizing the inner wall and bottom surface of the parallel field trench 111. The parallel field liner 112 may include a silicon oxide layer, a silicon nitride layer, or a double layer thereof. For the double layered parallel field liner 112, the silicon oxide layer may be formed by thermally oxidizing or radical-oxidizing the inner wall and bottom surface of the parallel field trench 111, and a silicon nitride layer may be conformally formed on the silicon oxide layer using a deposition process, such as a chemical vapor deposition (CVD) process. In the process step S120, the parallel field trench 111 is filled with a parallel field insulating material 115. The parallel field insulating material 115 may include silicon oxide, such as undoped silicate glass (USG), tonen silazene (TOSZ), or high-density plasma (HDP) oxide.

Referring to FIGS. 1, 8A, 11A, and 11B, process steps S125 and S130 will be described. In the process step of S125, the active region 105 is exposed by partially removing the parallel field insulation material 115 such that the parallel field mask pattern 145 is exposed and the parallel field insulation material 115 may remain on the parallel field liner 112. In the process step of S125, the exposed parallel field mask pattern 145 is removed. The parallel field mask buffer insulating layer 147 and the field mask pad insulating layer 146 are also removed to expose the active region 105.

The remaining parallel field insulating material 115 on the parallel field liner 112 is planarized in the process step of S130. The process steps of S125 and S130 may be carried by using a chemical mechanical polishing (CMP) process and/or an etch-back process.

Referring to FIGS. 1, 8A, 12A, and 12B, a process step of S135 will be described. In the process step of S135 a gate mask pattern 150 is formed on both the active region 105 and the parallel field region 110. The process step of S135 may include forming a pad insulating layer 130 on the substrate 100, forming a buffer insulating layer 140 on the pad insulating layer 130, and forming the gate mask pattern 150 on the buffer insulating layer 140. The gate mask pattern 150 may have a gate trench hole 150h to expose the buffer insulating layer 140. The pad insulating layer 130 may be formed directly on the surface of the substrate 100 and include silicon oxide. The forming the pad insulating layer 130 may include oxidizing the surface of the substrate 100 or forming silicon oxide on the surface of the substrate 100 using a CVD process. The buffer insulating layer 140 may be formed directly on the pad insulating layer 130 and include silicon nitride. The gate mask pattern 150 may be formed directly on the buffer insulating layer 140 and include silicon oxide, such as MTO. For instance, the pad insulating layer 130 may be formed to a thickness of about 100 Å, the buffer insulating layer 140 may be formed to a thickness of about 200 Å or less, and the gate mask pattern 150 may be formed to a thickness of about 1000 Å.

Referring to FIGS. 1, 8A, 13A, and 13B, process steps of S140, S145, and S150 will be described. In the process step of S140, a gate trench 210 is formed. In the process step of S145, a gate insulating layer 220 is formed on the inner wall of the gate trench 210. In the process step of S150, a gate electrode 240 is formed in a lower region of the gate trench 210.

In the process step of S140, the exposed buffer insulating layer 140, pad insulating layer 130, and substrate 100 are etched to form the gate trench 210 using the gate mask pattern 150 as an etch mask. The resulting gate trench 210 is aligned with the trench hole 150h. The gate trench 210 may be formed to a depth of about 1000 Å from the surface of the substrate 100.

Figure 13A:
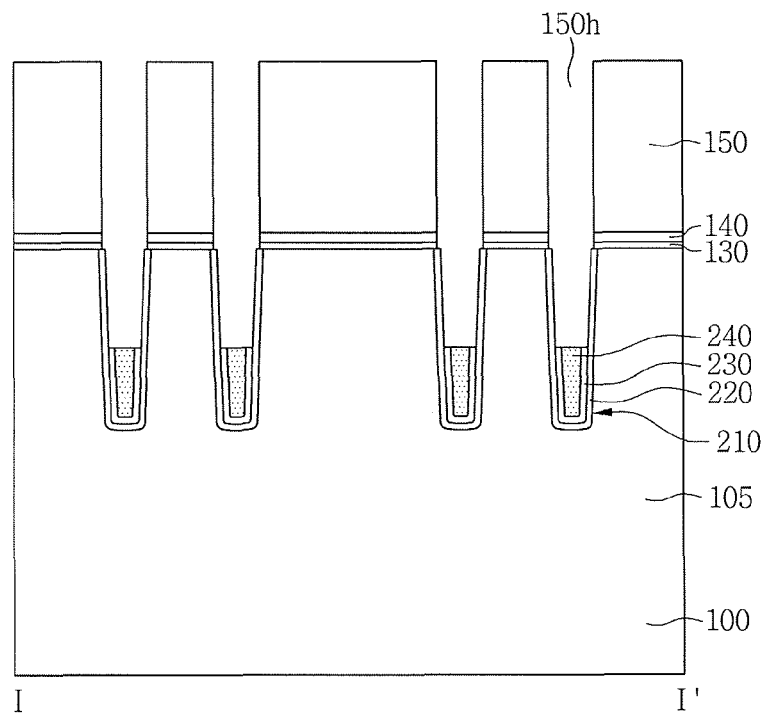
Figure 13B:
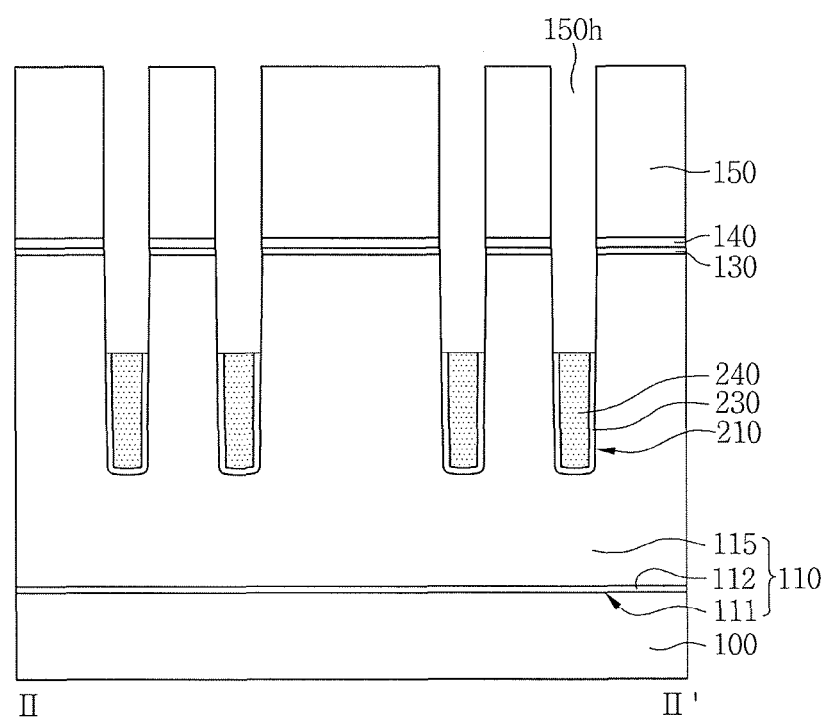
Figure 14A:
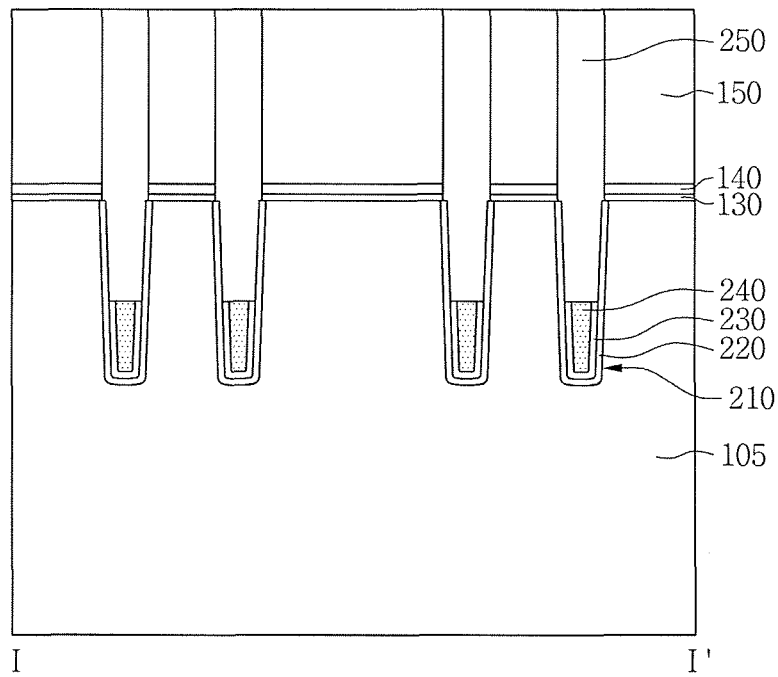
Figure 14B:
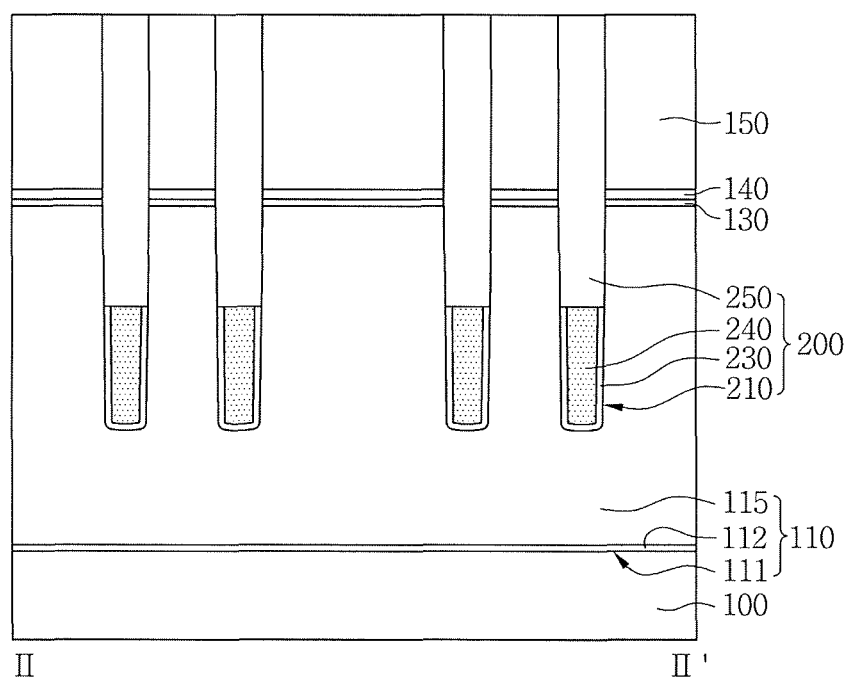
Figure 15A:
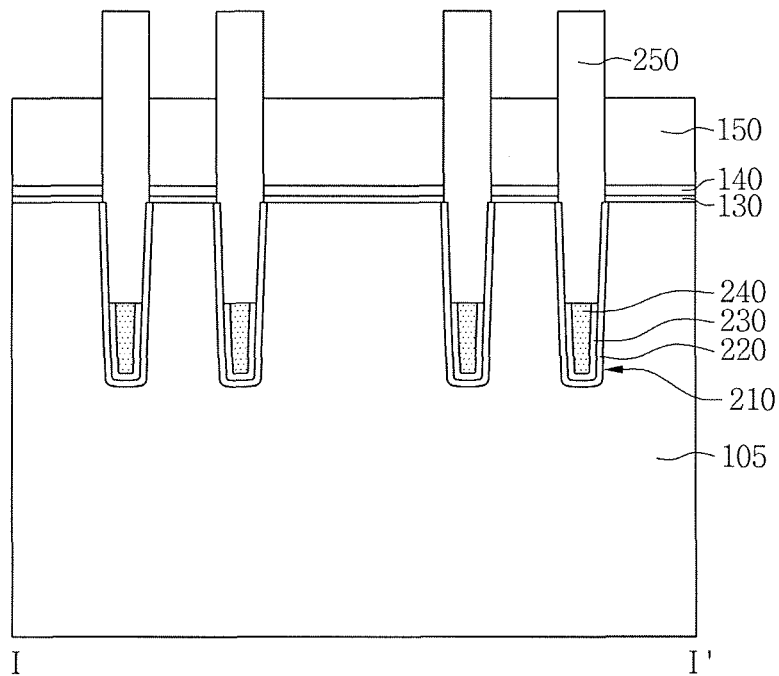
Figure 15B:
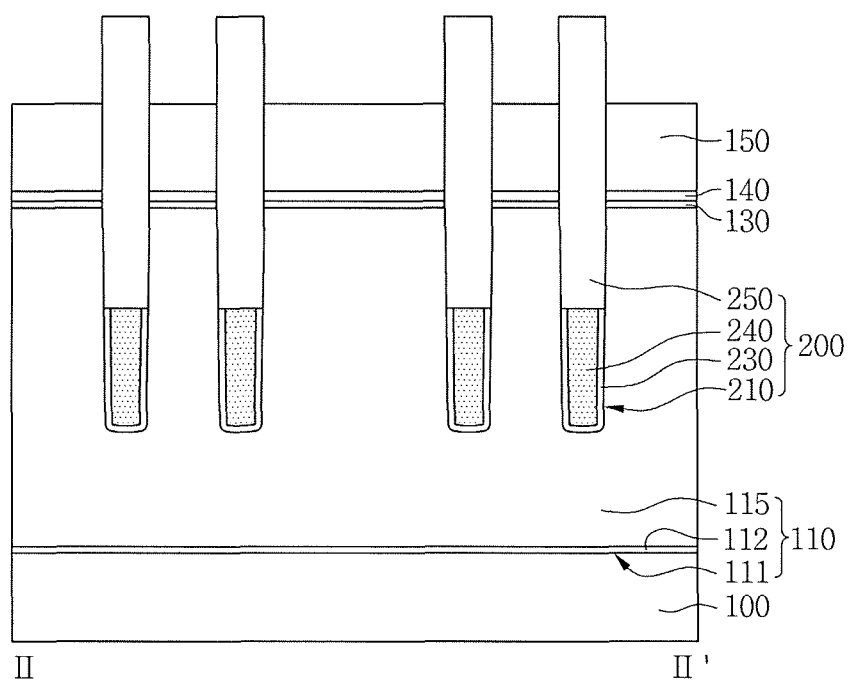
Figure 16A:
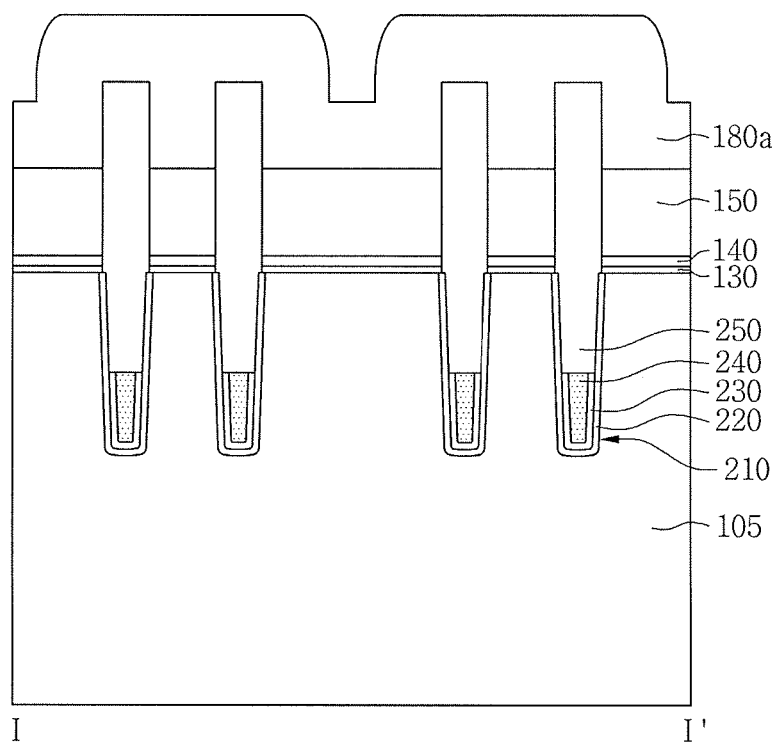
Figure 16B:
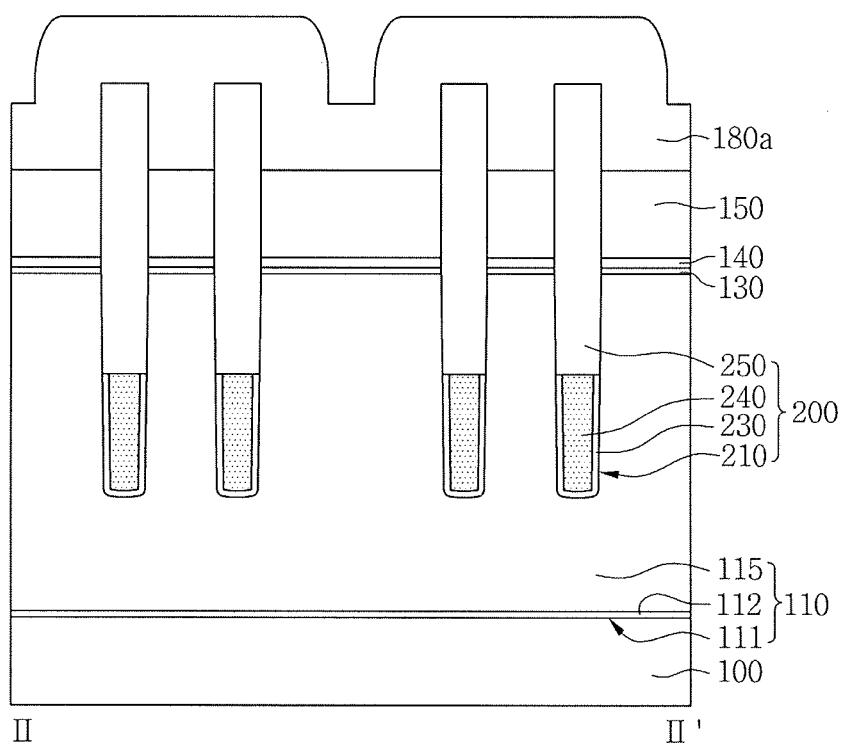
Figure 17A:
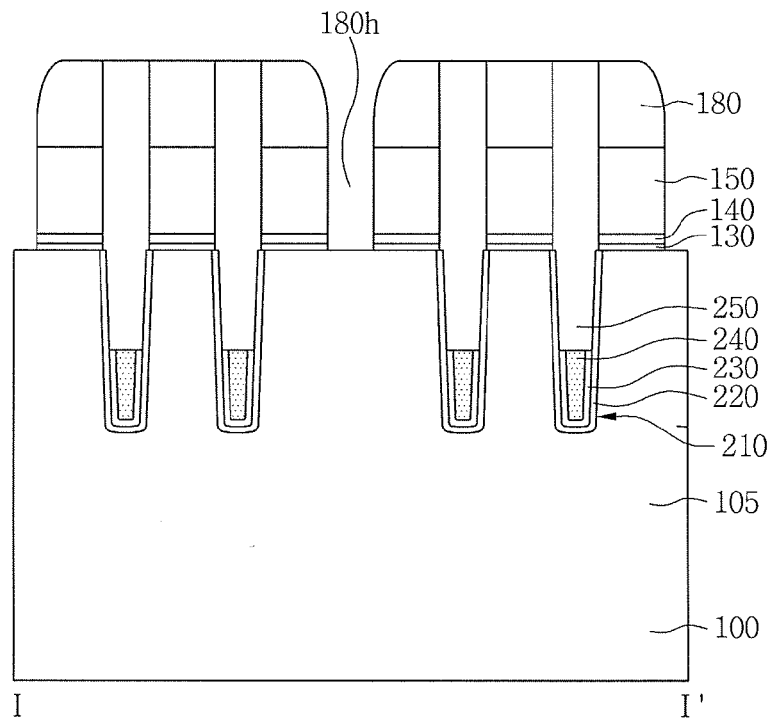
Figure 17B:
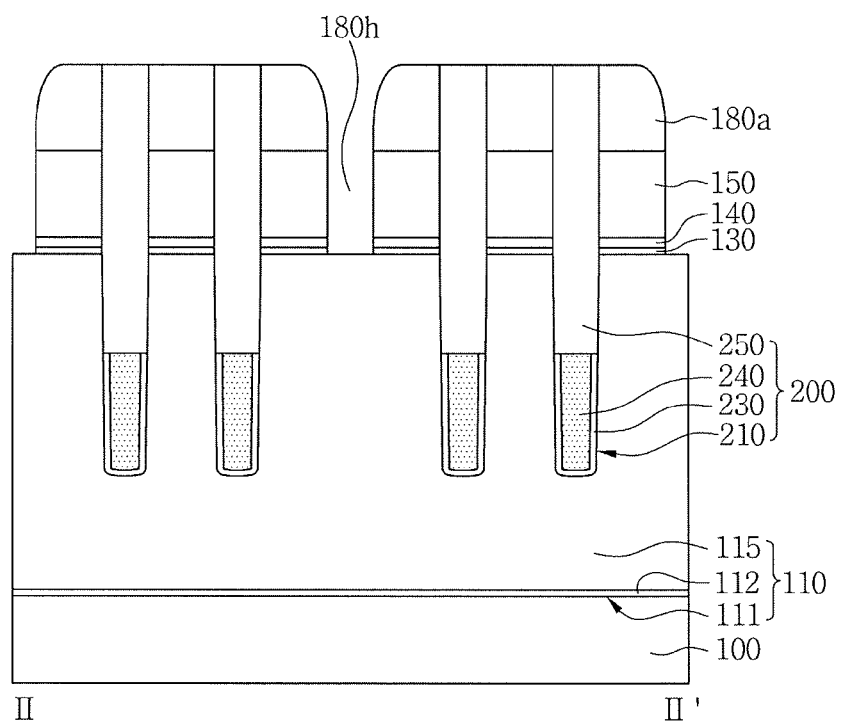
Figure 18A:
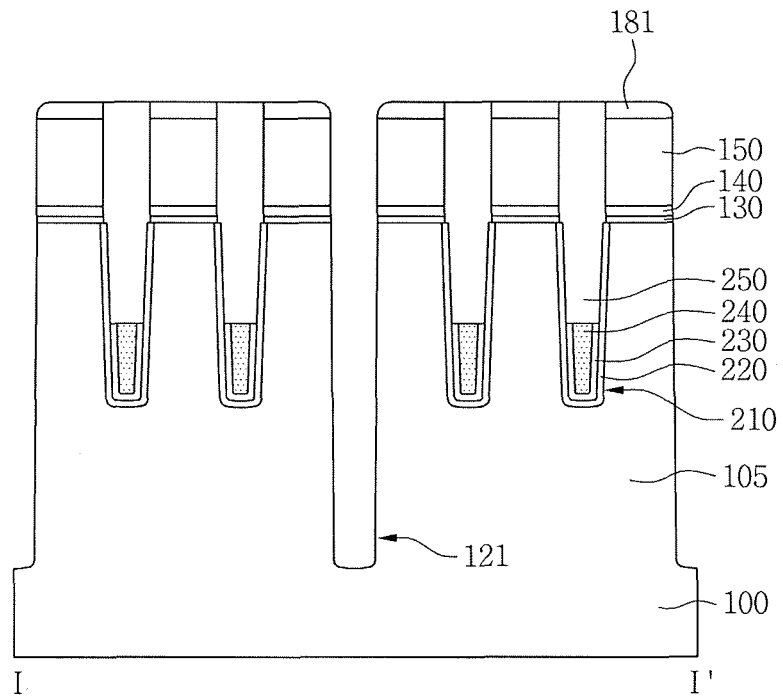
Figure 18B:
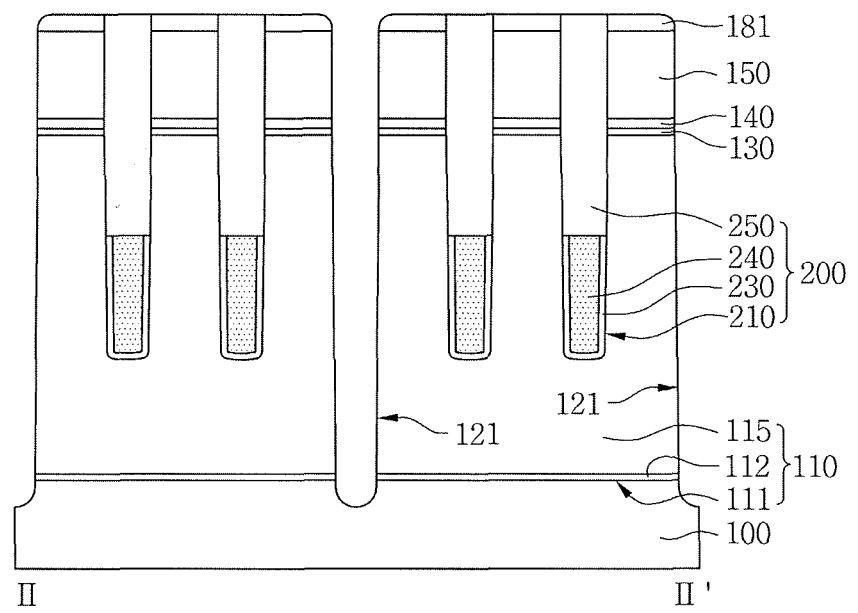
Figure 19A:
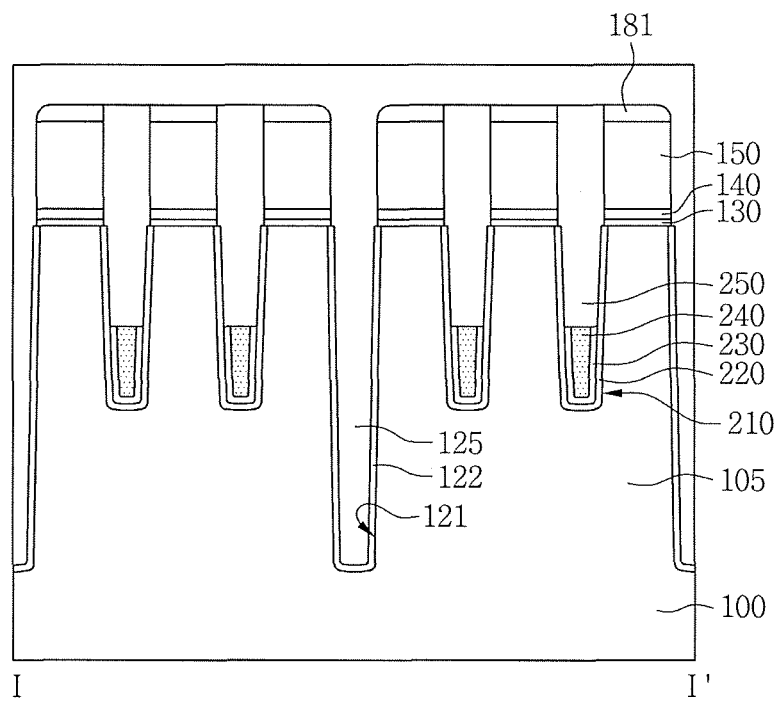
Figure 19B:
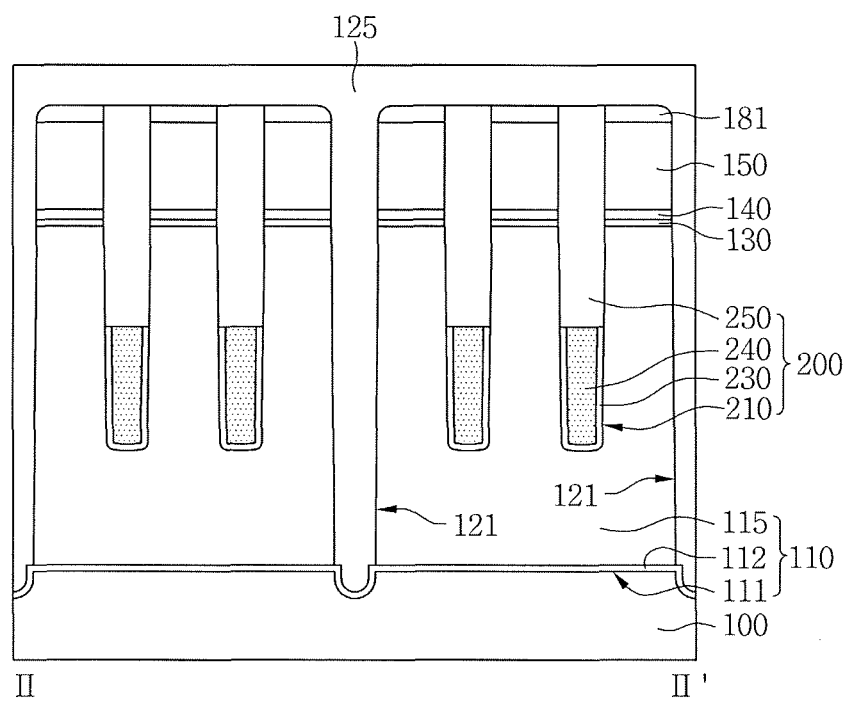

In the process step of S145, the gate insulating layer 220 is formed by thermally oxidizing or radical-oxidizing the surface of the substrate 100 exposed on the inner walls of the gate trench 210 of FIG. 13A. The gate insulating layer 220 is not formed on the gate trench 210 of FIG. 13B because that gate trench of FIG. 13 is formed in the parallel field region 110. Accordingly, the gate insulating layer 220 is formed on the inner wall of the gate trench 210 formed in the active region 105.

In the process of S145, a gate barrier layer 230 is conformally formed on the resulting structure of the gate insulating layer 220. A top end of the gate barrier layer 230 may be disposed at a lower level than half the gate trench 210. The gate barrier layer 230 may include, for example, Ti, TiN, Ta, TaN, TiW, or various other barrier metals. The method may include forming the gate electrode 240 on the gate barrier layer 230 to fill the lower region of the gate trench 210. The gate electrode 240a may include, for example, tungsten, aluminum, copper, or various other metals.

Referring to FIGS. 1, 8A, 14A, and 14B, a process step of S155 will be described. In the process step of S155, a gate capping layer 250 is formed to fill the gate trench 210. For example, the gate capping layer 250 may completely fill the gate trench 210 and the trench hole 150h. The method may include planarizing the top surface of the gate capping layer 250 and the top surface of the gate mask pattern 150 at substantially the same level. The planarization process may include an etch-back process or a CMP process. The gate capping layer 250 may include silicon nitride. For example, the gate capping layer 250 may protrude to a height of about 1000 Å from the surface of the substrate 100.

Referring to FIGS. 1, 8B, 15A, and 15B, a process step of S205 will be explained. In the process of S205, an upper portion of the gate mask pattern 150 is removed. For example, the method may include recessing the top surface of the gate mask pattern 150 exposed between the gate capping layers 250. During this process, upper side surfaces of the gate capping layers 250 may be partially exposed. The gate capping layers 250 are formed in dam or fence shapes extending in the first direction of FIG. 1. During this process, about 30 to 50% of the total height of each of the gate capping layers 250 protruding over the surface of the substrate 100 may be exposed. For example, about 40% of the total height of each of the gate capping layers 250 protruding over the surface of the substrate 100 may be exposed.

Referring to FIGS. 1, 8B, 16A, and 16B, a process step of S210 will be described. A spacer mask material layer 180a is formed on the resulting structure of the S210 process step. For example, the spacer mask material layer 180a is formed conformally on the gate capping layer 250 and the gate mask pattern 150 such that the top surface of the spacer mask material layer 180a follows the contours of the underlying surface. The spacer mask material layer 180a may completely fill spaces between gate capping layers 250 disposed relatively closer to each other, and incompletely and concavely fill spaces between gate capping layers 250 disposed relatively far from each other. The spacer mask material layer 180a may be disposed at a higher level than top surfaces of the gate capping layers 250 between the relatively close gate capping layers 250 and at a lower level than the top surfaces of the gate capping layers 250 between the relatively far gate capping layers 250. The spacer mask material layer 180a may include silicon nitride.

Referring to FIGS. 1, 8B, 17A, and 17B, a process step of S215 will be described. A spacer mask pattern 180 is etched such that the surface of the substrate 100 and the surface of the parallel field region 110 are exposed for the next process step of S220 through crossing field trench holes 180h. For example, the process step 215 may include removing the gate mask pattern 150 to form the crossing field trench holes 180h. The process step 215 also may include removing the buffer insulating layer 140 and the pad insulating layer 130 under the gate mask pattern 150 by blanket etching the spacer mask material layer 180a.

Referring to FIGS. 1, 8B, 18A, and 18B, a process step of S220 will be described. A crossing field trench 121 is formed using the spacer mask patter 180 as an etch mask. For example, the process step of S220 may include selectively etching the exposed substrate 100 using upper portions of the spacer mask pattern 180 and the gate capping layer 250 as an etch mask to form the crossing field trench 121. The crossing field trench 121 may be formed to a greater depth below the bottom surface of the gate trench 210. For instance, the depth of the crossing field trench 121 may be at least twice that of the gate trench 210. An intersection between the crossing field trench 121 and the parallel field trench 111 may become deeper. During this process, the upper portions of the spacer mask pattern 180 and the gate capping layer 250 may be partially removed. For example, the spacer mask pattern 180 may be modified into a thin spacer mask pattern 181.

Referring to FIGS. 1, 8B, 19A, and 19B, process steps of S225 and S230 will be described. In the process step of S225, a crossing field liner 122 is formed on the inner walls of the crossing field trench 121. In the process step of S230, a crossing field insulating material 125 is formed on the crossing field liner 122 to fill the crossing field trench 121. For example, the process step of S225 may include forming the crossing field liner 122 by thermally oxidizing or radical-oxidizing the inner wall of the crossing field trench 121. Alternatively, the method may include forming the crossing field liner 122 on the inner walls of the crossing field trench 121 using an ALD process or a semi-atmospheric pressure deposition process. The crossing field liner 122 may be formed only on the inner walls of the crossing field trench 121 formed in the active region 105. The crossing field liner 122 may include silicon oxide. The process step of S230 may include forming the crossing field insulating material 125 to cover a top surface of the thin spacer mask pattern 181 and the top surface of the gate capping layer 250. The method may include forming silicon nitride using a deposition process.

Referring to FIGS. 1, 8B, 20A, and 20B, a process step of S235 will be explained. The top surface of the gate mask pattern 150 is exposed by partially removing upper portions of the crossing field insulating material 125, the thin spacer mask pattern 181, and the gate capping layer 250 to the level of the top surface of the gate mask pattern 150. An etch-back process or a CMP process may be used to remove the upper portions of the crossing field insulating material 125, the thin spacer mask pattern 181, and the gate capping layer 250. The etch-back process may include a dry etching process or a wet etching process using phosphoric acid ($H_3PO_4$).

Referring to FIGS. 1, 8B, 21A, and 21B, a process step of S240 will be described. In the process step of S240, the exposed gate mask pattern 150 is removed. The resulting structure may expose the side surfaces of the gate capping layer 250, the side surfaces of the crossing field insulating material 125, and the surface of the buffer insulating layer 140. For example, the gate capping layer 250 may protrude over the buffer insulating layer 140. The crossing field insulating material 125 may not be damaged during the removal of the gate mask pattern 150 because of its etch selectivity with respect to the gate mask pattern 150. The crossing field insulating material 125 may includes silicon nitride. The buffer insulating layer 140 disposed on the substrate 100 corresponding to the active region 105 may prevent the substrate 100 from having pitting during the removal of the gate mask pattern 150. For instance, pitting may be prevented from occurring on the surface of the substrate 100 adjacent to the crossing field insulating material 125 and/or the gate capping layer 250.

Referring to FIGS. 1, 8C, 22A, and 22B, a process step of S310 will be described. In the process step of S310, a sacrificial layer 320 is formed on the resulting structure of the process step of S240. The sacrificial layer 320 may be formed to include silicon oxide, such as MTO, using a CVD process. The sacrificial layer 320 may cover the exposed top surface of the pad insulating layer 130, the side and top surfaces of the gate capping layer 250, and the side and top surfaces of the crossing field insulating material 125.

Referring to FIGS. 1, 8C, 23A, and 23B, a process step of S320 will be explained. In the process step of S320, a landing pad trench 325 is formed over the parallel field region 110. The landing pad trench 325 may expose the buffer insulating layer 140 disposed on the parallel field region 110 and portions of side surfaces of the crossing field insulating material 125 and the gate capping layer 250 crossing the parallel field region 110. For brevity, it is assumed in FIGS. 23A and 23B that the landing pad trench 325 wholly exposes the parallel field region 110, the crossing field insulating material 125 and the gate capping layer 250 crossing the parallel field region 110.

Referring to FIGS. 1, 8C, 24A, and 24B, a process step of S330 will be described. In the process step of S330, a landing pad insulating layer 330 is formed to fill the landing pad trench 325. The landing pad insulating layer 330 may cover the sacrificial layer 320 disposed on the active region 105, cover the buffer insulating layer 140 disposed on the parallel field region 110, and cover the gate capping layer 250 and the crossing field insulating material 125. The landing pad insulating layer 330 may include silicon nitride.

Referring to FIGS. 1, 8C, 25A, and 25B, a process step of S340 will be described. In the process step of S340 an upper portion of the landing pad insulating layer 330 is removed to the level of the top surface of the crossing field insulating material 125. For example, the method may include performing a dry etch-back process or a wet etch-back process using phosphoric acid. During this process, the top surface of the sacrificial layer 320 may become lower than that of the gate capping layer 250 of the active region 105. Top surfaces of the landing pad insulating layer 330, the gate capping layer 250 and the crossing field insulating material 125 may be substantially planarized.

Referring to FIGS. 1, 8C, 26A, and 26B, a process step of S350 will be described. In the process step of S350 the sacrificial layer 320 is removed. For instance, the process step may include performing a wet etching process using fluoric acid (HF). The buffer insulating layer 140 disposed on the substrate 100 corresponding to the active region 105 may protect the substrate 100 from etch-induced damage caused by fluoric acid (HF) during the removal of the sacrificial layer 320. For example, such etch-induced damage as pitting may be prevented from occurring on the surface of the substrate 100 adjacent to the crossing field insulating material 125 and/or the gate capping layer 250.

Referring to FIGS. 1, 8C, 27A, and 27B, process steps of S360 and S370 will be described. In the process steps of S360 and S370, landing pad holes 350$h$ are formed to expose the active region 105. In the process step of S360, the buffer insulating layer 140 disposed on the active region 105 is removed, and in the process step of S370 the gate capping layer 250 and the crossing field insulating material 125 protruding over the active region 105 are partially removed such that horizontal widths of the gate capping layer 250 and the crossing field insulating material 125 are reduced. As a result, the landing pad holes 350$h$ may be widened in a horizontal direction. For instance, the gate capping layer 250 protruding over the substrate 100 may have a smaller width than the gate capping layer 250 disposed in the gate trench 210 adjacent to the surface of the substrate 100. Also, the crossing field insulating material 125 protruding over the substrate 100 may have a smaller width than the crossing field insulating material 125 disposed in the crossing field trench 121 adjacent to the surface of the substrate 100. The pad insulating layer 130 disposed on the active region 105 is also removed to expose the surface of the substrate 100.

Figure 27A:
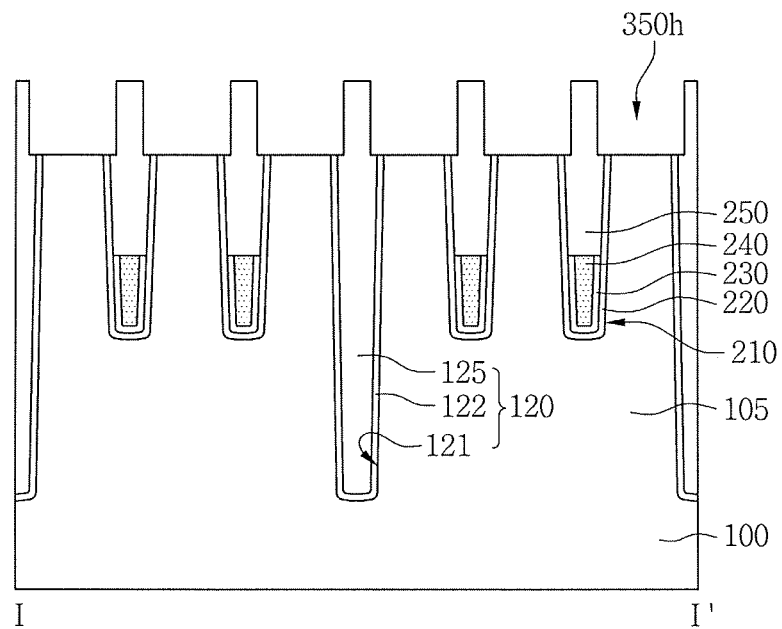
Figure 27B:
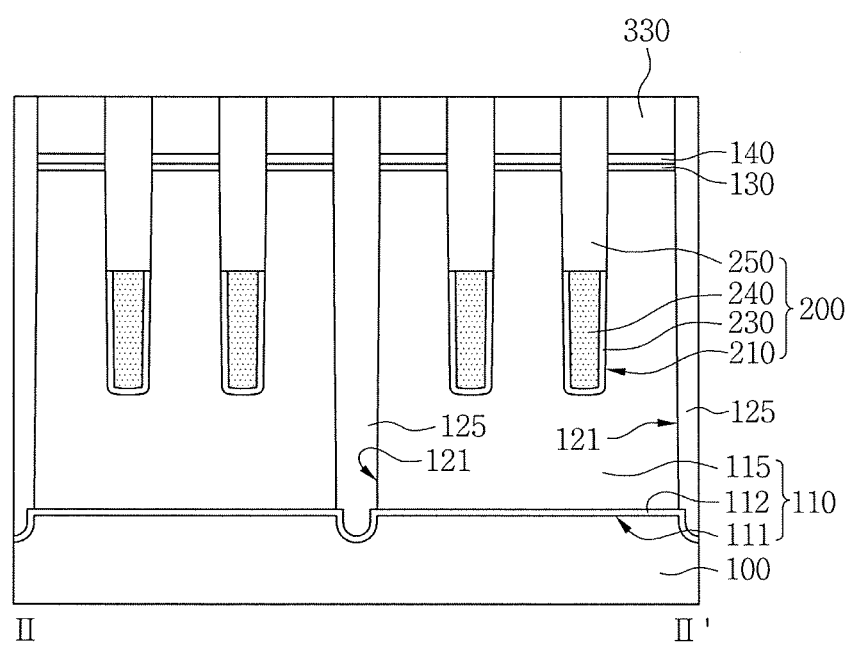
Figure 28A:
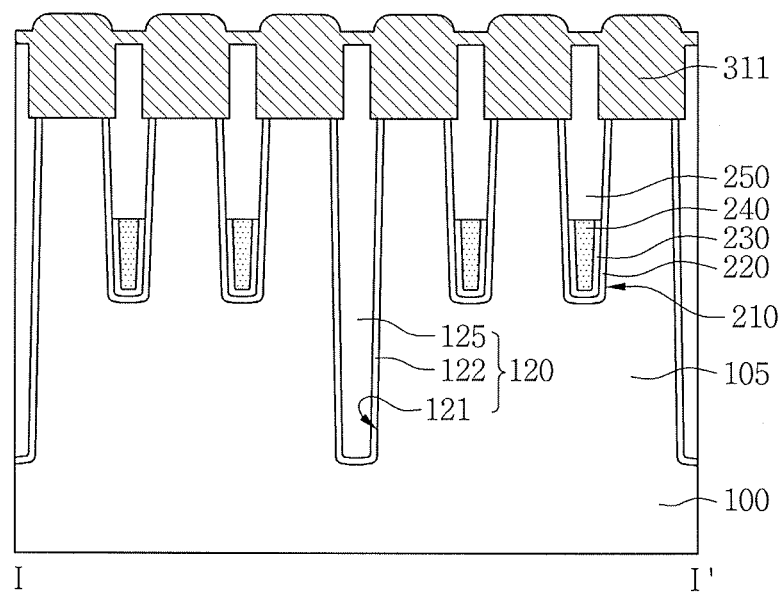
Figure 28B:
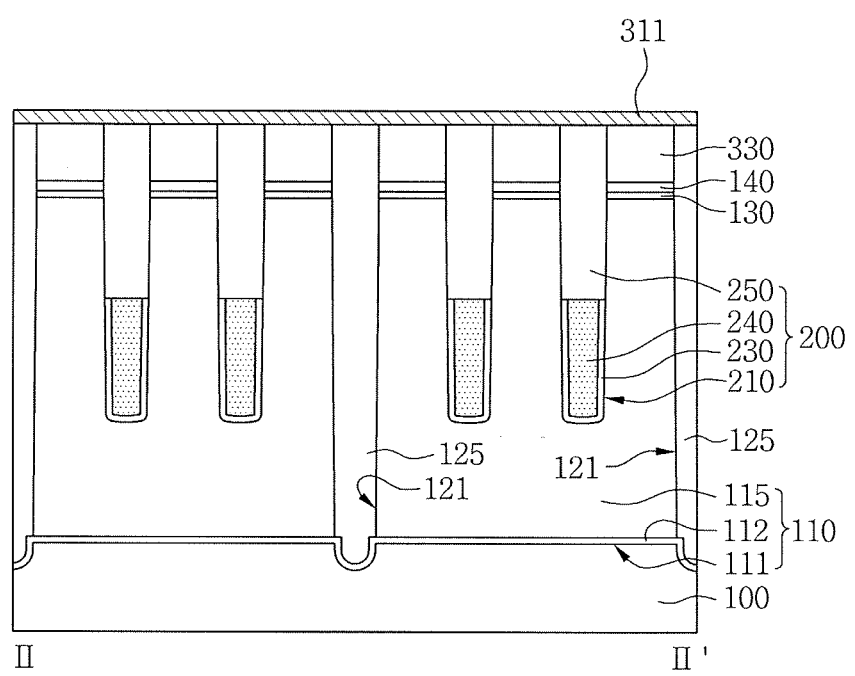

In an embodiment, the processes steps of S360 and S370 described with reference to FIGS. 27A and 27B will be omitted to form the semiconductor device 20F of FIGS. 6A and 6B. For the semiconductor device 20F, the other remaining process steps except for the process steps of S360 and S370 apply.

Figure 21A:
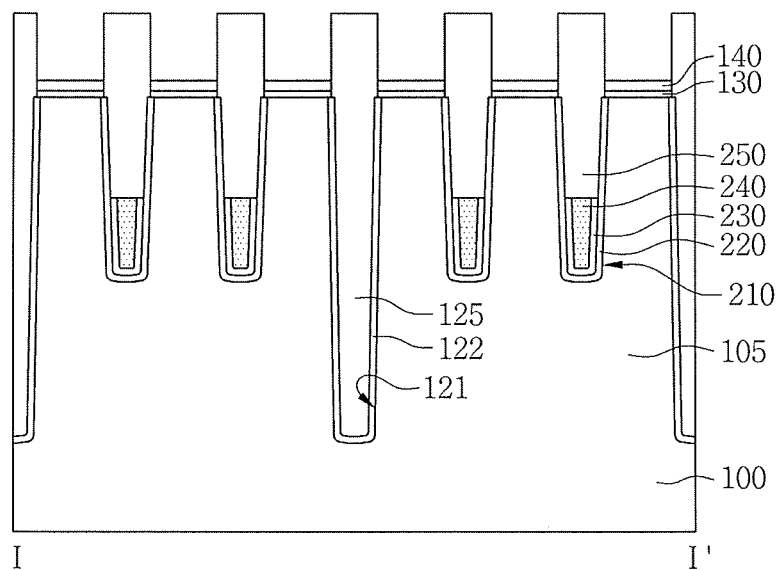
Figure 21B:
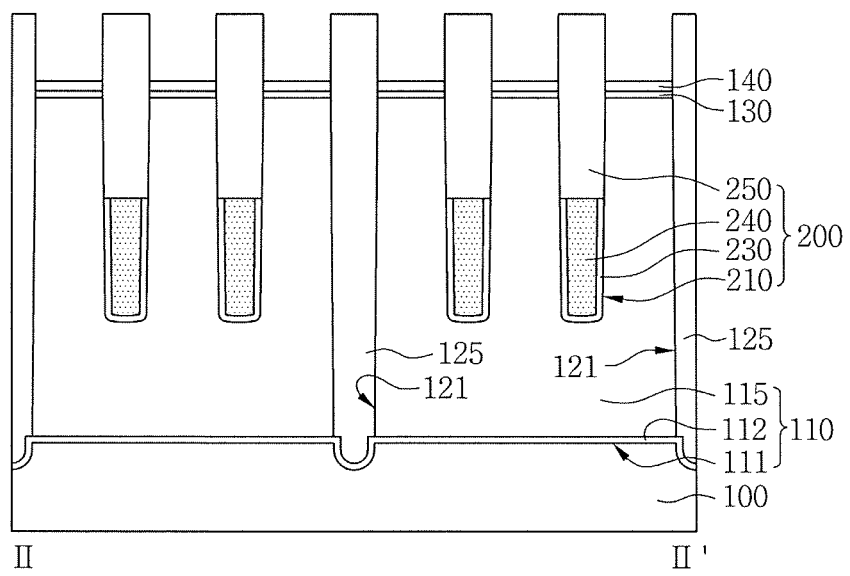
Figure 22A:
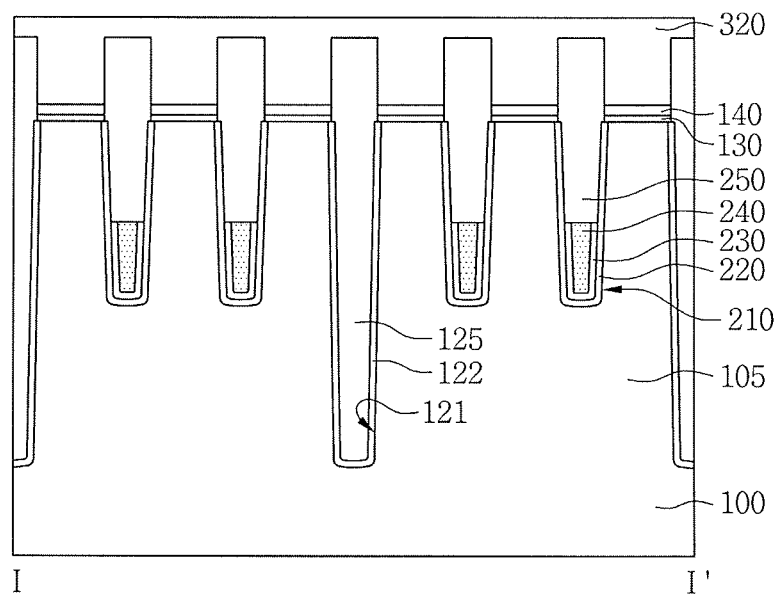
Figure 22B:
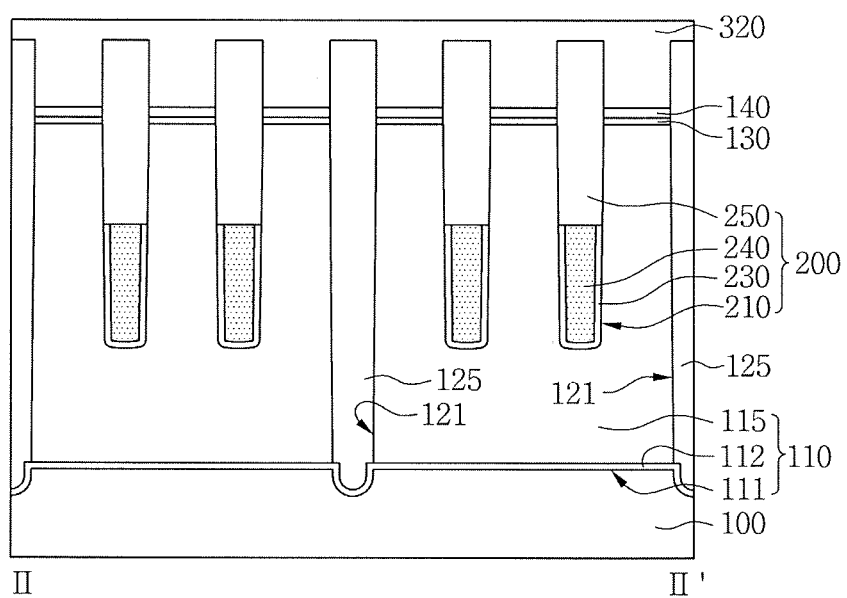
Figure 23A:
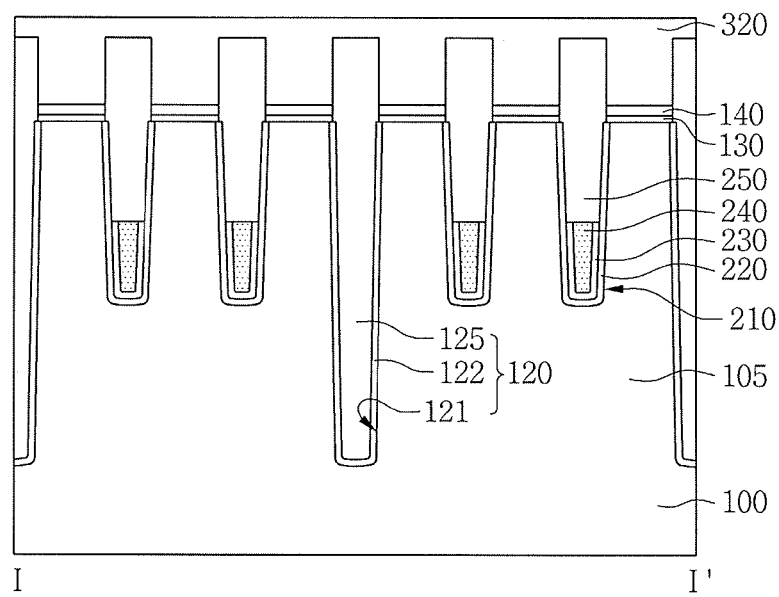
Figure 23B:
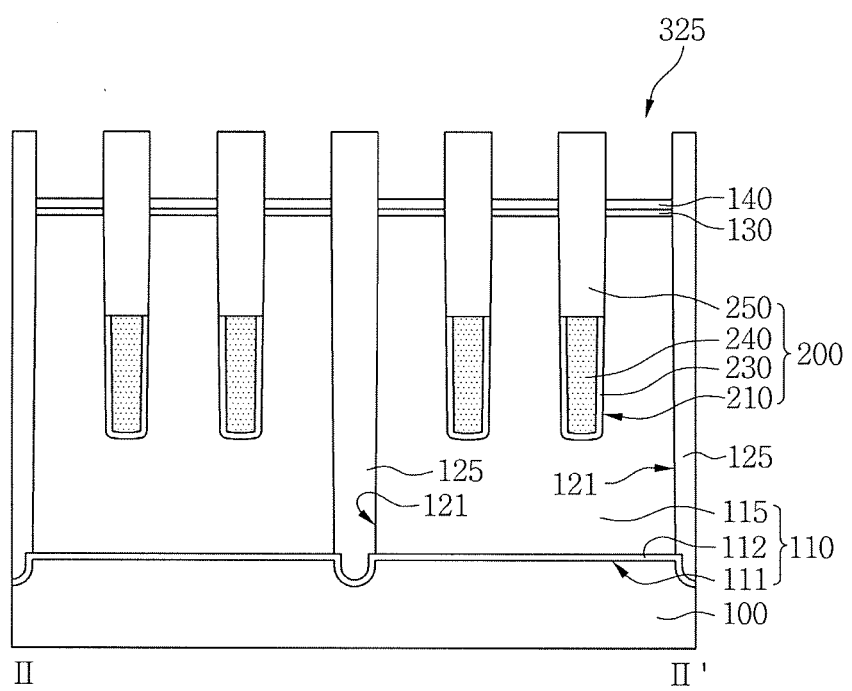
Figure 24A:
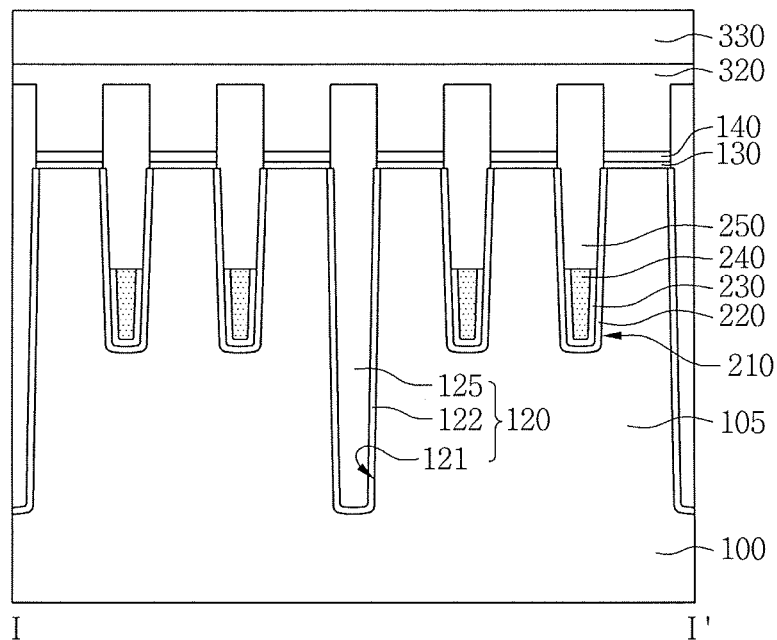
Figure 24B:
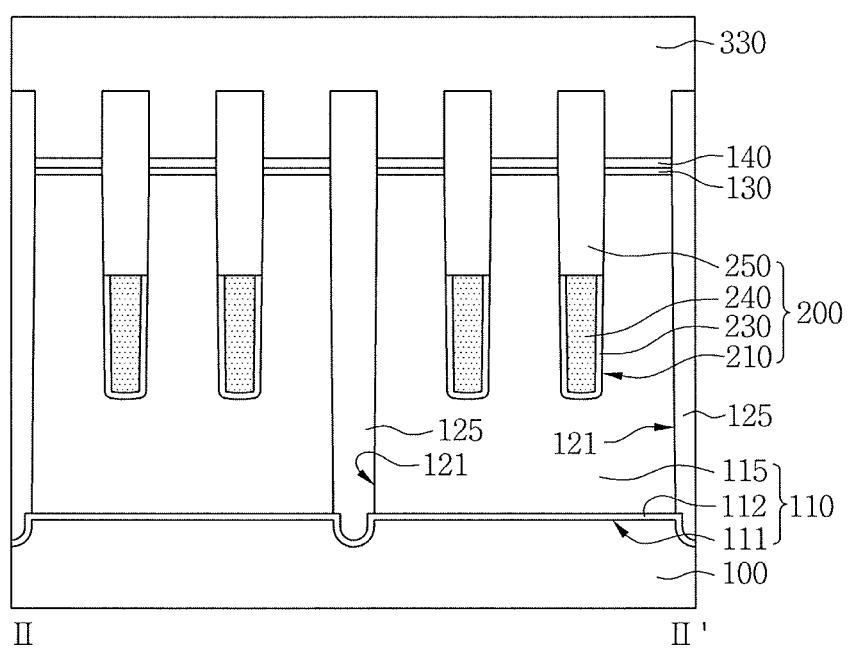
Figure 25A:
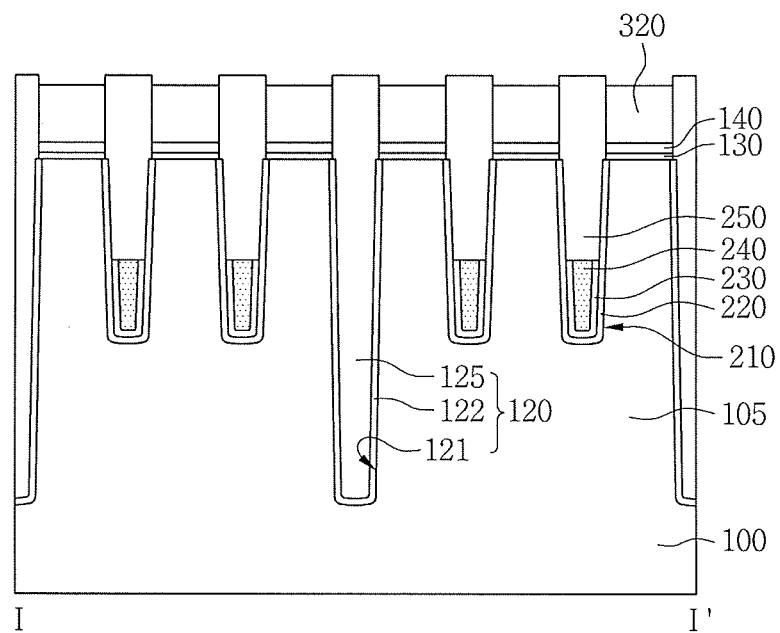
Figure 25B:
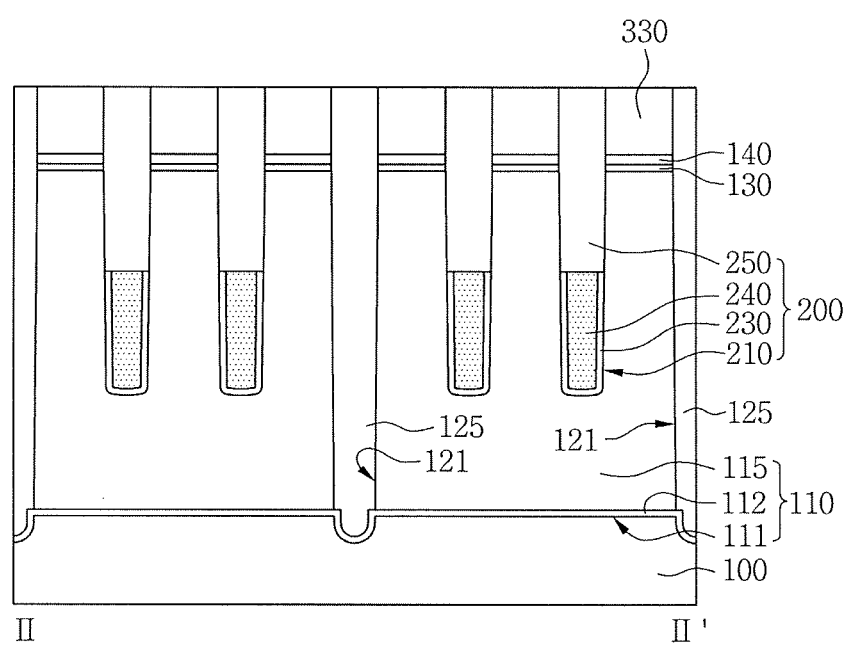
Figure 26A:
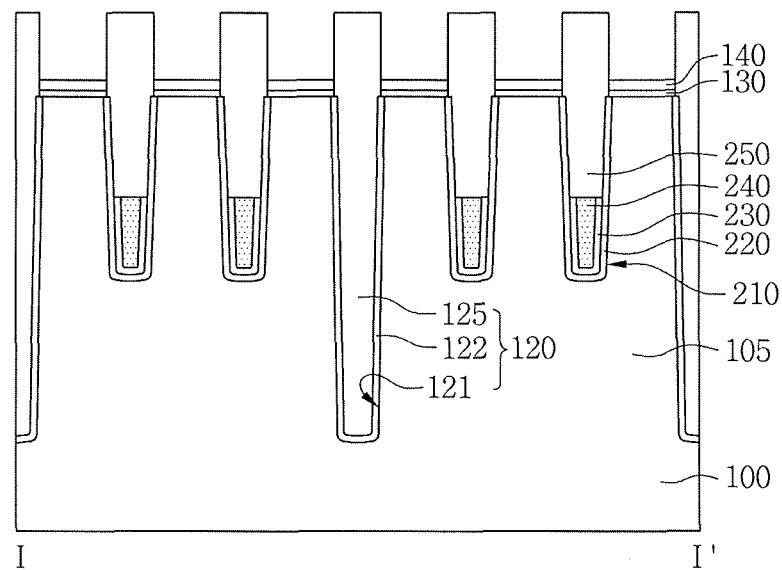
Figure 26B:
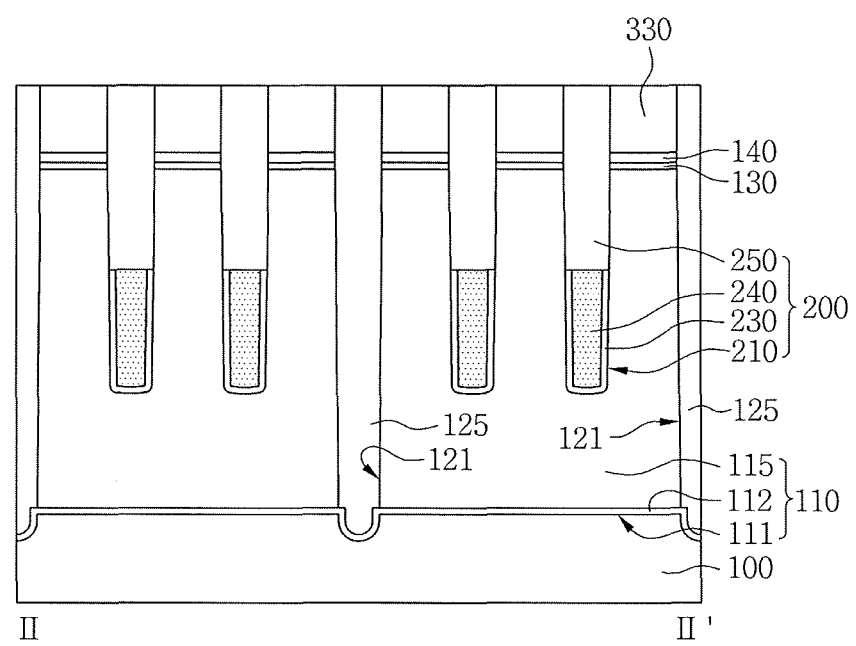

In an embodiment, after the process step of S240 described with reference to FIGS. 21A and 21B is performed, the process steps of S360 and S379 described with reference to FIGS. 27A and 27B may be directly followed. For instance, when landing pads 350 are formed relatively thin during a subsequent process, an additional process of forming a landing pad insulating layer 330 may be omitted.

Referring to FIGS. 1, 8C, 28A, and 28B, a process step of S380 will be described. In the process step of S380 a landing pad material layer 311 overfills the landing pad holes 350$h$. The top surface of the landing pad material layer 311 may be disposed at a higher level than that of the gate capping layer 250 and/or the crossing field insulating material 125. For example, the landing pad material layer 350 may include single crystalline silicon grown using a selective epitaxial growth (SEG) process. In one embodiment, the landing pad material layer 350 may include poly-Si formed using a CVD process.

Referring to FIGS. 1, 8C, 29A, and 29B, a process step of S390 will be described. In the process step of S390 landing pads 350 are formed in the landing pad holes 350$h$. For instance, the top surface of the landing pad material layer 311 is planarized using an etch-back process or a CMP process to the level of the top surface of the gate capping layer 250. For example, when the landing pad material layer 311 is planarized using a CMP process, the top surface of the gate capping layer 250 may be used as a polishing stop layer. The planarization process of S390 may render the top surfaces of the gate capping layer 250 and the planarized landing pad material layer lower than before. As a result, the landing pad material layer 311 may be patterned into the landing pads 350.

The landing pads 350 may include a bit line contact landing pad 360 and two storage contact landing pads 370. The landing pads 350 may have a wider horizontal width than that of the underlying substrate 100. Accordingly, the landing pads 350 are in full contact with the underlying substrate so that contact resistance between the landing pads 350 and the substrate 100 may have a minimum value. Also, the alignment margin of contact plugs to be aligned with the landing pads during the subsequent process is increased enough to accommodate process variations of the subsequent process.

Referring to FIGS. 1, 8D, 30A, and 30B, process steps of S405 and S410 will be described. In the process step of S405 a lower interlayer insulating layer 410 is formed on the resulting structure of the process step of S390. In the process step of S410 bit line contact plugs 450 are formed on the bit line contact landing pads 360 through bit line contact holes 450h. The bit line contact holes 450h are formed in the lower interlayer insulating layer 410 to expose the bit line contact landing pads 360. The lower interlayer insulating layer 410 may include silicon oxide. The bit line contact plug 450 may include doped silicon, a metal silicide, or a metal. For example, the bit line contact plug 450 may include poly-Si or single crystalline silicon. The method may include planarizing the top surfaces of the lower interlayer insulating layer 410 and the bit line contact plug 450. For instance, the planarization process may include an etch-back process or a CMP process.

Referring to FIGS. 1, 8D, 31A, and 31B, a process step of S415 will be described. In the process step of S415 a bit line stack material layer 510a is formed on the resulting structure of the process step of S410. The bit line stack material layer 510a may include a bit line barrier material layer 520a, a bit line electrode material layer 530a, and a bit line capping material layer 540a. The bit line barrier material layer 520a may include barrier metals such as Ti, TiN, Ta, TaN, or TiW. The bit line electrode material layer 530a may include a metal, such as W, Al, or Cu.

Referring to FIGS. 1, 8D, 32A, and 32B, a process step of S420 will be described. In the process step of S420 the bit line stack material layer 510a is patterned to form the bit line stacks 510. The bit line stacks 510 may include a bit line barrier layer 520, a bit line electrode 530, and a bit line capping layer 540. Since the bit line stack 510 extends in a second direction, side surfaces of the bit line stack 510 are illustrated with dotted lines in the longitudinal section views of FIGS. 32A and 32B. The forming the bit line stack 510 may include patterning the bit line stack material layer 510a using photolithography and etching processes.

Referring to FIGS. 1, 8D, 33A, and 33B, process steps of S435 and S440 will be described. In the process step of S435 a bit line spacer material layer (not shown here) is formed on the resulting structure of the process step of S420. For example, the method may include forming silicon nitride using a CVD process to cover the bit line stack 510 and the lower interlayer insulating layer 410. In the process step of S440 bit line spacers 550 are formed by etching back the lower interlayer insulating layer 410. During this process, the bit line structure 500 including the bit line stack 510 and the bit line spacers 550 may be formed.

Referring to FIGS. 1, 2A, 2B, and 8D, process steps of S435 and S440 will be explained. In the process step of S435, an upper interlayer insulating layer 430 covers the bit line structure 500. In the process step of S440 storage contact plugs 650 are formed in the upper interlayer insulating layer 430 and in contact with the storage contact landing pads 370 through contact holes (not shown here) in the lower interlayer insulating layer 410. The upper interlayer insulating layer 430 may be formed using a CVD process. The upper interlayer insulating layer 430 may include silicon oxide.

Hereafter, additional process steps will be explained based on the resulting structure of FIGS. 29A and 29B from the process step of S390 according to some embodiments of the inventive concept. The embodiments differ from each other according to the relative positions of the top surfaces of the landing pads 350 and the exposed gate capping layer 250 after the addition process steps are performed. FIGS. 34A through 36A are cross-sectional views taken along a line illustrating methods of fabricating semiconductor devices according to embodiments of the inventive concept. FIGS. 34B through 36B are cross-sectional views taken along a line II-II' corresponding respectively to FIGS. 34A through 36A.

Figure 29A:
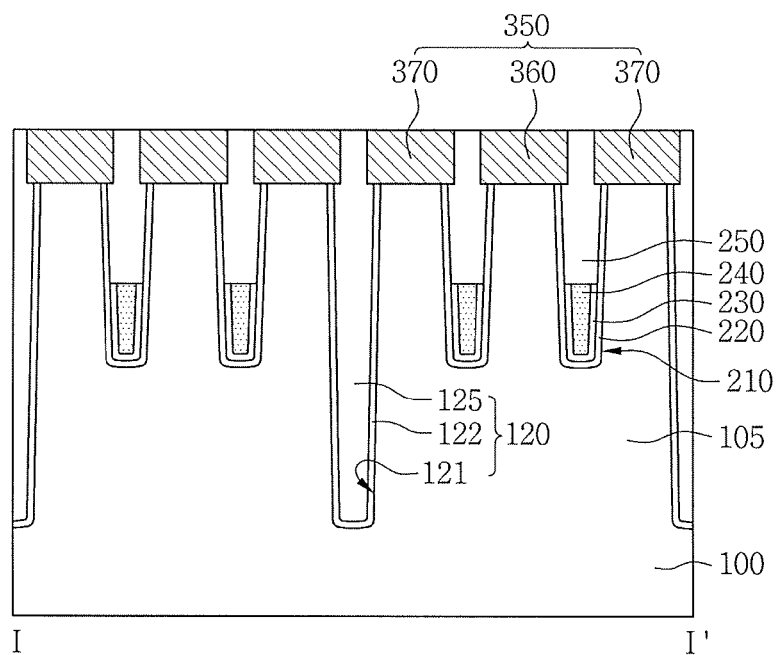
Figure 29B:
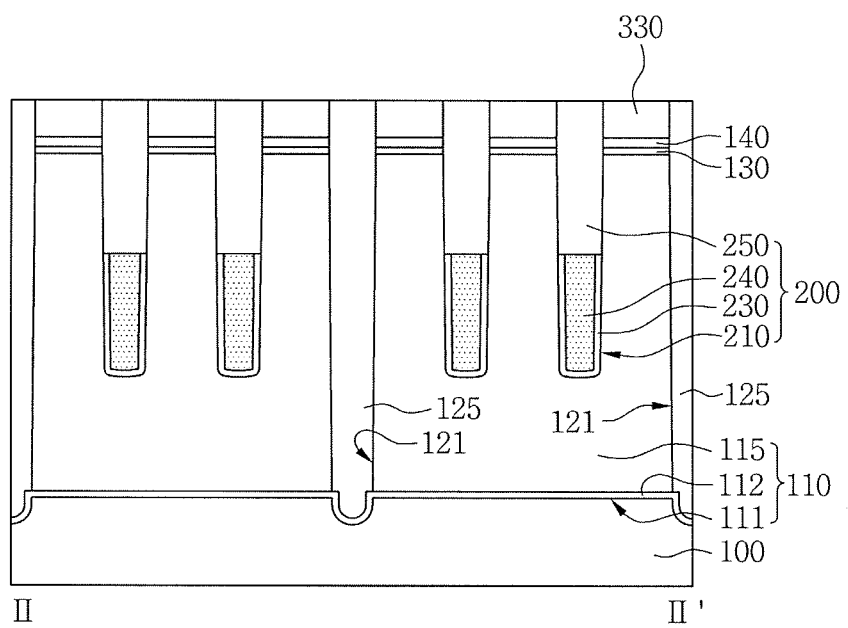

Referring to FIGS. 34A, 34B, 3A and 3B, the exposed gate capping layer 250 of FIGS. 29A and 29B are partially removed so that the top surface of the exposed gate capping layer 250 is positioned between the landing pads 350 according to an embodiment of the inventive concept. The exposed crossing field insulating material 125 of FIGS. 29A and 29B are also partially removed so that the top surface of the exposed crossing field insulating material 125 is positioned between the landing pads 350. For example, the top surfaces of the gate capping layer 250 and the crossing field insulating material 125 may be lower than top surfaces of the landing pads 350 and disposed between side surfaces of the landing pads 350. The top surface of the landing pad insulating layer 330 may be disposed substantially at the same level to the top surface of the crossing field insulating material 125 on the parallel field region 110. The process may include wet etching the gate capping layer 250 and the crossing field insulating material 125 using phosphoric acid.

The process steps S405 through S430 of FIG. 8D is performed based on the resulting structure of FIGS. 29A and 29B from the process step of S390 to form the semiconductor device 20B of FIGS. 3A and 3B. The detailed description of the process steps S405 through S430 was made above, so further description is omitted here.

Referring to FIGS. 35A 35B, 4A and 4B, the exposed gate capping layer 250 of FIGS. 29A and 29B are partially removed so that the top surface of the exposed gate capping layer 250 is positioned to the level of the top surface of the active region 105 according to an embodiment of the inventive concept. The exposed crossing field insulating material 125 of FIGS. 29A and 29B are also partially removed so that the top surface of the exposed crossing field insulating material 125 is positioned to the level of the top surface of the active region 105. For example, the top surfaces of the gate capping layer 250 and the crossing field insulating material 125 may be disposed at substantially the same level to the surface of the active region 105. The top surface of the crossing field insulating material 125 may become lower than that of the pad insulating layer 130 on the parallel field region 110, and the landing pad insulating layer 330 may be removed to expose the pad insulating layer 130.

The process steps S405 through S430 of FIG. 8D is performed based on the resulting structure of FIGS. 29A and 29B from the process step of S390 to form the semiconductor device 20C of FIGS. 4A and 4B. The detailed description of the process steps S405 through S430 was made above, so further description is omitted here. Referring to FIGS. 36A, 36B, 5A and 5B, the exposed gate capping layer 250 of FIGS. 29A and 29B are partially removed so that the top surface of the exposed gate capping layer 250 is positioned below the bottom surfaces of the landing pads 350 according to an embodiment of the inventive concept. The exposed crossing field insulating material 125 of FIGS. 29A and 29B are also partially removed so that the top surface of the exposed crossing field insulating material 125 is positioned below the bottom surfaces of the landing pads 350. For example, the top surface of the gate capping layer 250 and the crossing field insulating material 125 may be recessed below the bottom surfaces of the landing pads 350. The top surface of the crossing field insulating material 125 may be recessed below the top surface of the parallel field insulating material 115 of the parallel field region 110.

The process steps S405 through S430 of FIG. 8D is performed based on the resulting structure of FIGS. 29A and 29B from the process step of S390 to form the semiconductor device 20D of FIGS. 5A and 5B. The detailed description of the process steps S405 through S430 was made above, so further description is omitted here.

Figure 30A:
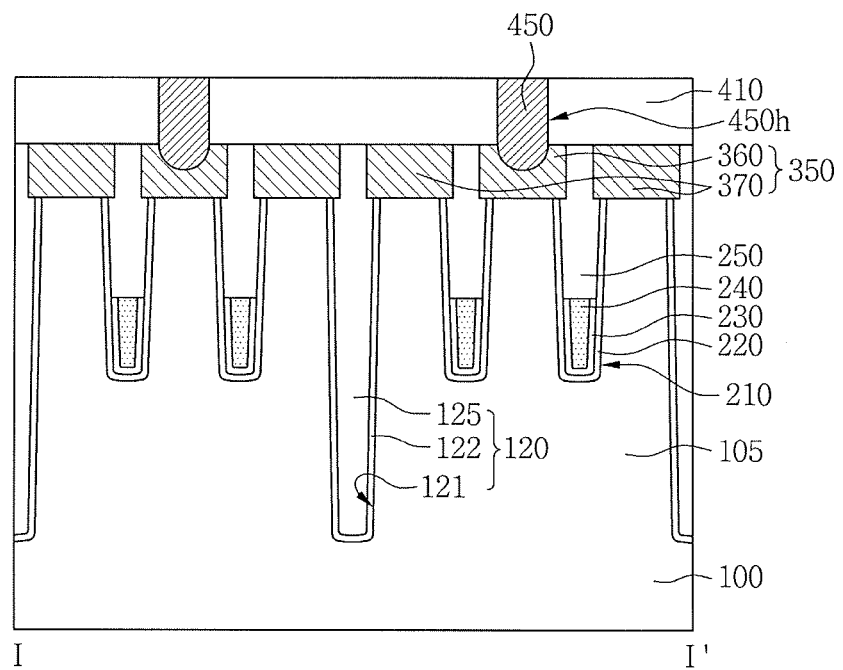
Figure 30B:
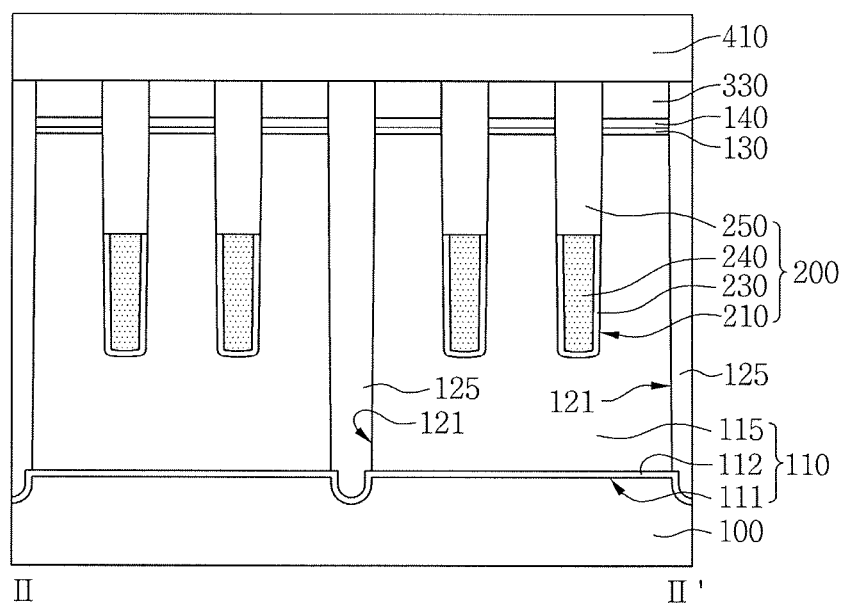
Figure 31A:
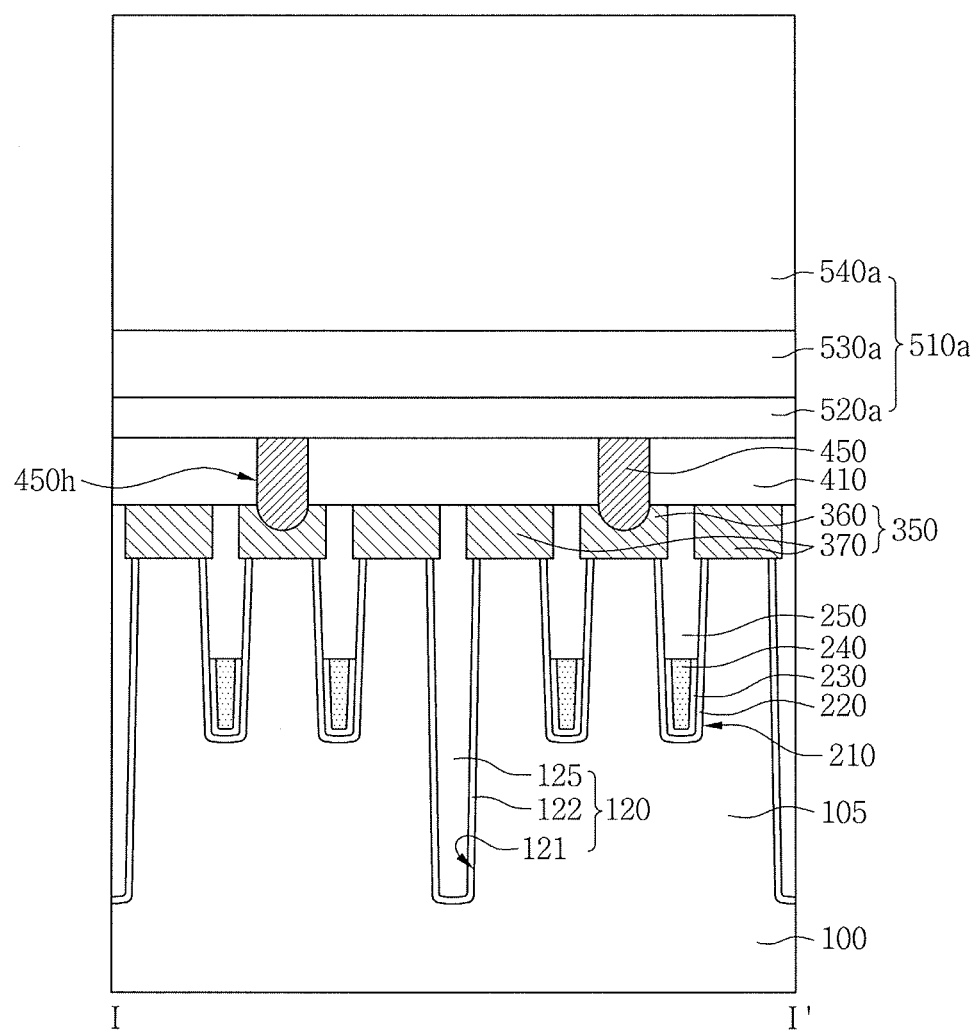
Figure 31B:
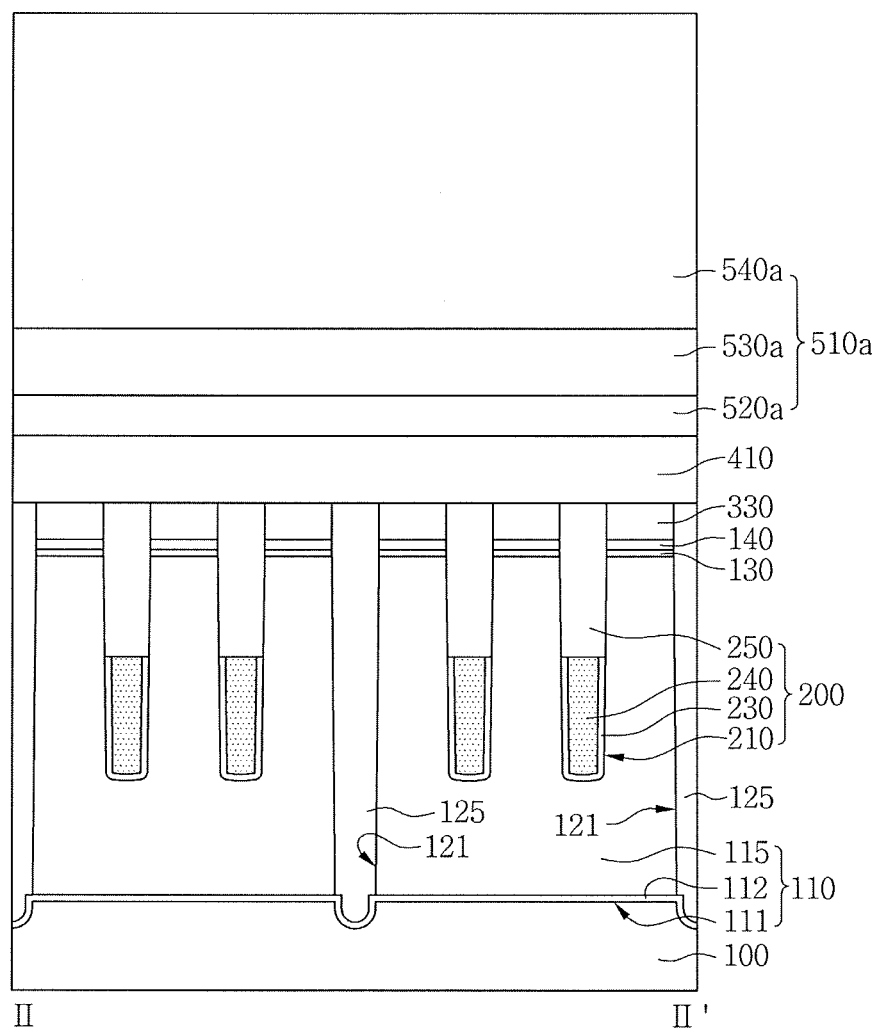
Figure 32A:
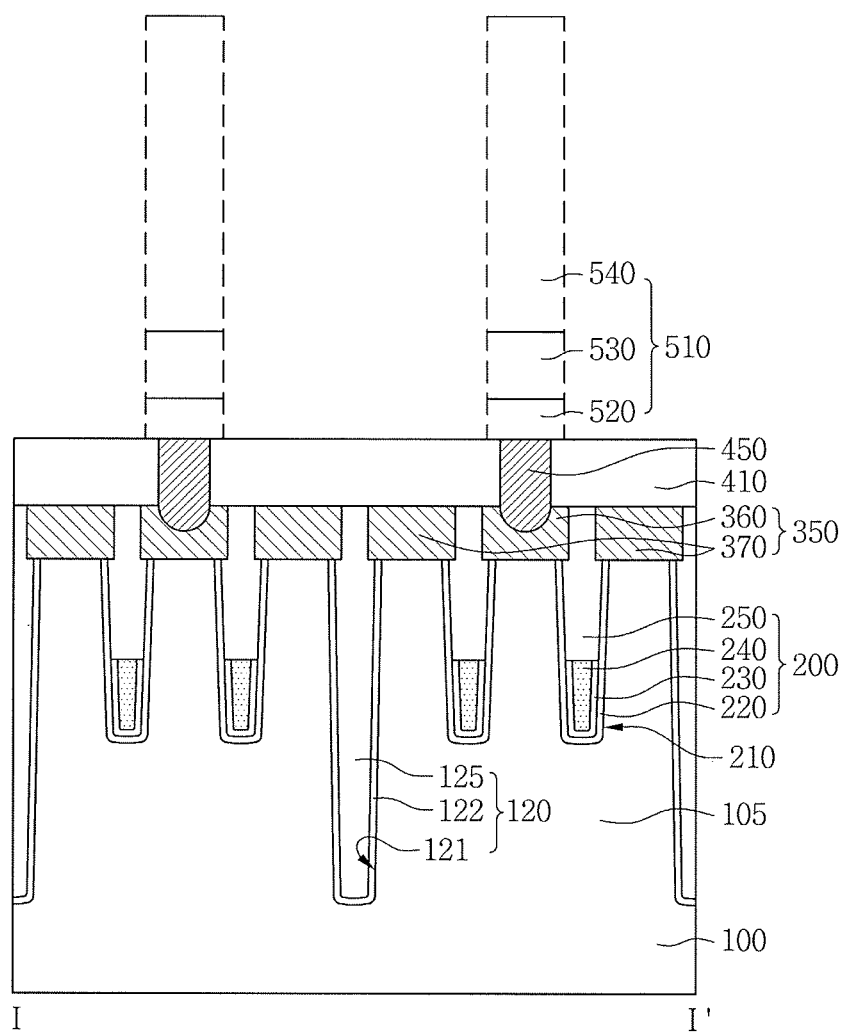
Figure 32B:
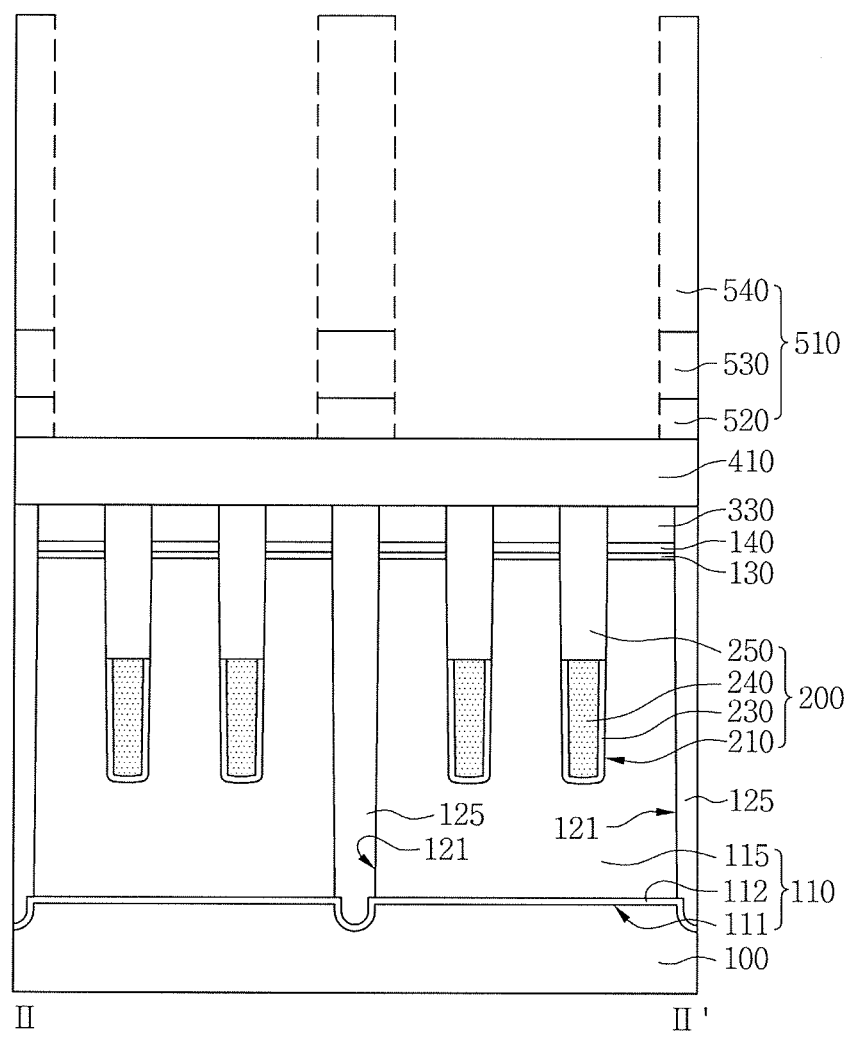
Figure 33A:
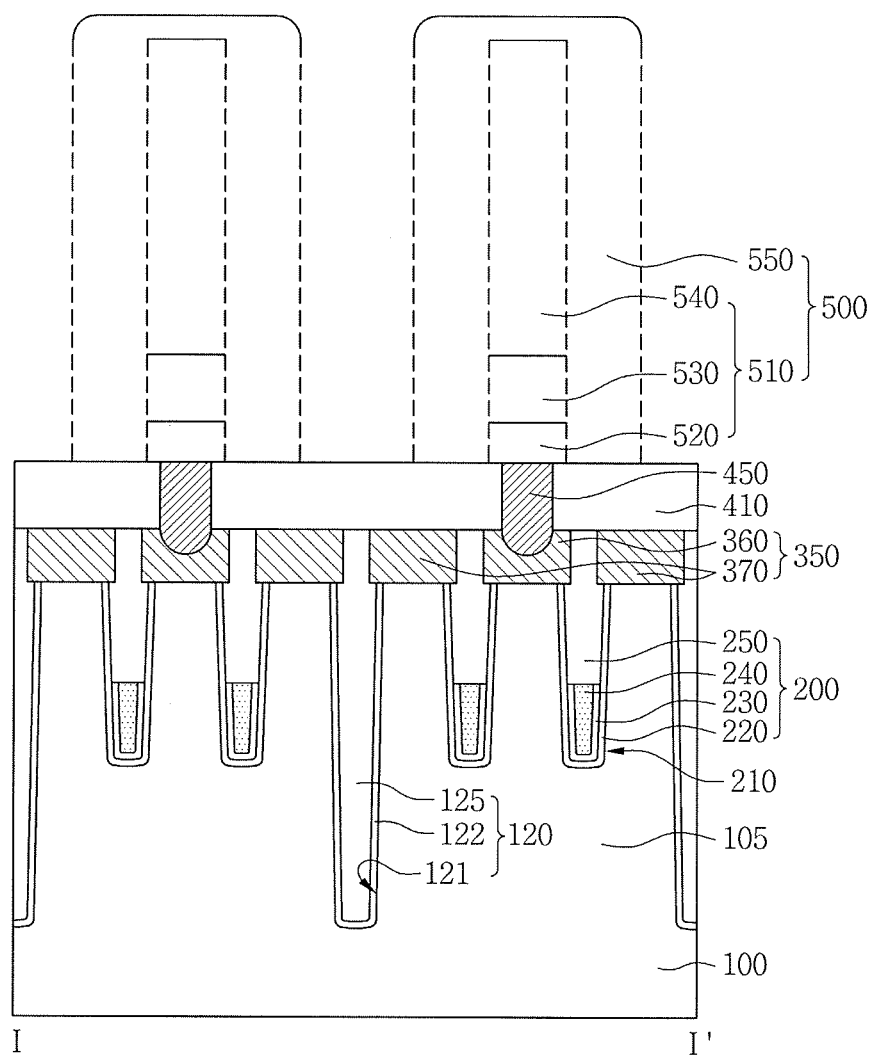
Figure 33B:
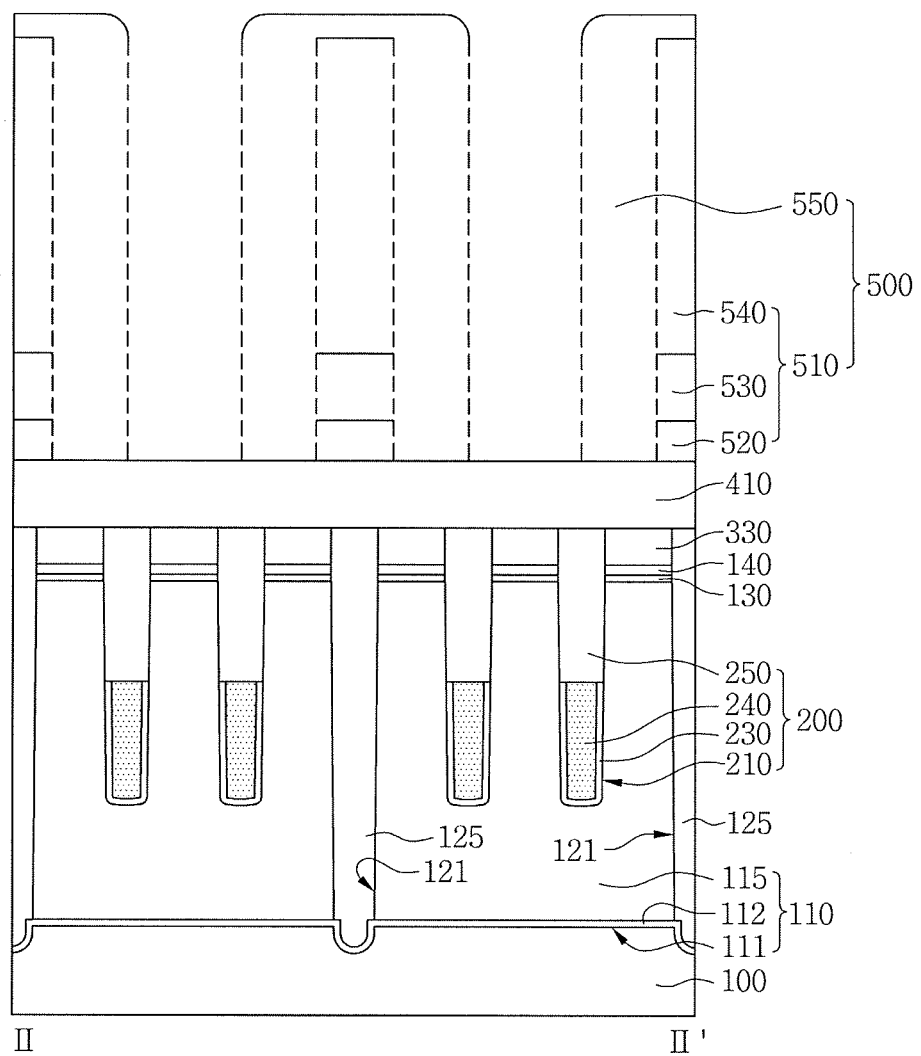
Figure 34A:
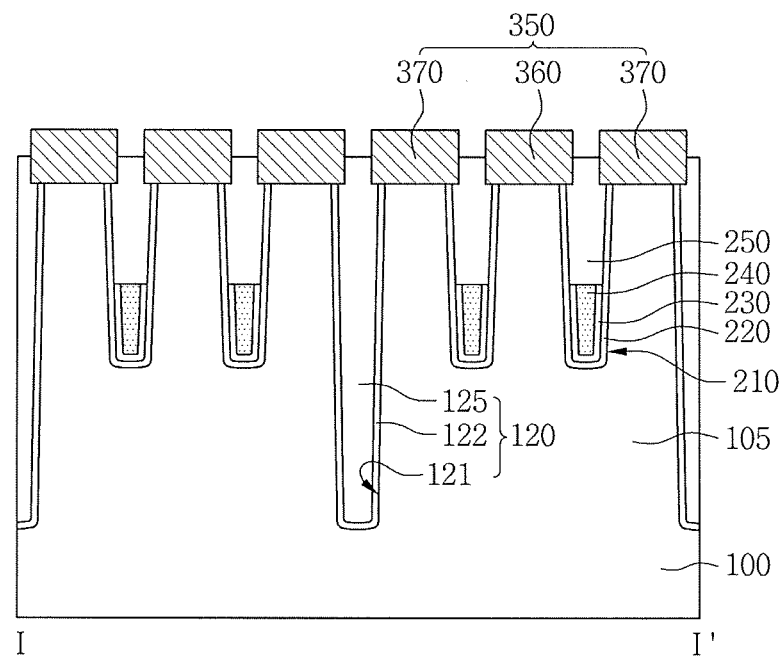
Figure 34B:
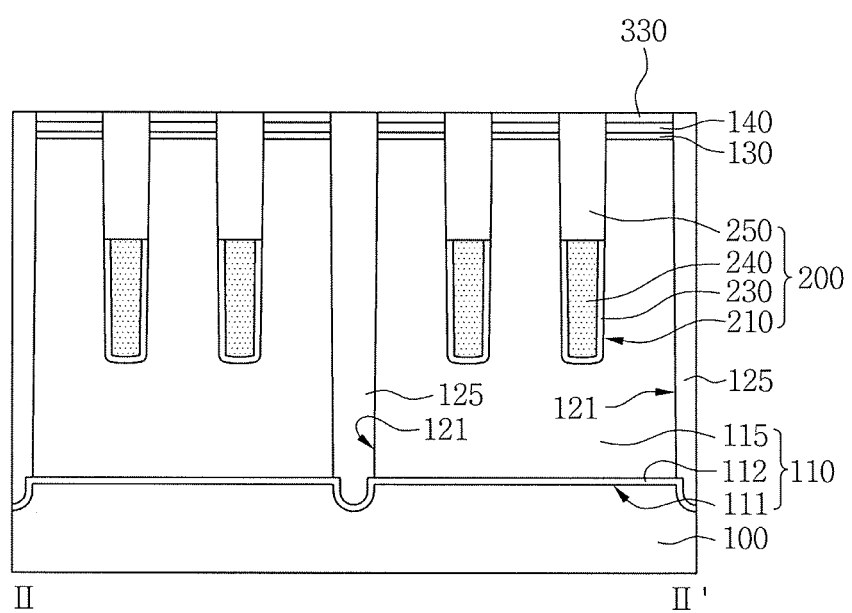
Figure 35A:
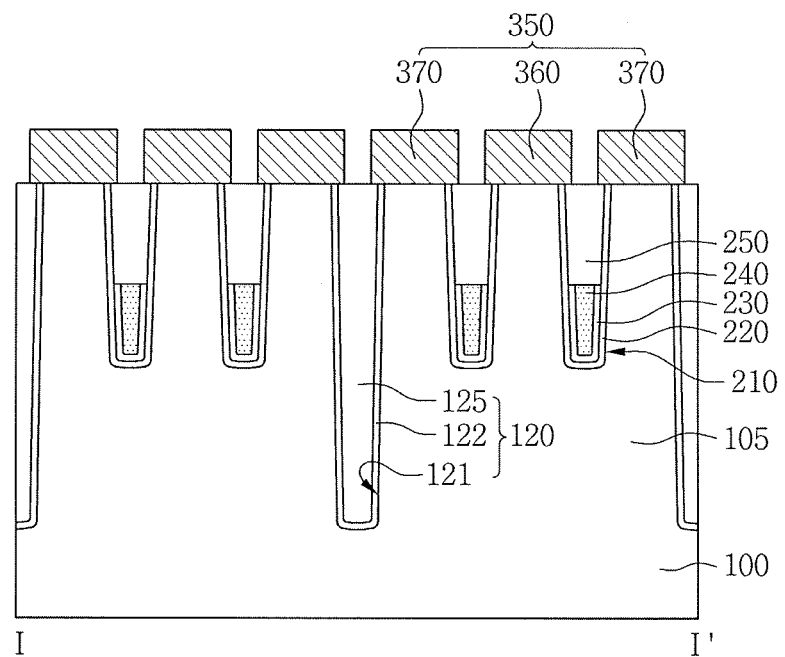
Figure 35B:
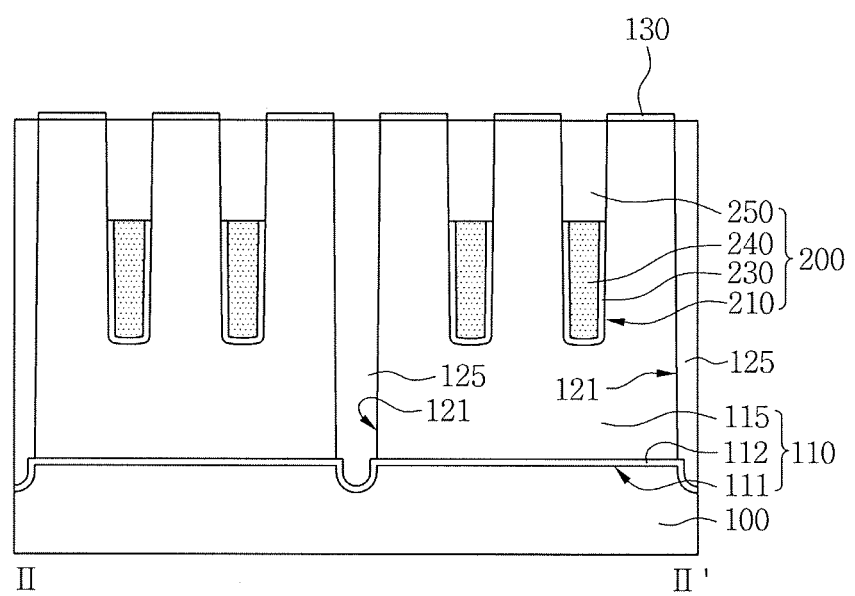
Figure 36A:
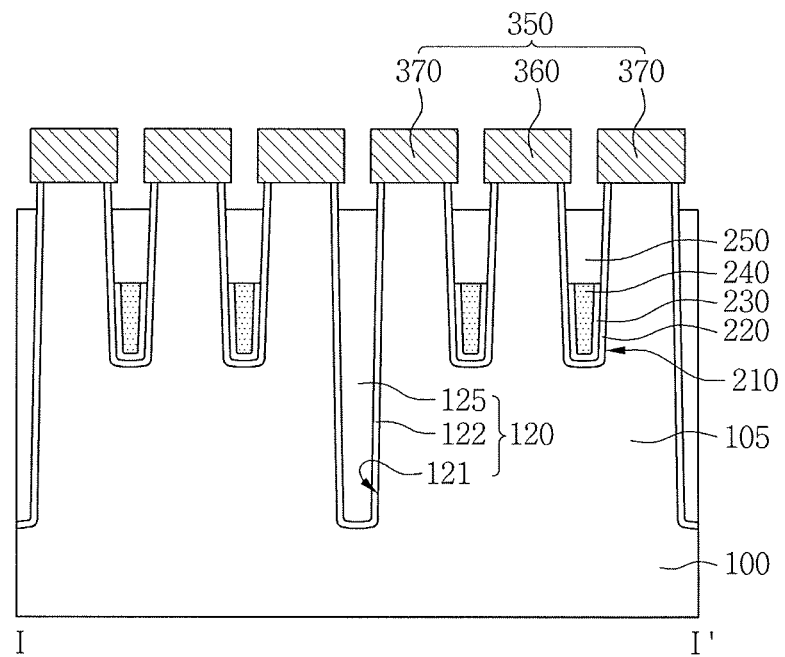
Figure 36B:
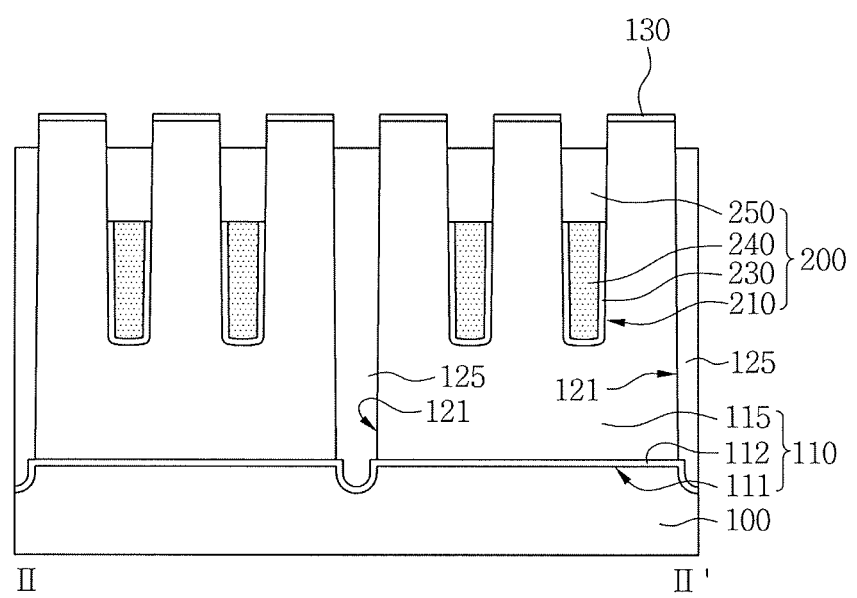

Hereafter, additional process steps will be explained based on the resulting structure of FIGS. 30A and B from the process step of S410 according to an embodiment of the inventive concept. This embodiment includes a different structure of a bit line barrier material layer 520a from other embodiment after the additional process steps are performed.

Figure 37:
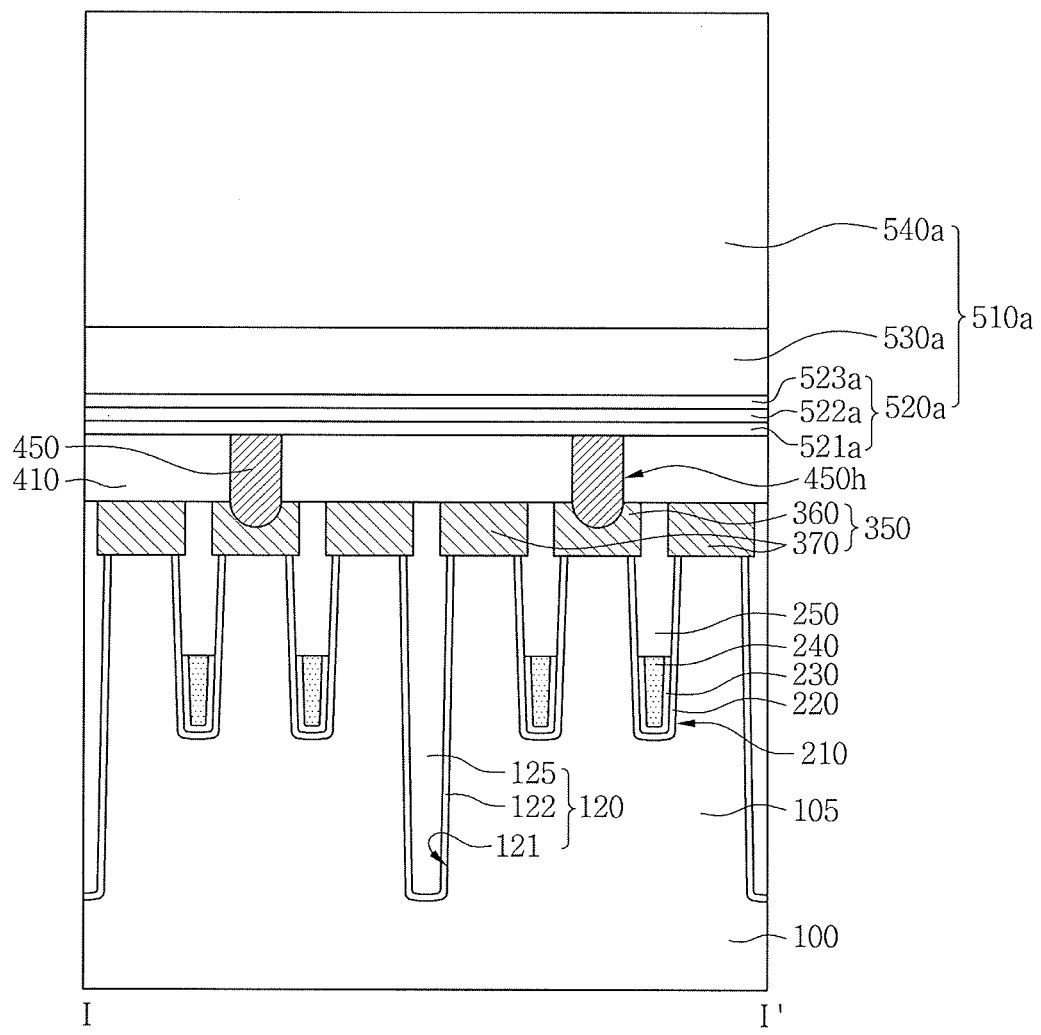
FIG. 37 is a cross-sectional view taken along lines I-I' of FIG. 1, illustrating methods of fabricating semiconductor devices according to embodiments of the inventive concept.

Referring to FIGS. 37 and 6B, a bit line barrier material layer 520a includes a multilayered structure after the additional process steps are performed. The additional process steps are substantially the same those of the process step S415 except that the bit line barrier material layer includes a multilayered structure. For example, forming the bit line material layer 520a may include forming a lower metal silicide material layer 521a, forming a barrier metal material layer 522a, and forming an upper metal silicide material layer 523a. The lower metal silicide material layer 521a may include various metal silicides, such as WSi, TiSi, CoSi, or NiSi. The barrier metal material layer 522a may include Ti, TiN, Ta, TaN, TiW, or various other barrier metals. The upper metal silicide material layer 523a may include various metal silicides, such as WSi, TiSi, CoSi, or NiSi. For example, the lower metal silicide material layer 521a may include the same materials as the upper metal silicide material layer 523a. In an embodiment, the upper metal silicide material layer 523a may be omitted. Subsequently, the process steps of S420 through 430 of FIG. 8D described with reference to FIGS. 32A, 32b, 33A, and 33B may be performed. For example, the semiconductor device 20F described with reference to FIG. 6B may be formed.

In a method of fabricating a semiconductor device according to an embodiment of the inventive concept, a gate structure 200 and a crossing field region 120 may be formed using separate processes. For example, when the gate trench 210 and the crossing field trench 121 are formed using the same process, a gate insulating layer 220, a gate barrier layer 230, and a gate electrode 240 may be formed within the crossing field trench 121.

Since the gate insulating layer 220, the gate barrier layer 230, and the gate electrode 240 formed within the crossing field trench 121 are electrically inactive dummy patterns or unnecessary conductive components, they may have detrimental effects on processes or electrical properties. Also, since the consumption of expensive metal materials increases, processing costs may increase. Accordingly, the method of fabricating the semiconductor device according to the embodiment of the inventive concept may reduce the fabrication cost of semiconductor devices.

In the method of fabricating the semiconductor device according to an embodiment of the inventive concept, since the crossing field trench 121 may be formed without a photolithography process, processing costs may be reduced. In addition, since the crossing field trench 121 may be formed using a self-aligned process, the crossing field trench 121 may be symmetrically formed between the gate structures 200 without causing misalignment due to the photolithography process.

In the method of fabricating the semiconductor device according to an embodiment of the inventive concept, the landing pads 350 including single crystalline silicon may be formed using a self-alignment process. As a result, the resistance of contact structures may be reduced.

In the method of fabricating the semiconductor device according to an embodiment of the inventive concept, the landing pads 350 may be in sufficient contact with the substrate 100 without compromising the isolation of the landing pads by the gate capping layers 250 and crossing field insulating materials 125.

Figure 38A:
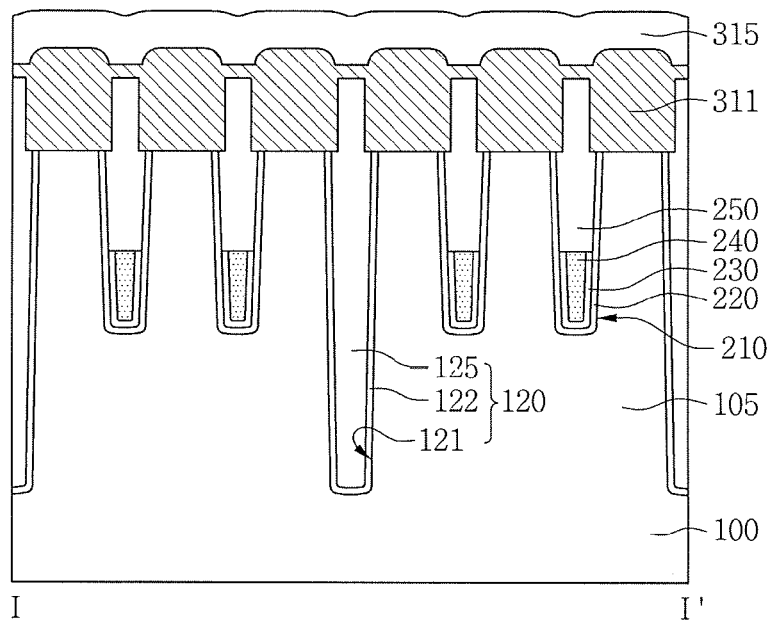
Figure 38B:
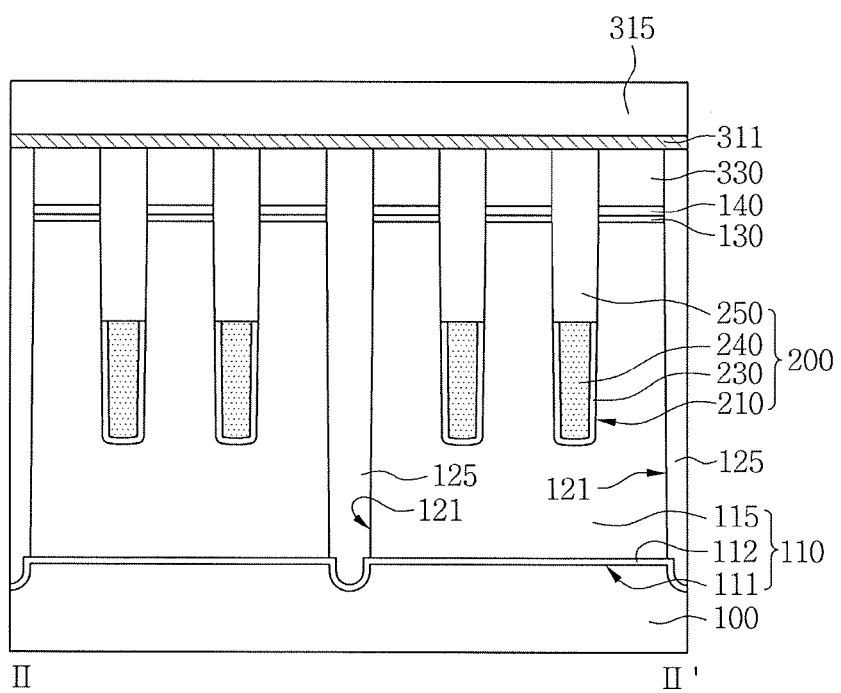

According to an embodiment of the inventive concept, the process steps of FIGS. 8A through 8D further includes an additional process step for preventing or alleviating CMP (Chemical Mechanical Process) dishing effects in the process step of S390 including a CMP process. Referring to FIGS. 38A and 38B, a capping silicon layer 315 is formed on the resulting structure of FIGS. 28A and 28B from the process step of S380. After forming the capping silicon layer 315, the process step of S390 described with reference to FIGS. 29A and 29B may be performed.

Figure 39A:
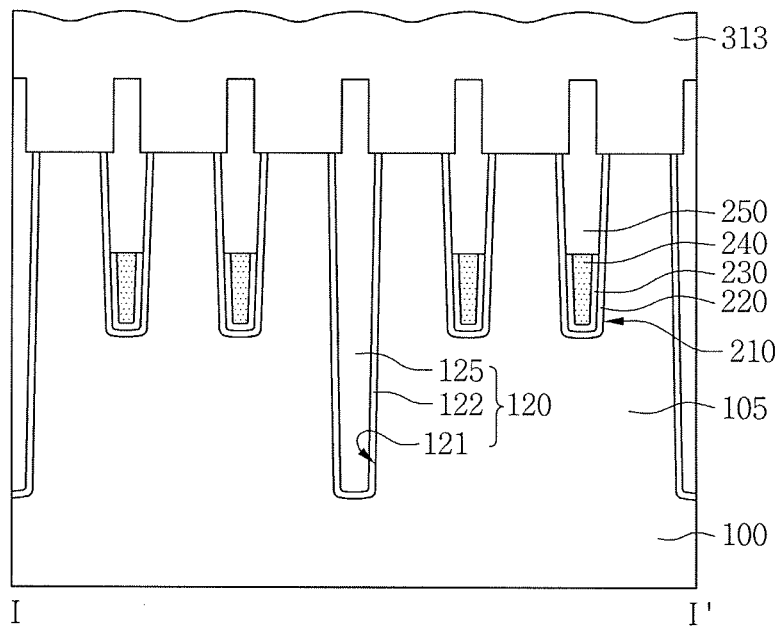
Figure 39B:
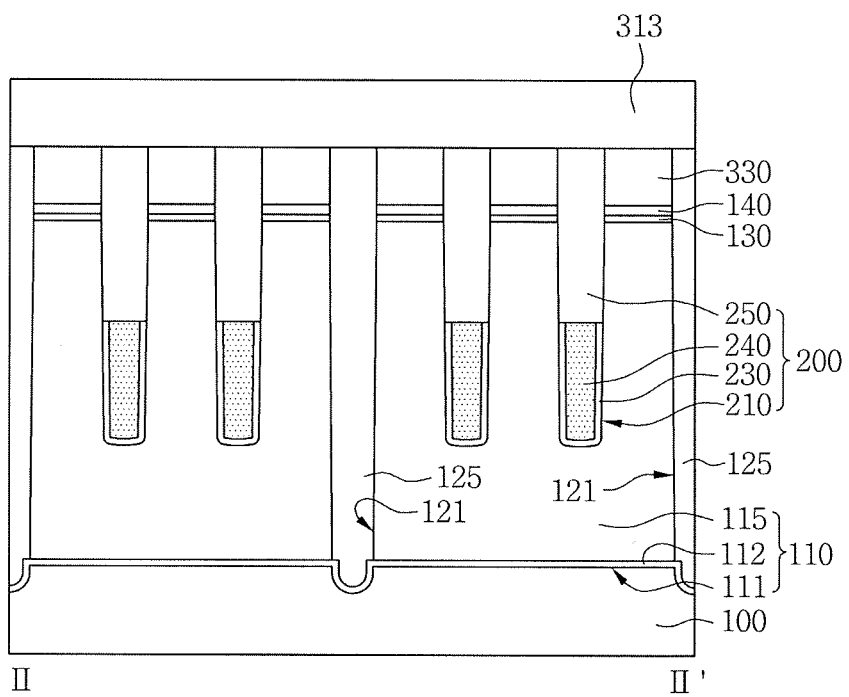

According to an embodiment of the inventive concept, the process steps of FIGS. 8A through 8D applies in substantially the same way except for the process step S380. Referring to FIGS. 39A and 39B, a poly-Si layer 313 is formed on the resulting structure of FIGS. 27A and 27B from the process step of 370. The poly-Si layer 313 may fill spaces between the gate capping layers 250 in direct contact with the surface of the substrate 100. To pattern the poly-Si layer 313 the process step of S390 is performed based on the poly-Si layer 313.

FIGS. 40A through 42A are cross-sectional views taken along a line I-I' of FIG. 1 illustrating a method of a fabricating a semiconductor device according to an embodiment of the inventive concept. FIGS. 40B through 42B are cross-sectional views taken along a line II-II' of FIG. 1 illustrating a method of a fabricating a semiconductor device according to an embodiment of the inventive concept.

Figure 20A:
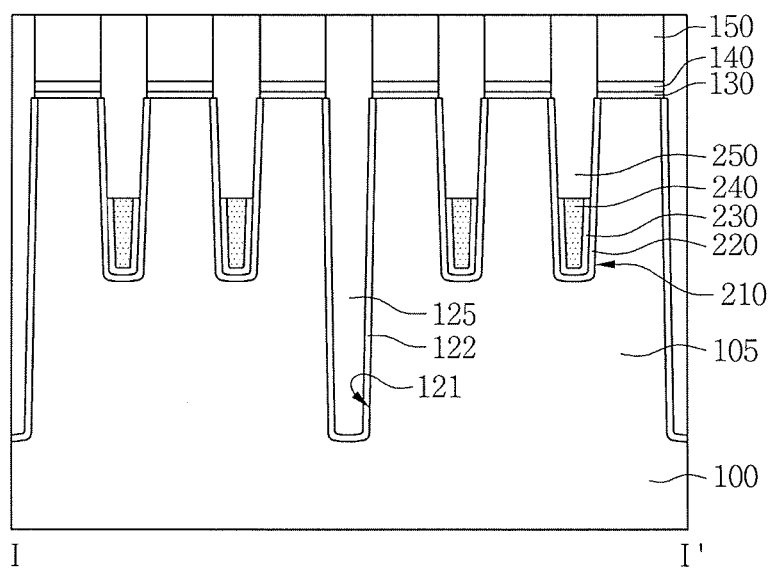
Figure 20B:
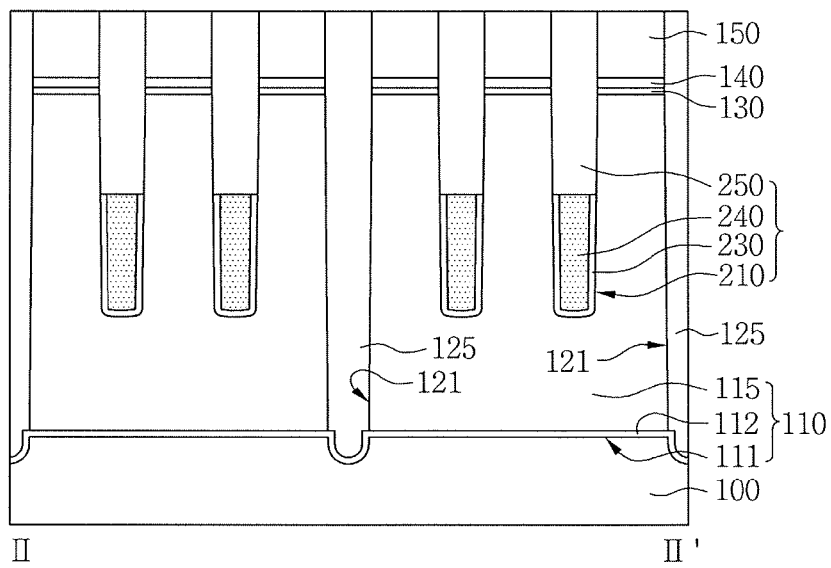
Figure 40A:
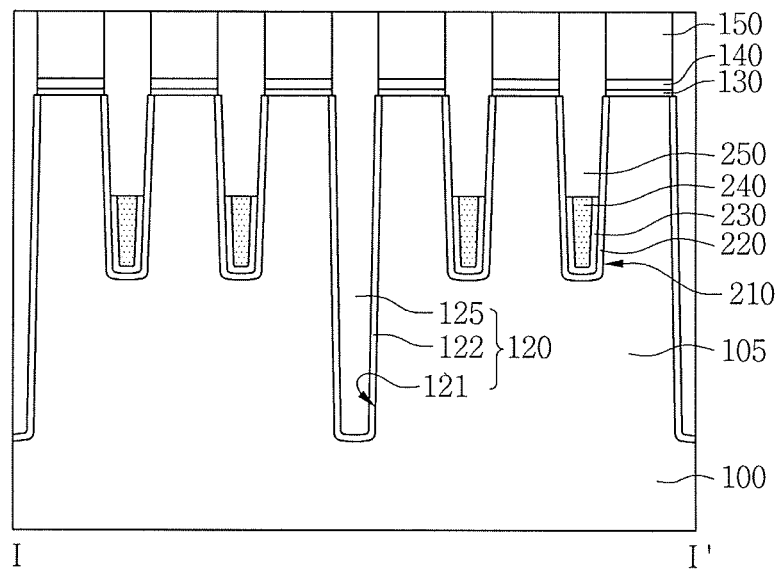
Figure 40B:
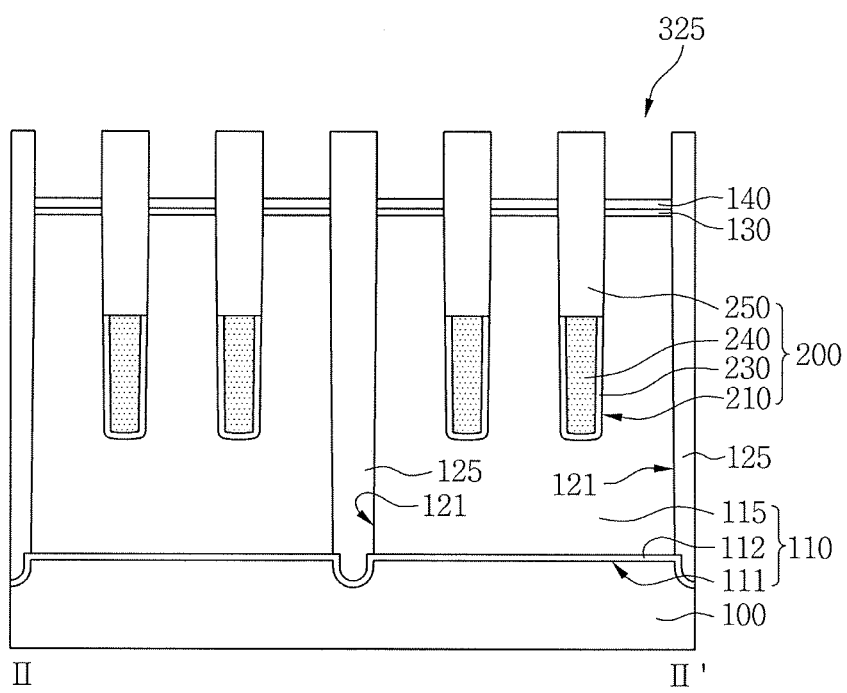

Referring to FIGS. 1, 40A, and 40B, landing pad trenches 325 are formed on the parallel field region 110 by removing the gate mask pattern 150 from the resulting structure of FIGS. 20A and 20B from the process step of S235. The landing pad trench 325 may expose portions of side surfaces of the crossing field insulating material 125 and the gate capping layer 250 crossing the buffer insulating layer 140 and the parallel field region 110 disposed on the parallel field region 110.

Figure 41A:
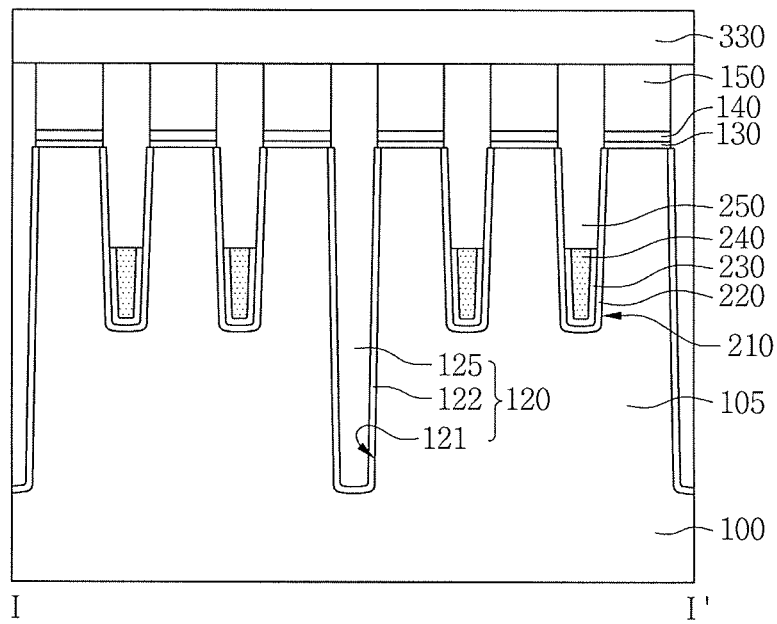
Figure 41B:
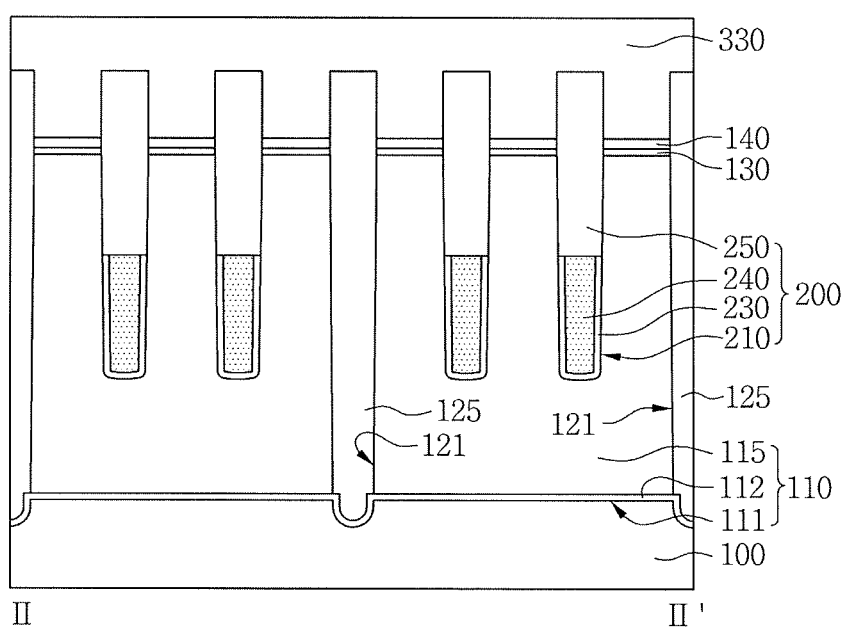

Referring to FIGS. 41A and 41B, a landing pad insulating layer 330 overfills the landing pad trench 325. The landing pad insulating layer 330 may cover the exposed surfaces of the gate mask pattern 150, the gate capping layer 250, and the crossing field insulating material 125.

Figure 42A:
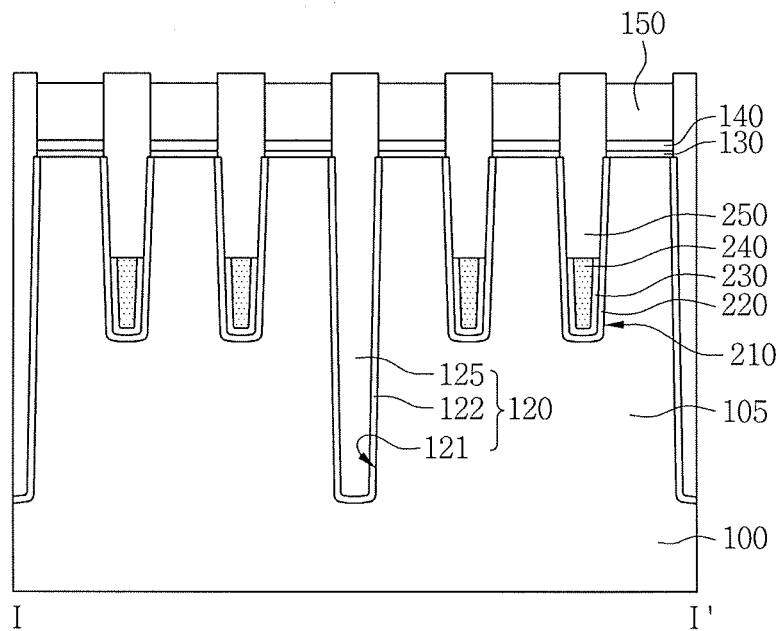
Figure 42B:
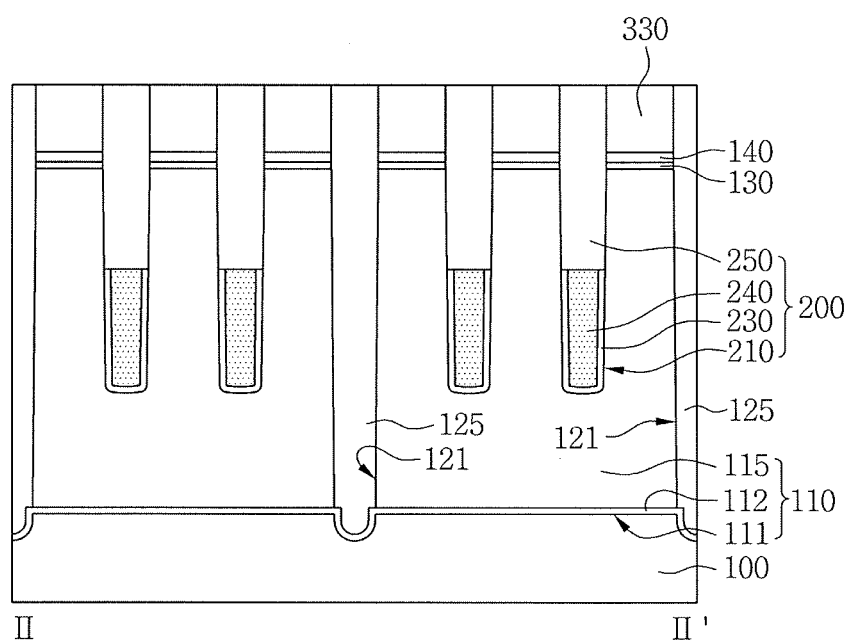

Referring to FIGS. 42A and 42B, the landing pad insulating layer 330 disposed over the parallel field region 110 are removed to the level of the top surface of the gate capping layer 250. The top surfaces of the landing pad insulating layer 330, the gate capping layer 250, and the crossing field insulating material 125 may be substantially planarized. The top surface of the gate mask pattern 150 disposed over the active region 105 may become lower than that of the gate capping layer 250.

The method of fabricating the semiconductor device according to one embodiment of the inventive concept may include performing the process steps S370 through S430 described with reference to FIGS. 26A through 33A and 26B through 33B. In the present embodiment, the processes of forming (S310) and removing the sacrificial layer 320 (S350) may be omitted.

Figure 43A:
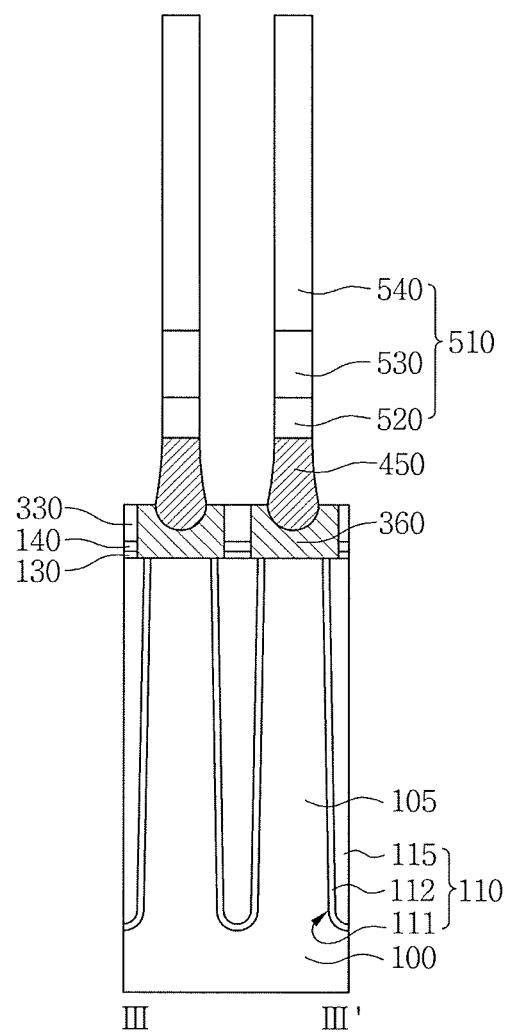
FIGS. 43A and 43B are cross-sectional views taken along direction III-III' of FIG. 1, illustrating methods of fabricating semiconductor devices according to embodiments of the inventive concept.

FIGS. 43A and 7A are cross-sectional views taken along a line of FIG. 1, illustrating a method of fabricating a semiconductor device 20G according to an embodiment of the inventive concept.

FIG. 43A shows a resulting structure of the process step S420 for forming the bit line stacks 510. The bit line stacks 510 are patterned from the bit line stack material layer 510a of FIGS. 31A and 31B. The side surfaces of the bit line contact plug 450 may be tapered. The upper side surfaces of the bit line contact plug 450 may be vertically aligned with the side surfaces of the bit line stack 510. The process step of S420 was described in detail with reference to FIGS. 32A and 32B, so further descriptions are omitted here.

Referring to FIG. 7A, the tapered side surfaces of the bit line contact plug 450 are oxidized to form a protection layer 451 between the process step of S420 for forming the bit line stacks 510 and the process step of S425 for forming the bit line spacers 550. In the process step of S425, the bit line stacks 510 are covered with bit line spacers 550 to form bit line structures 500. The process step of S425 for forming the bit line spacers 550 was described in detail with reference to FIGS. 33A and 33B, so further description is omitted here.

Figure 43B:
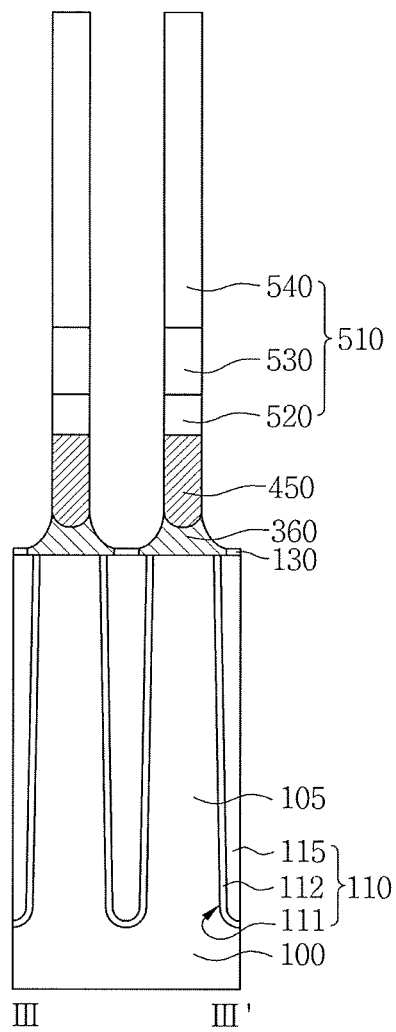

FIGS. 43B and 7B are a cross-sectional view taken along a line of FIG. 1, illustrating a method of fabricating a semiconductor device 20H according to an embodiment of the inventive concept.

FIG. 43B shows a resulting structure of the process step S420 for forming the bit line stacks 510. The bit line stacks 510 are patterned from the bit line stack material layer 510a of FIGS. 31A and 31B. In the process step S420, the bit line stack material layer 510 is overetched so that the contact landing pads 360 is partially removed to have tapered side surfaces. Upper side surfaces of the bit line contact landing pads 360 may be vertically aligned with side surfaces of the side surfaces of the bit line contact plugs 450. The process may include partially or wholly removing the landing pad insulating layer 330 between adjacent bit line contact landing pads 360. For example, the buffer insulating layer 140, the pad insulating layer 130, or the parallel field insulating material 125 may be exposed. In FIG. 43B, it is assumed that the pad insulating layer 130 is exposed.

Referring to FIG. 7B, the exposed side surfaces of the bit line contact plugs 450 and the bit line contact landing pads 360 are oxidized to form a protection layer 451 between the process step of S420 for forming the bit line stacks 510 and the process step of S425 for forming the bit line spacers 550. In the process step of S425, the bit line stacks 510 are covered with bit line spacers 550 to form bit line structures 500. The process step of S425 for forming the bit line spacers 550 was described in detail with reference to FIGS. 33A and 33B, so further descriptions are omitted here.

Figure 44A:
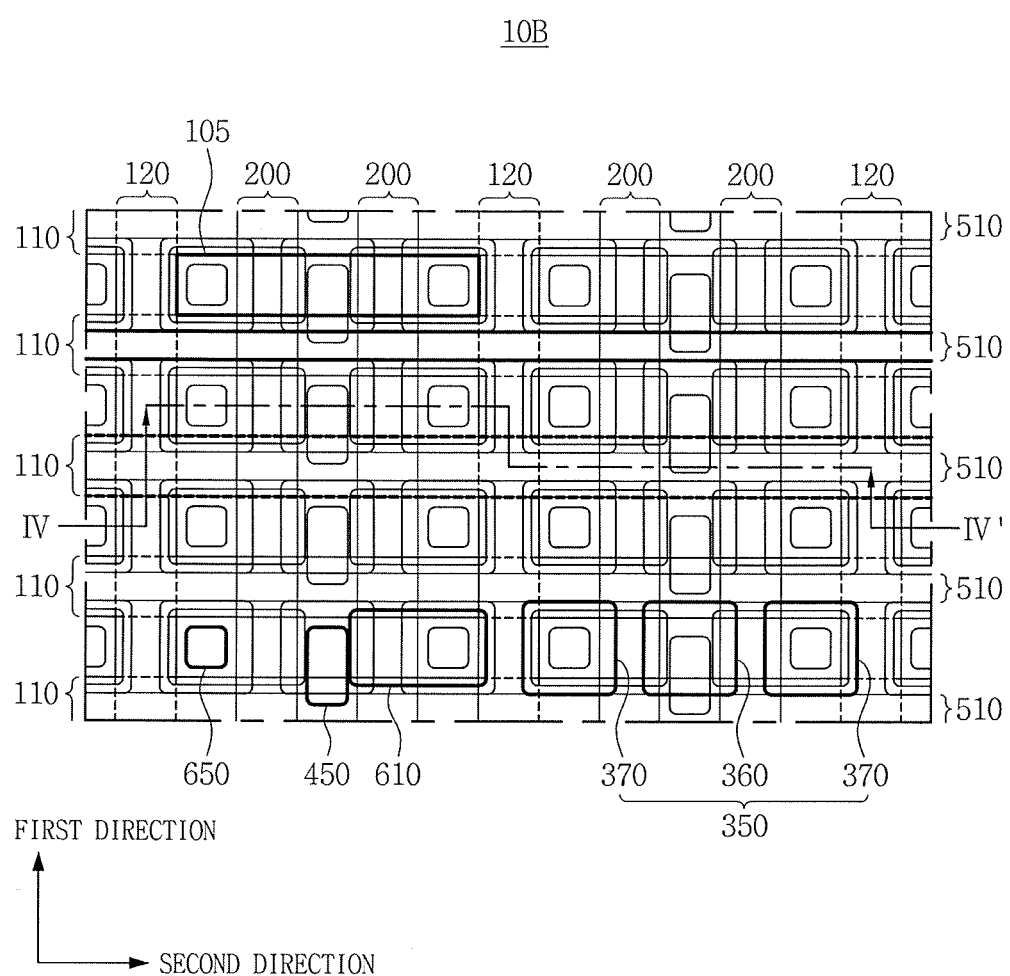
FIGS. 44A and 44B are schematic layouts of semiconductor devices according to embodiments of the inventive concept.
Figure 44B:
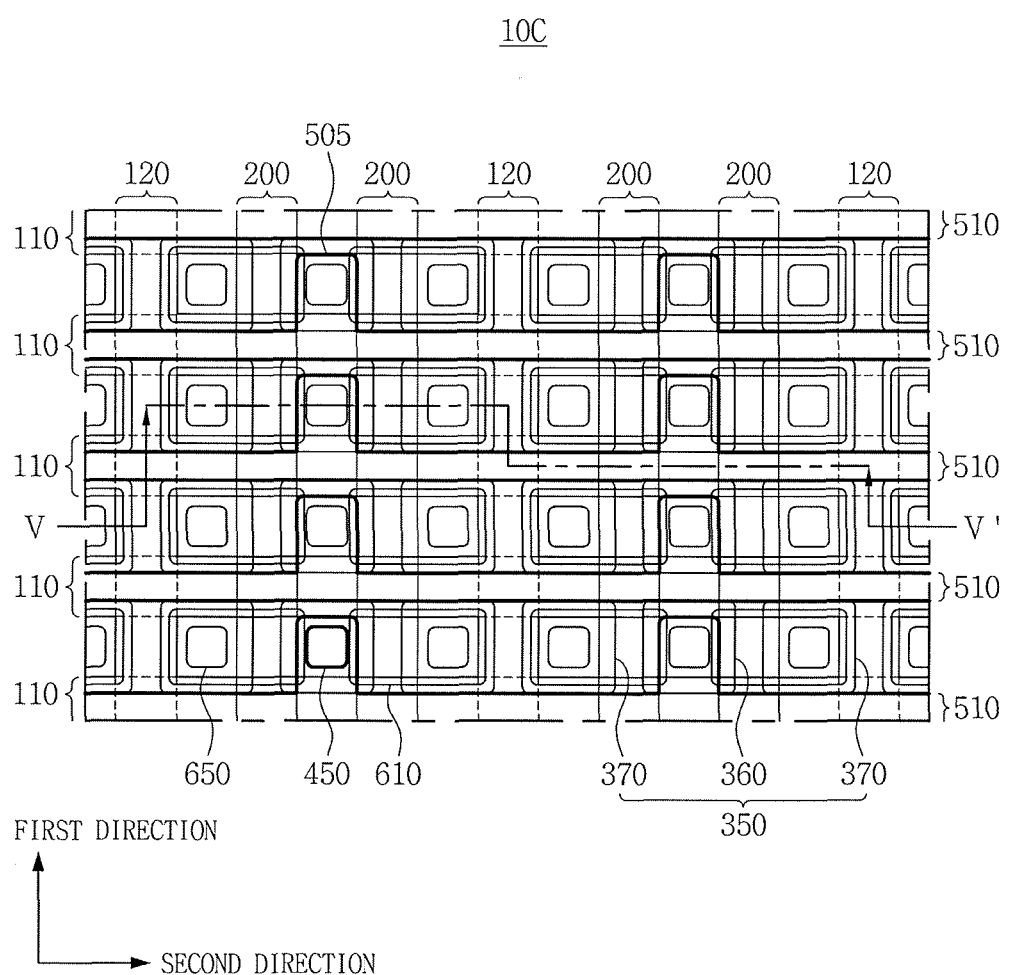

FIGS. 44A and 44B are schematic layouts of semiconductor devices according to embodiments of the inventive concept. FIGS. 45A through 45F are cross-sectional views taken along a line IV-IV' of FIG. 44A, and FIGS. 46A through 46F are cross-sectional views taken along a line V-V' of FIG. 44B.

Referring to FIG. 44A, a semiconductor device 10B according to an embodiment of the inventive concept may include parallel field regions 110 and crossing field regions 120, which may define active regions 105, gate structures 200 disposed parallel to the crossing field regions 120 to run across over active regions 105, and landing pads 350 overlapping the active regions 105. Each of the landing pads 350 may include a bit line contact landing pad 360 and two storage contact landing pads 370. Bit line contact plugs 450 may be disposed on the bit line contact landing pads 360, and storage contact plugs 650 may be disposed on the storage contact landing pads 370. A semiconductor device 10B may further include bit line stacks 510 extending in a second direction. The semiconductor device 10B may further include storage electrodes 610 disposed on the storage contact plugs 650.

The parallel field regions 110 may extend parallel to one another in the same direction as the active regions 105 extend. For example, the parallel field regions 110 may be disposed parallel to one another. The active regions 105 are disposed in repetition between the parallel field regions 110 in the first direction. The active regions 105 are also disposed in repletion in the second direction. The crossing field regions 120 may extend in a straight shape in the first direction. The parallel field regions 110 may cross the crossing field regions 120.

The active regions 105 may have bar shapes defined by the parallel field regions 110 and the crossing field regions 120. For example, the parallel field regions 110 may define short sides of the active regions 105. The crossing field regions 120 may define long sides of the active regions 105. In the present embodiment, the terms "parallel" and "crossing" are defined according to the direction in which the active regions 105 are elongated. For instance, the parallel field regions 110 may extend in the same direction as a direction in which the active regions 105 are elongated, and the crossing field regions 120 may extend in a direction vertically crossing the direction in which the active regions 105 are elongated.

Two buried gate structures 200 may vertically cross one active region 105 in the substrate and extend in the first direction. Landing pads 350 may be formed on the active regions 105 isolated and defined by the gate structures 200. For instance, the bit line contact landing pads 360 may be formed on the active regions 105 between the two gate structures 200. The storage contact landing pads 370 may be formed on the active regions 105 between the gate structures 200 and the crossing field region 120.

The bit line contact plugs 450 may be disposed on the bit line contact landing pads 360. The bit line contact plugs 450 may partially overlap the bit line contact landing pads 360. The bit line contact plugs 450 may be elongated or protrude toward the bit line stack 510 to overlap. The bit line stack 510 may partially overlap the bit line contact plugs 450 and extend in the second direction. The bit line stack 510 may be disposed over the parallel field regions 110. The bit line stack 510 may vertically cross the crossing field regions 120. The storage contact plugs 650 may be disposed on the storage contact landing pads 370. The storage electrode 610 may be disposed on the storage contact plug 650 and be elongated in the second direction.

Referring to FIG. 44B, the semiconductor device 10C according to an embodiment of the inventive concept may include a bit line stack 510 having a padding unit 505 protruding toward the bit line contact plug 450. For example, the bit line contact plug 450 may not be elongated or protrude toward the bit line stack 510 and have a geometrically symmetric shape.

Figure 45A:
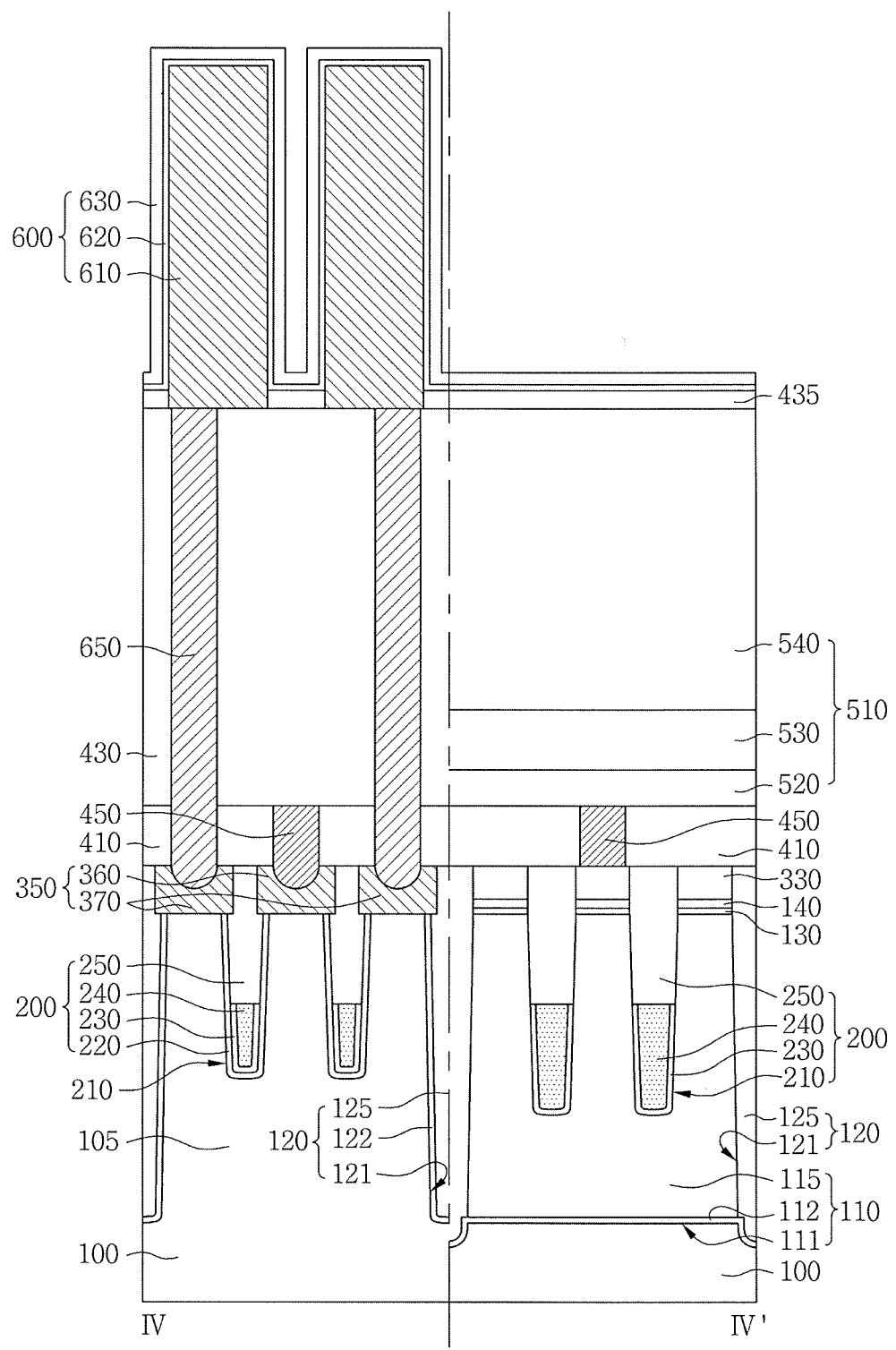
FIGS. 45A through 45F are cross-sectional views taken along line IV-IV' of FIG. 44A.

Referring to FIGS. 44A and 45A, a semiconductor device 30A according to an embodiment of the inventive concept includes parallel field regions 110 and crossing field regions 120 formed in a substrate 100 to define active regions 105. The crossing field regions 120 include crossing field insulating materials 125. Gate structures 200 including gate capping layers 250 are formed in the substrate 100 to cross the active regions 105 and the parallel field regions 110. Bit line contact landing pads 360 and storage contact landing pads 370 are formed on the substrate 100. Bit line contact plugs 450 are formed on the bit line landing pads 360. Bit line structures 500 are formed on the bit line contact plugs 450. Storage contact plugs 650 are formed on the storage contact landing pads 370, and storage structures 600 are formed on the storage contact plugs 650. Top surfaces of the landing pads 350, the gate capping layers 250, and/or the crossing field insulating materials 125 may be disposed at substantially the same level or similar levels.

The bit line contact plugs 450 are in contact with a landing pad insulating layer 330 on the parallel field region 110. For example, portions of the bit line contact plugs 450 are formed on a top surface of the landing pad insulating layer 330. The portions of the bit line contact plugs 450 are in contact with a top surface and/or side surfaces of the landing pad insulating layer 330.

The storage contact plugs 650 are disposed on the storage contact landing pads 370. The storage contact plugs 650 are formed in the upper interlayer insulating layer 430 and the lower interlayer insulating layer 410. The storage contact plugs 650 may have rounded ends which are protruding downward from the top surfaces of the storage contact landing pads 370. For instance, the surfaces of the storage contact landing pads 370 that contact the bottom ends of the storage contact plugs 650 may be recessed. Accordingly, lower portions of side surfaces of the storage contact plugs 650 are in contact with the storage contact landing pads 370. The storage contact plugs 650 may include a conductive material. For instance, the storage contact plugs 650 include doped silicon, a metal silicide, or a metal.

The storage structures 600 include storage electrodes 610, a storage dielectric layer 620, and a plate electrode 630. The storage electrodes 610 are formed over the upper interlayer insulating layer 430 and connected to the storage contact plugs 650. The storage electrodes 610 may include a conductive material. For instance, the storage electrodes 610 include doped silicon, a metal silicide, or a metal. A storage dielectric layer 620 may be formed conformally on the storage electrodes 610. The storage dielectric layer 620 may extend above the upper interlayer insulating layer 430. The storage dielectric layer 620 may include a dielectric material, such as a metal oxide, silicon nitride, or silicon oxide. For example, the storage dielectric layer 620 may include a metal oxide, such as hafnium oxide or tantalum oxide, or various high-k dielectric materials. Like numerals may refer to like elements and any further descriptions with respect to the same element is omitted for brevity.

Figure 45B:
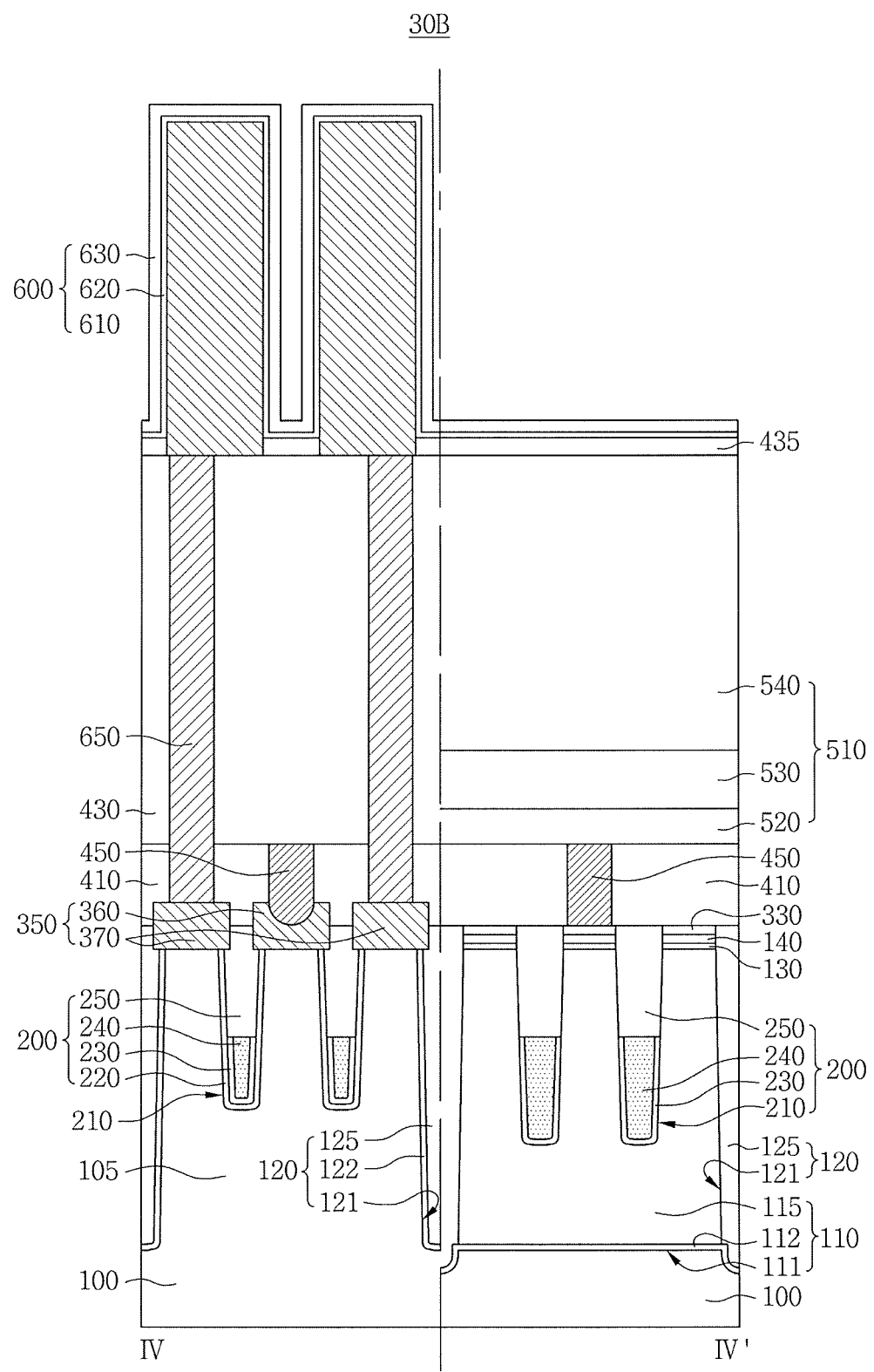

Referring to FIGS. 44A and 45B, a semiconductor device 30B according to an embodiment of the inventive concept has substantially the same structure as that of the semiconductor device 30A of FIG. 45A except for the structure of the gate capping layers 250. The top surface of the gate capping layers 250 are disposed at a level between the top surfaces of the adjacent bit line landing pad 360 and the storage contact landing pad 370. The top surface of the crossing field insulating materials 125 are disposed at a level between the top surfaces of the adjacent storage contact landing pads 370. A lower interlayer insulating layer 410 is filled on the top surfaces of the gate capping layers 250 and/or the crossing field insulating materials 125 between the landing pads 350. Like numerals may refer to like elements and any further descriptions with respect to the same element is omitted for brevity.

Figure 45C:
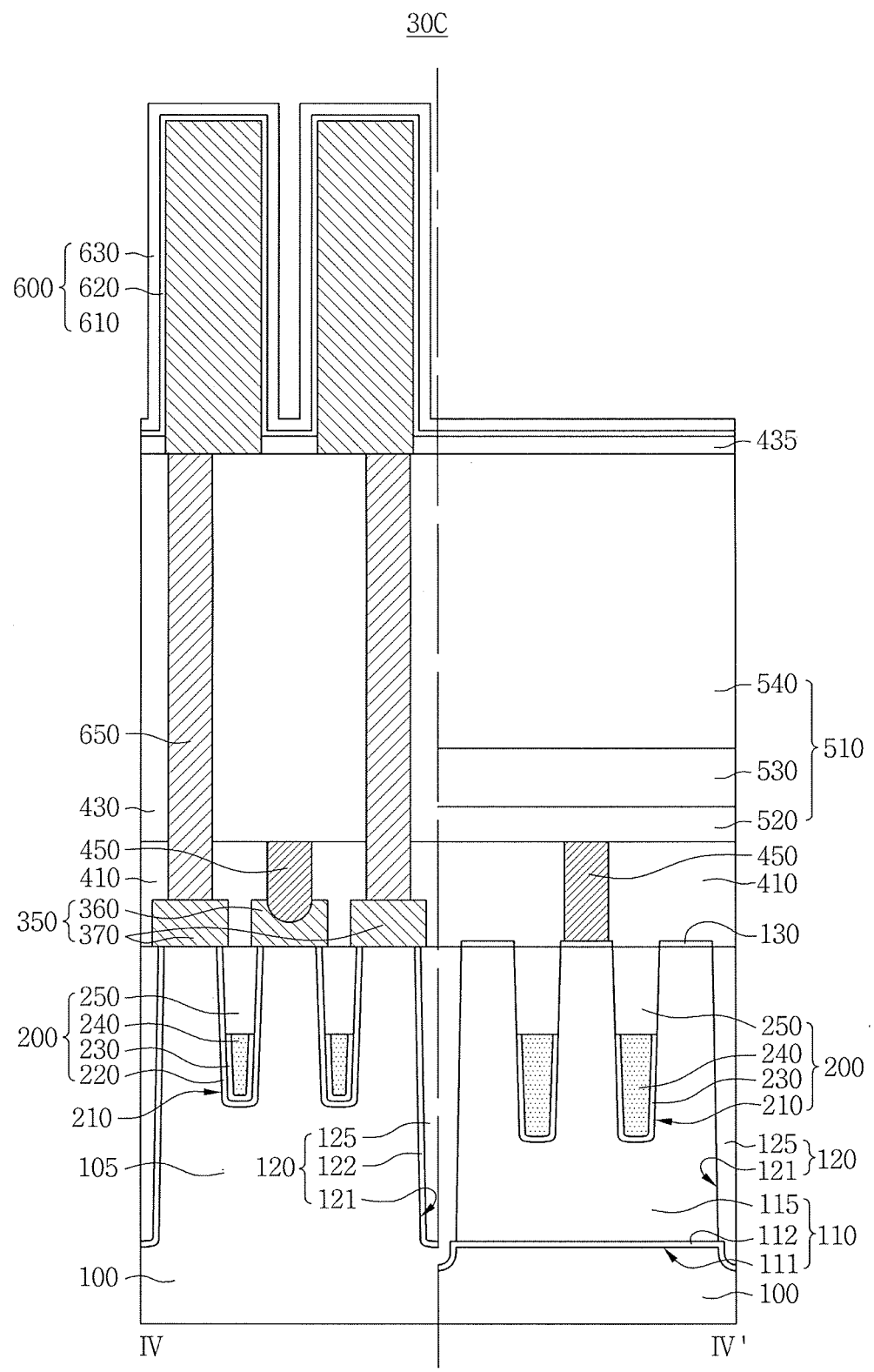

Referring to FIGS. 44A and 45C, a semiconductor device 30C according to an embodiment of the inventive concept has substantially the same structure as that of the semiconductor device 30A of FIG. 45A except for the structure of the gate capping layers 250. The top surface of the gate capping layers 250 is disposed at a level of the bottom surfaces of the landing pads 350. The top surface of the crossing field insulating materials 125 is disposed at a level of the bottom surfaces of the landing pads 350. A lower interlayer insulating layer 410 is filled on the top surfaces of the gate capping layers 250 and/or the crossing field insulating materials 125 between the landing pads 350. Like numerals may refer to like elements and any further descriptions with respect to the same element is omitted for brevity.

Figure 45D:
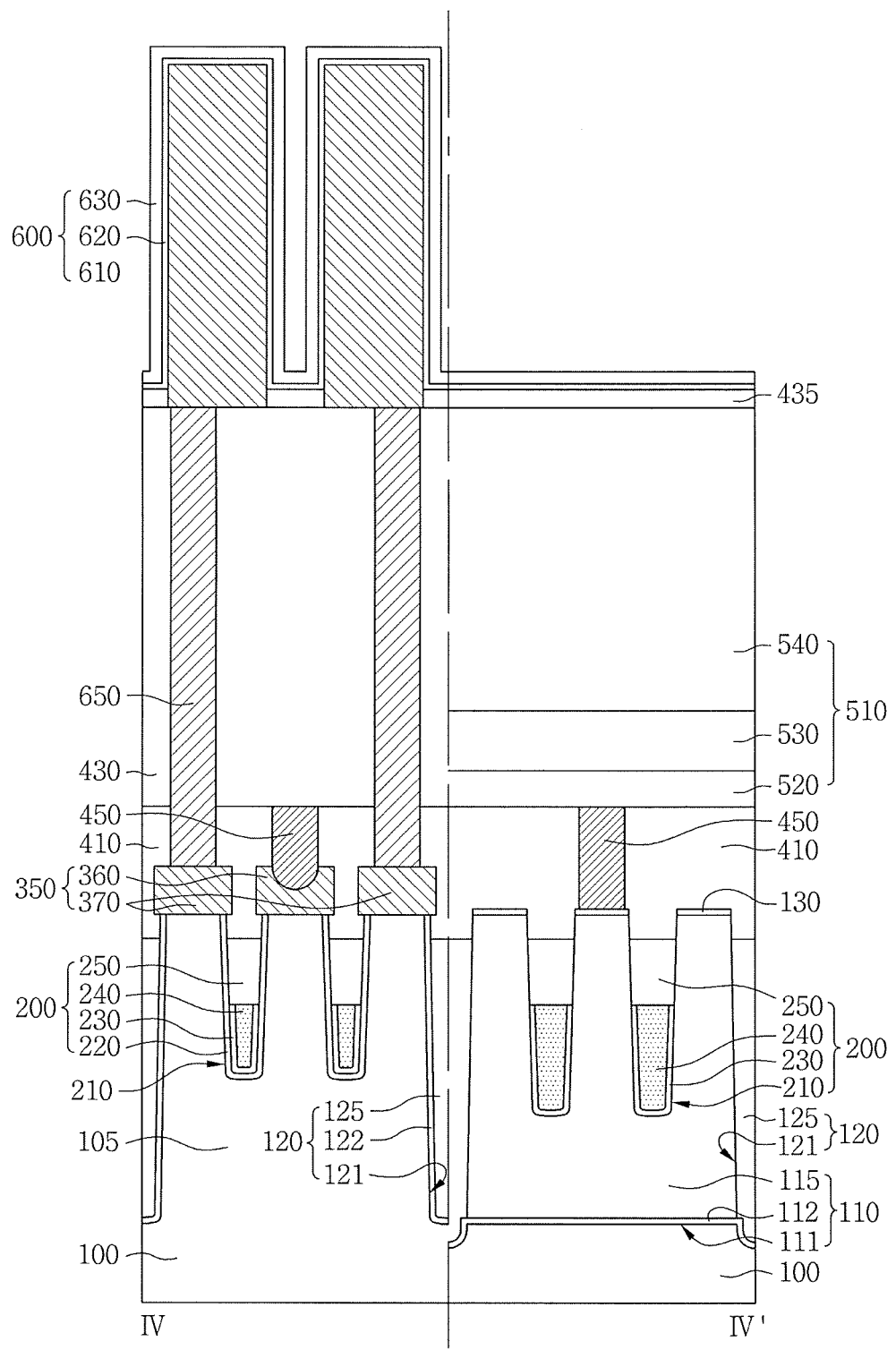

Referring to FIGS. 44A and 45D, a semiconductor device 30D according to an embodiment of the inventive concept has substantially the same structure as that of the semiconductor device 30A of FIG. 45A except for the structure of the gate capping layers 250. The top surface of the gate capping layers 250 is disposed below the bottom surfaces of the landing pads 350. The top surface of the crossing field insulating materials 125 is disposed below the bottom surfaces of the landing pads 350. A lower interlayer insulating layer 410 is filled on the top surfaces of the gate capping layers 250 and/or the crossing field insulating materials 125 between the landing pads 350. Like numerals may refer to like elements and any further descriptions with respect to the same element is omitted for brevity.

Figure 45E:
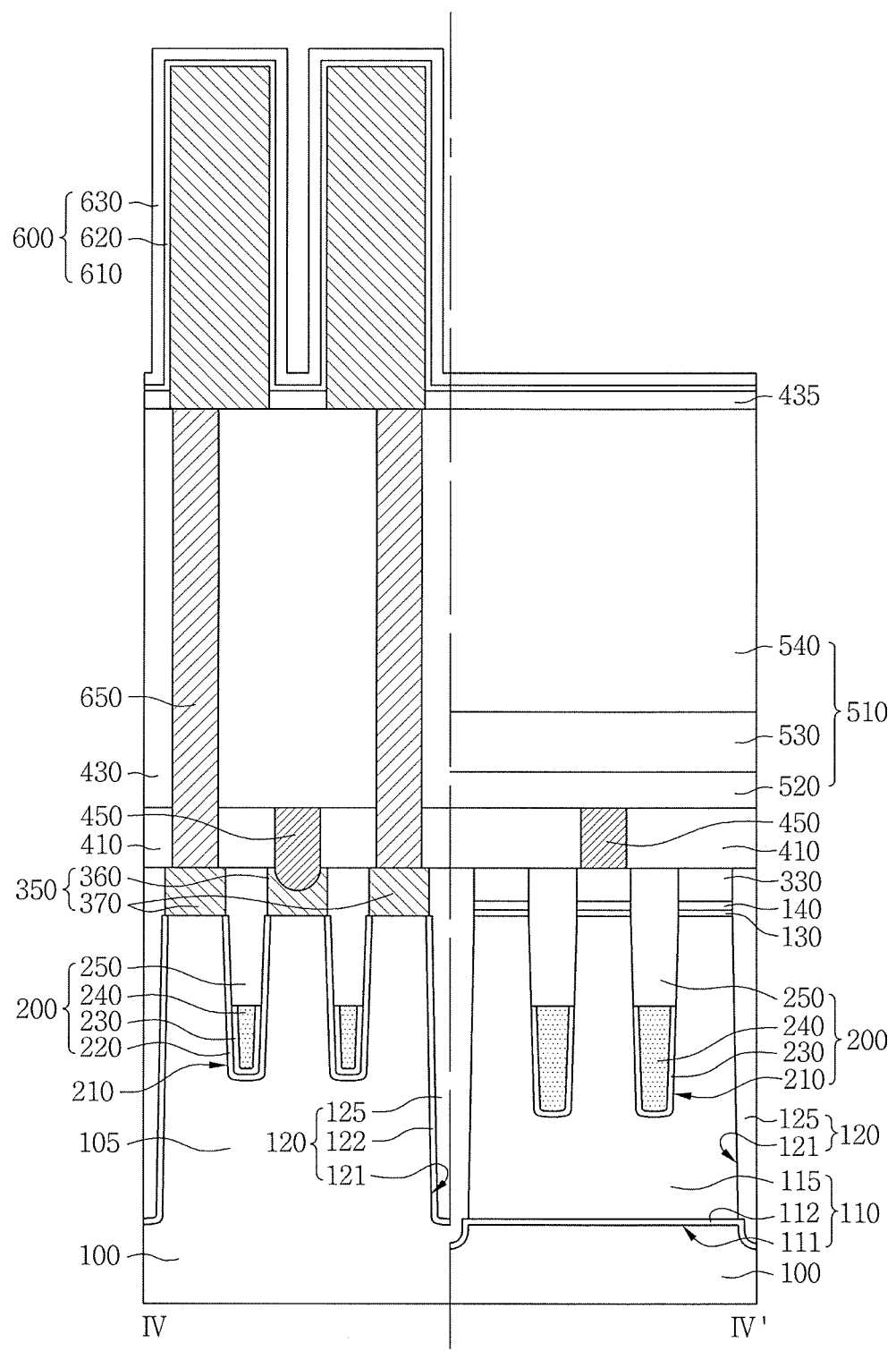

Referring to FIGS. 44A and 45E, a semiconductor device 30E according to an embodiment of the inventive concept has substantially the same structure as that of the semiconductor device 30A of FIG. 45A except for the structure of the landing pads 350. The gate structures 200 may include gate capping layers 250 protruding from the substrate 100 and have portions vertically aligned with inner walls of gate trenches 210 or gate insulating layers 220. The crossing field regions 120 may include a crossing field insulating material 125 protruding from the substrate 100 having a crossing field trench 121 and have a portion vertically aligned with an inner wall of the crossing field trench 121 or a crossing field insulating layer 122. Like numerals may refer to like elements and any further descriptions with respect to the same element is omitted for brevity.

Figure 45F:
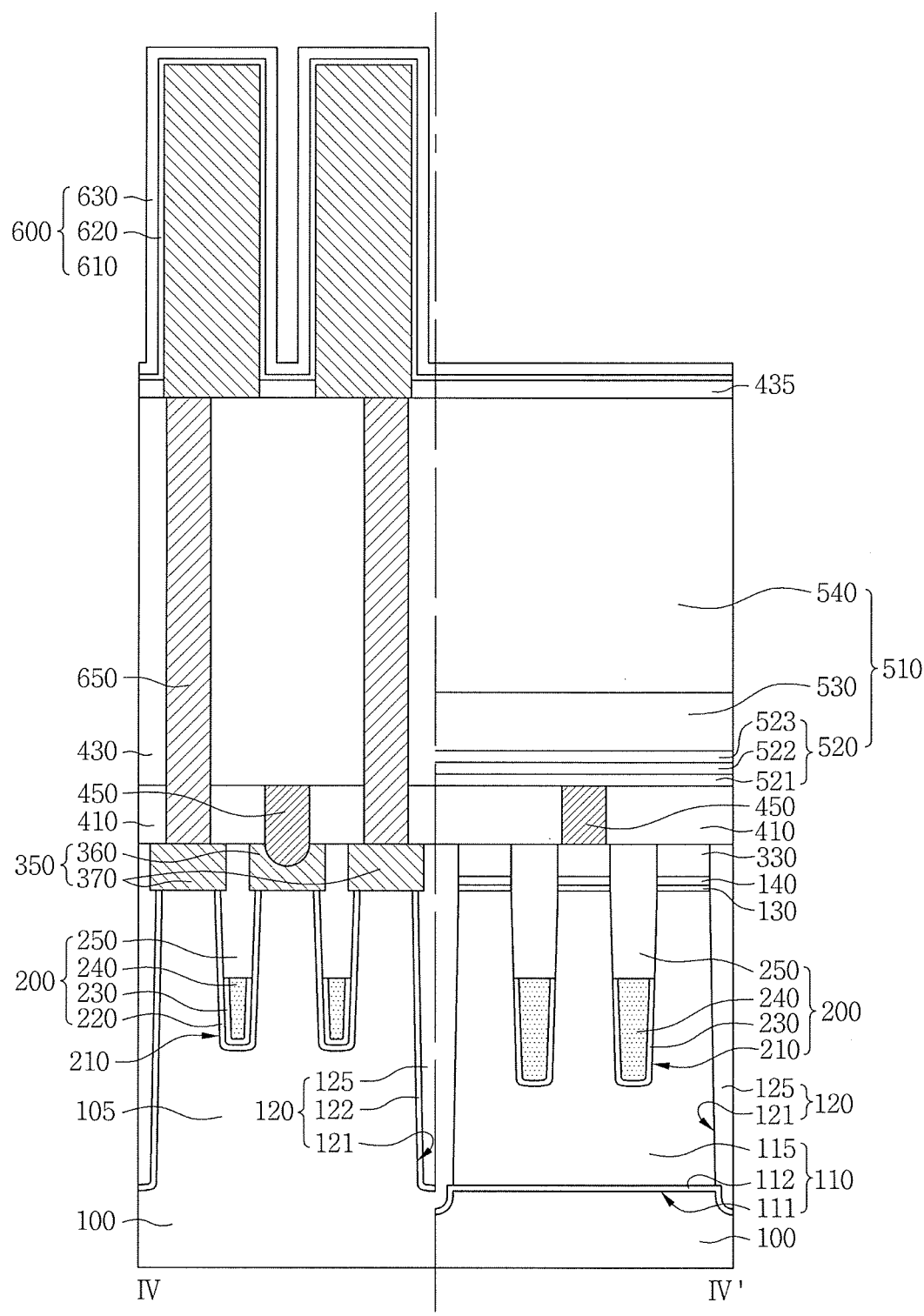

Referring to FIGS. 44A and 45F, a semiconductor device 30F according to an embodiment of the inventive concept may has substantially the same structure as that of the semiconductor device 30A of FIG. 45A except for the structure of the multilayered bit line barrier layer 520. Each of the bit line structures 500 may include a bit line stack 510 having a multilayered bit line barrier layer 520. The bit line barrier layer 520 may include a lower metal silicide layer 521, a barrier metal layer 522, and an upper metal silicide layer 523. The bit line contact plug 450 may be in contact with the landing pad insulating layer 330 on the parallel field region 110.

Figure 46A:
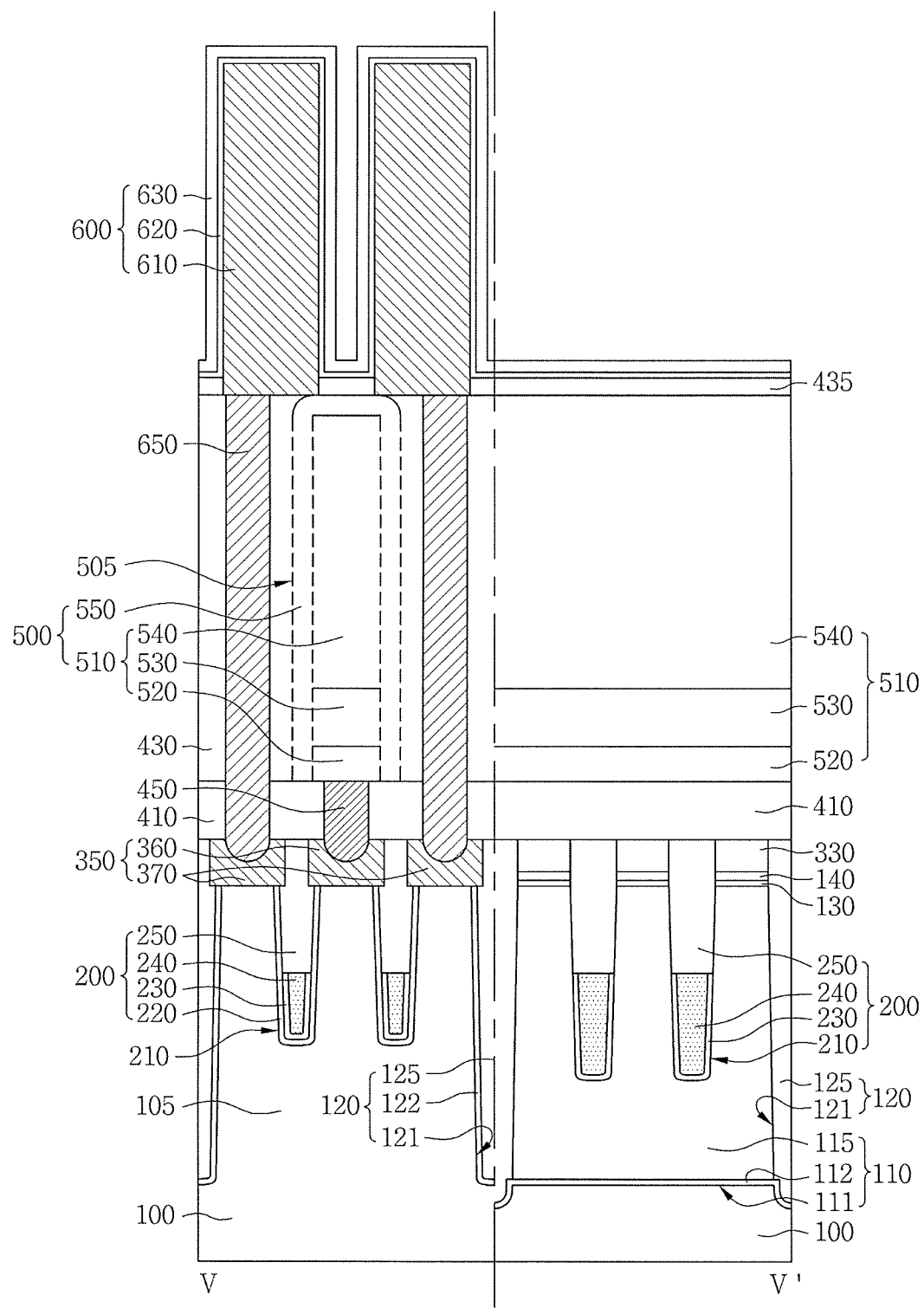
FIGS. 46A through 46F are cross-sectional views taken along line V-V' of FIG. 44B.

Referring to FIGS. 44B and 46A, a semiconductor device 40A according to an embodiment of the inventive concept may include parallel field regions 110 and crossing field regions 120 formed in a substrate 100 to define active regions 105. The crossing field regions 120 include crossing field insulating materials 125. Gate structures 200 including gate capping layers 250 are formed in the substrate 100 to cross the active regions 105 and the parallel field regions 110. Bit line contact landing pads 360 and storage contact landing pads 370 are formed on the substrate 100. Bit line contact plugs 450 are formed on the bit line contact landing pads 360, and bit line structures 500 are formed on the bit line contact plugs 450. Storage contact plugs 650 are formed on the storage contact landing pads 370, and storage structures 600 are formed on the storage contact plugs 650. A bit line stack 510 or a bit line structure 500 includes a padding unit 505 protruding or extending from the active region 105 onto the bit line contact plug 450. Top surfaces of the landing pads 350, the gate capping layers 250, and/or the crossing field insulating materials 125 may be disposed at substantially the same level or similar levels.

Figure 46B:
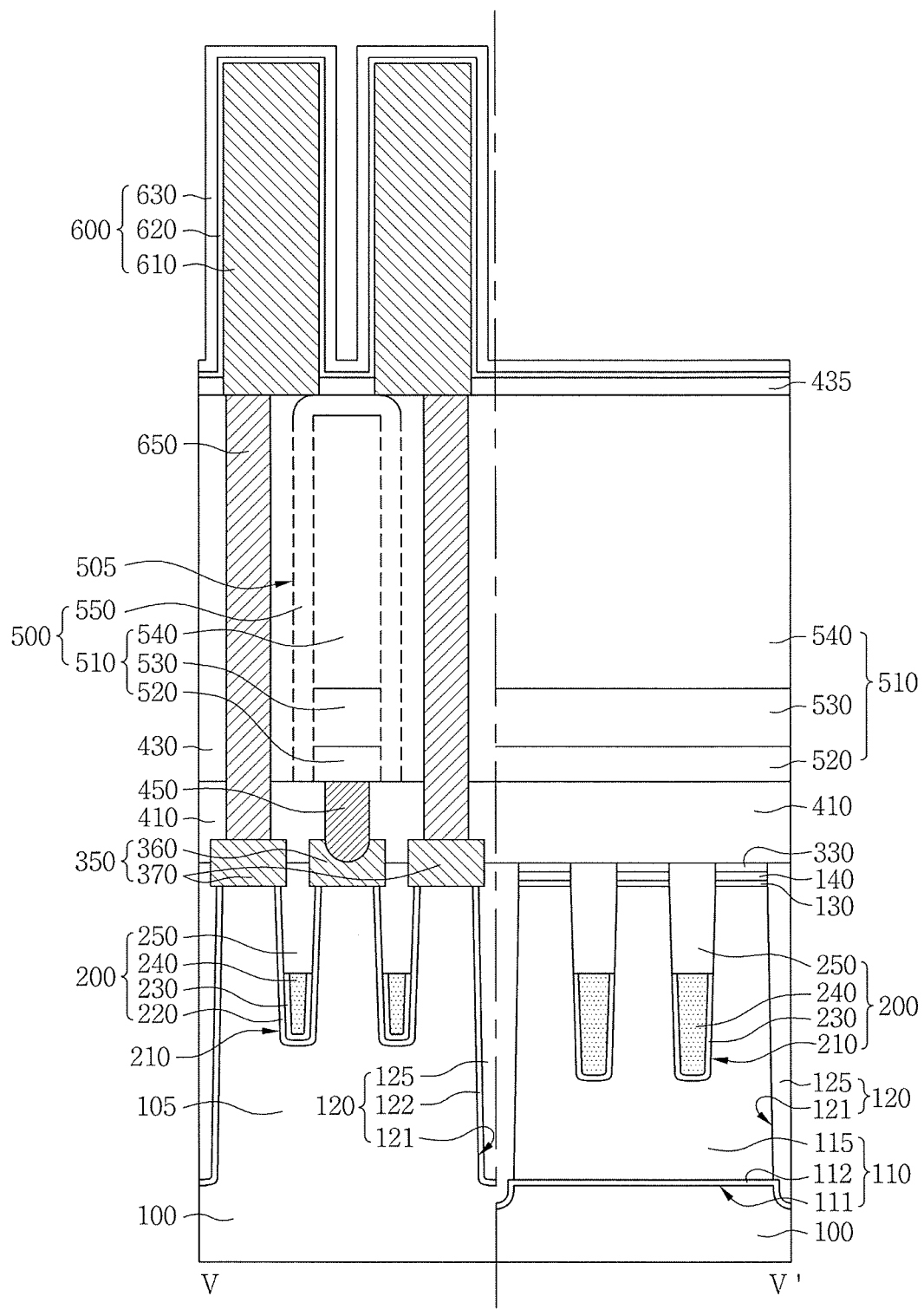

Referring to FIGS. 44B and 46B, a semiconductor device 40B according to an embodiment of the inventive concept has substantially the same structure as that of the semiconductor device 40A of FIG. 46A except for the structure of the gate capping layers 250. The top surface of the gate capping layers 250 are disposed at a level between the top surfaces of the adjacent bit line landing pad 360 and the storage contact landing pad 370. The top surface of the crossing field insulating materials 125 are disposed at a level between the top surfaces of the adjacent storage contact landing pads 370. A lower interlayer insulating layer 410 is filled on the top surfaces of the gate capping layers 250 and/or the crossing field insulating materials 125 between the landing pads 350. Like numerals may refer to like elements and any further descriptions with respect to the same element is omitted for brevity.

Figure 46C:
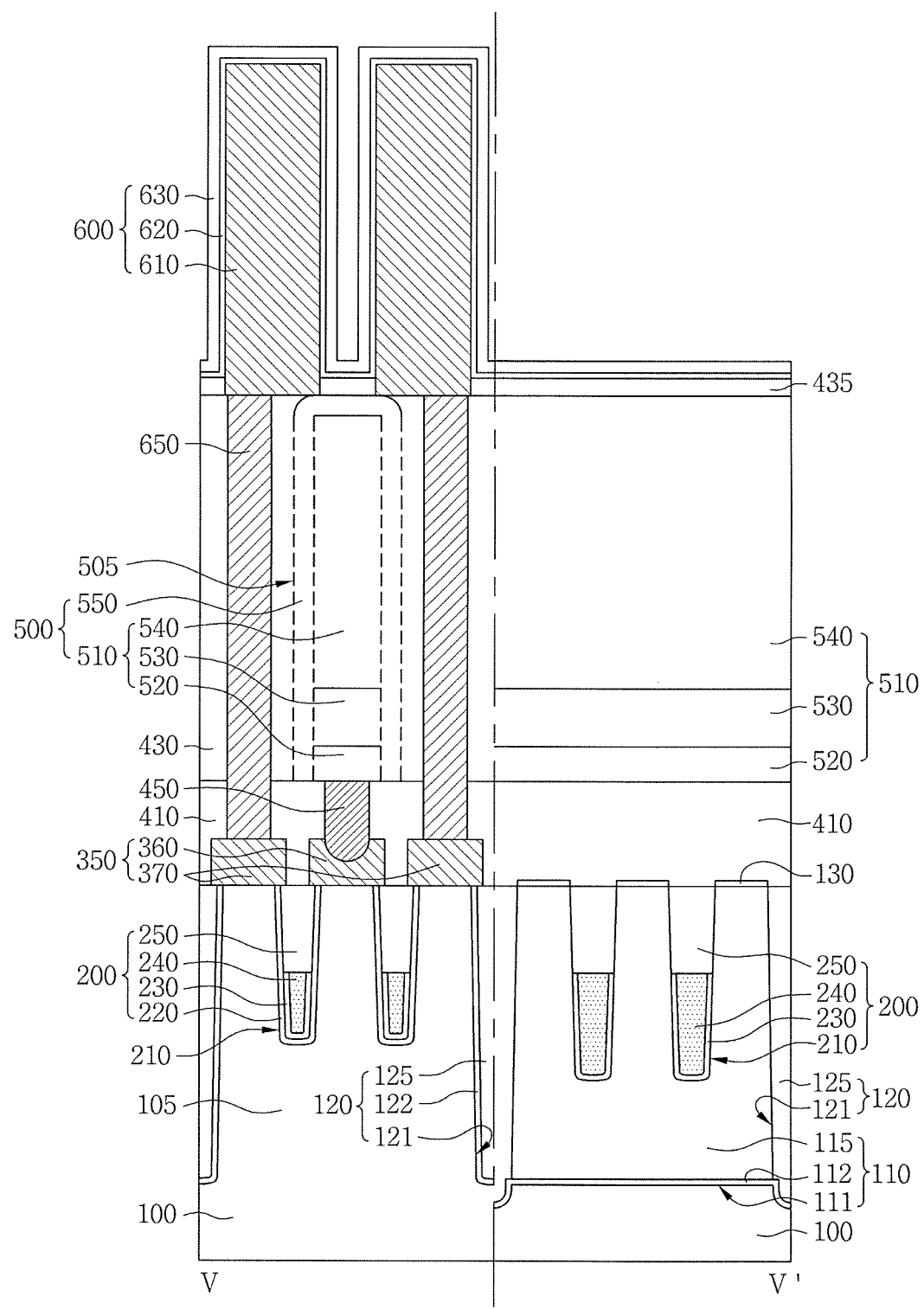

Referring to FIGS. 44B and 46C, a semiconductor device 40C according to an embodiment of the inventive concept has substantially the same structure as that of the semiconductor device 40A of FIG. 46A except for the structure of the gate capping layers 250. The top surface of the gate capping layers 250 is disposed at a level of the bottom surfaces of the landing pads 350. The top surface of the crossing field insulating materials 125 is disposed at a level of the bottom surfaces of the landing pads 350. A lower interlayer insulating layer 410 is filled on the top surfaces of the gate capping layers 250 and/or the crossing field insulating materials 125 between the landing pads 350. Like numerals may refer to like elements and any further descriptions with respect to the same element is omitted for brevity.

Figure 46D:
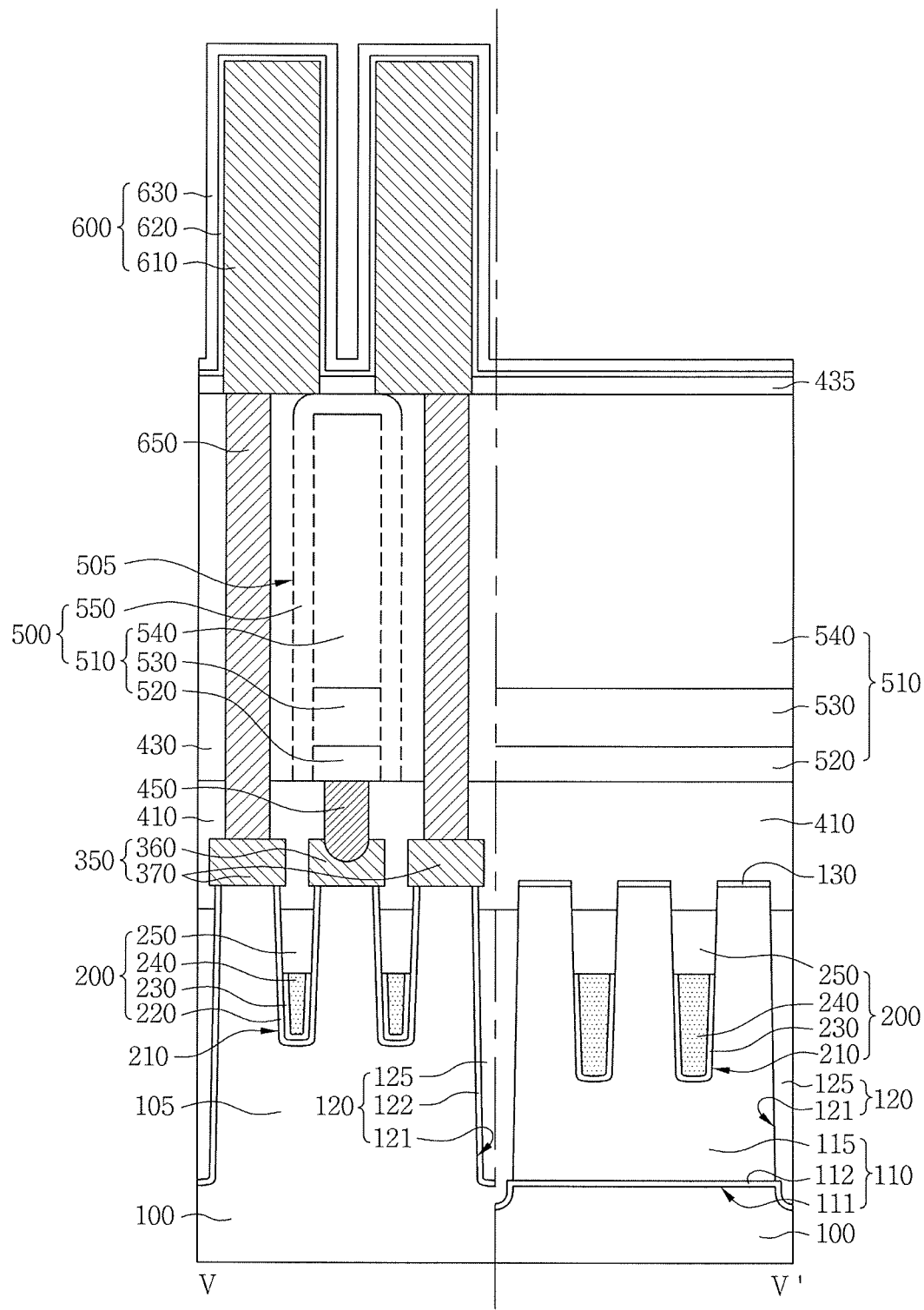

Referring to FIGS. 44B and 46D, a semiconductor device 40D according to an embodiment of the inventive concept has substantially the same structure as that of the semiconductor device 40A of FIG. 46A except for the structure of the gate capping layers 250. The top surface of the gate capping layers 250 is disposed below the bottom surfaces of the landing pads 350. The top surface of the crossing field insulating materials 125 is disposed below the bottom surfaces of the landing pads 350. A lower interlayer insulating layer 410 is filled on the top surfaces of the gate capping layers 250 and/or the crossing field insulating materials 125 between the landing pads 350. Like numerals may refer to like elements and any further descriptions with respect to the same element is omitted for brevity.

Figure 46E:
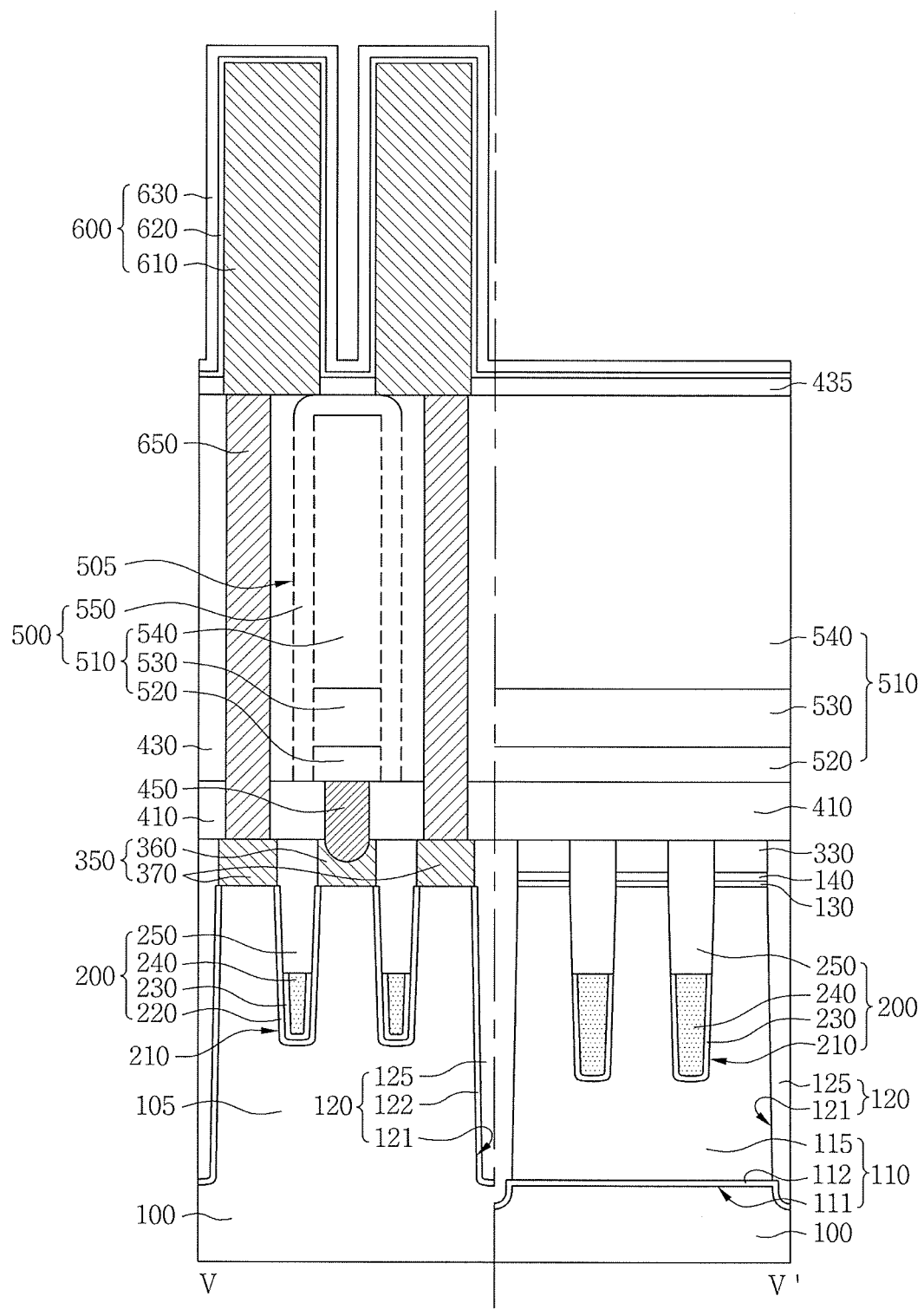

Referring to FIGS. 44B and 46E, a semiconductor device 40E according to an embodiment of the inventive concept has substantially the same structure as that of the semiconductor device 40A of FIG. 46A except for the structure of the landing pads 350. The gate structures 200 may include gate capping layers 250 protruding from the substrate 100 and have portions vertically aligned with inner walls of gate trenches 210 or gate insulating layers 220. The crossing field regions 120 may include a crossing field insulating material 125 protruding from the substrate 100 having a crossing field trench 121 and have a portion vertically aligned with an inner wall of the crossing field trench 121 or a crossing field insulating layer 122. Like numerals may refer to like elements and any further descriptions with respect to the same element is omitted for brevity.

Figure 46F:
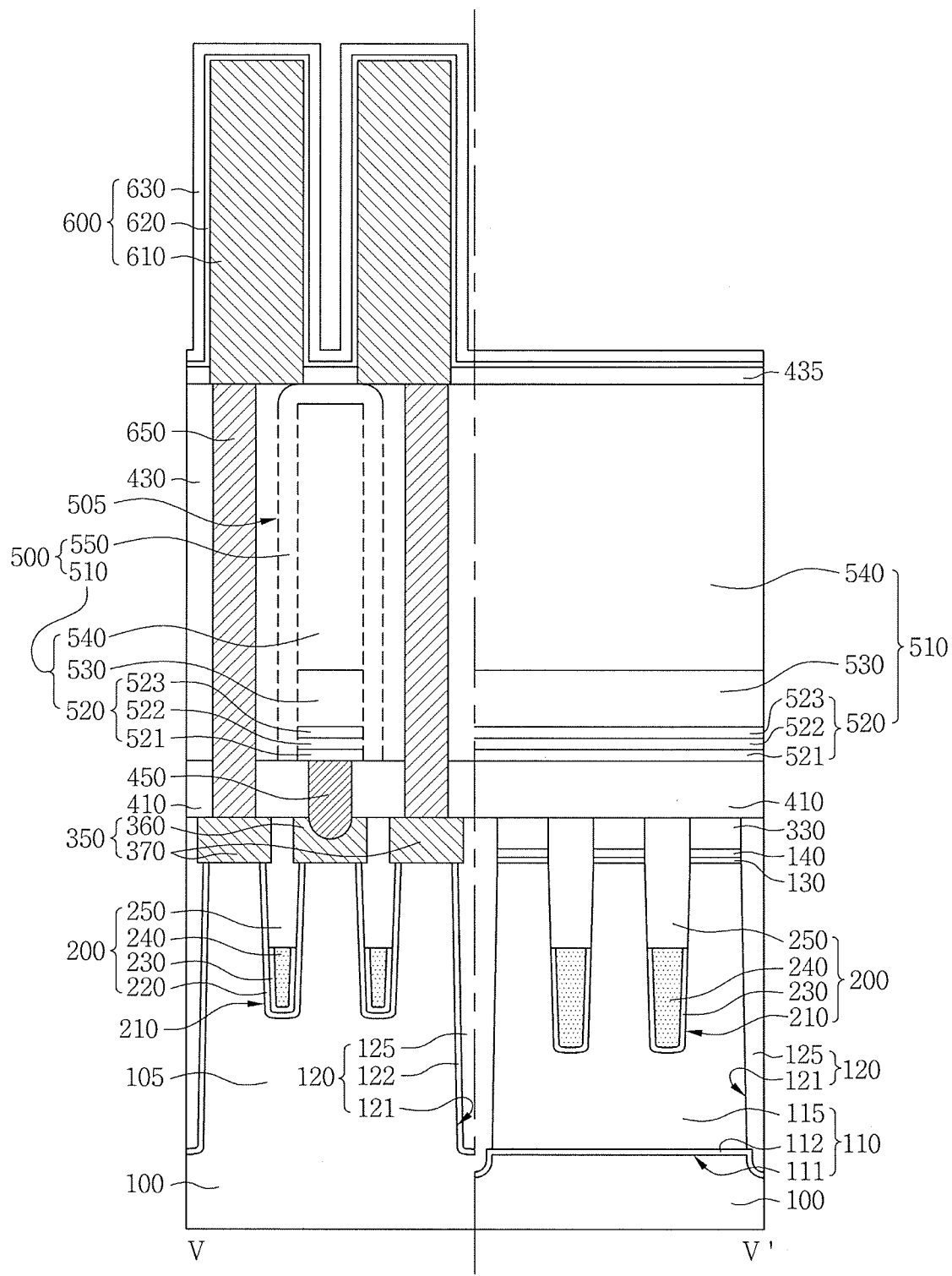

Referring to FIGS. 44B and 46F, a semiconductor device 40F according to an embodiment of the inventive concept has substantially the same structure as that of the semiconductor device 40A of FIG. 46A except for the structure of the multilayered bit line barrier layer 520. Each of the bit line structures 500 may include a bit line stack 510 having a multilayered bit line barrier layer 520. The bit line barrier layer 520 may include a lower metal silicide layer 521, a barrier metal layer 522, and an upper metal silicide layer 523. The bit line stack 510 or the bit line structure 500 may include a padding unit 505 protruding or extending from the active region 105 over the bit line contact plug 450. Like numerals may refer to like elements and any further descriptions with respect to the same element is omitted for brevity.

Figure 47A:
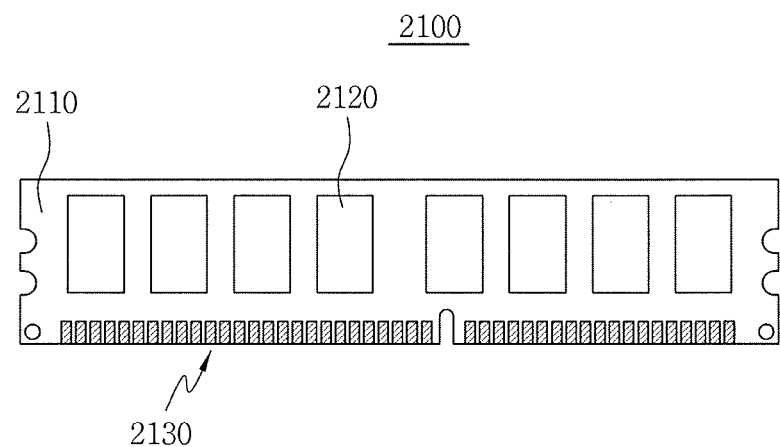
FIG. 47A is a conceptual diagram of a memory module including a semiconductor device according to an embodiment of the inventive concept.

FIG. 47A is a diagram of a memory module 2100 including at least one of the semiconductor devices according to embodiments of the inventive concept. Referring to FIG. 47A, the memory module 2100 includes a memory module substrate 2110, a plurality of memory devices 2120 disposed on the memory module substrate 2110, and a plurality of terminals 2130. The memory module substrate 2110 may include a printed circuit board (PCB) or a wafer. Each of the memory devices 2120 may be one of the semiconductor devices according to embodiments of the inventive concept, or a semiconductor package including one of the semiconductor devices. The plurality of terminals 2130 may include a conductive metal. The terminals 2130 may be electrically connected to the memory devices 2120, respectively. Since the memory module 2100 includes semiconductor devices having a small leakage current and good on-off current characteristics, the memory module 2100 may have improved module performance.

Figure 47B:
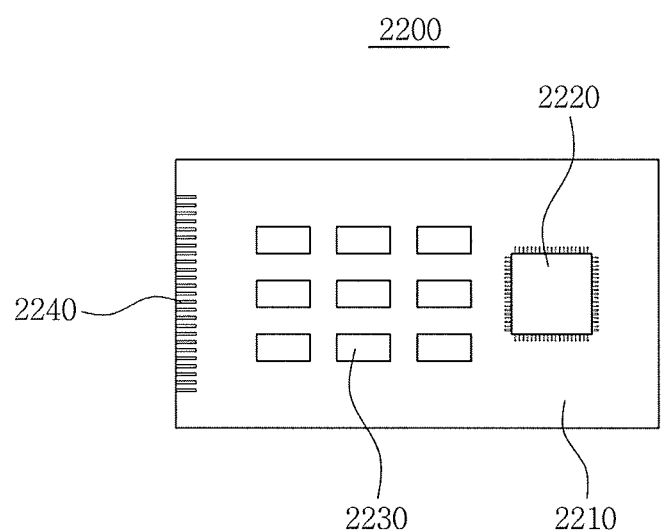
FIG. 47B is a conceptual diagram of a memory card including a semiconductor device according to an embodiment of the inventive concept.

FIG. 47B is a conceptual diagram of a semiconductor module 2200 including at least one of the semiconductor devices according to embodiments of the inventive concept. Referring to FIG. 47B, the semiconductor module 2200 according to an embodiment of the inventive concept may include one of the semiconductor devices 10A to 10C, 20A to 20F, and 30A and 30B according to embodiments of the inventive concept, which may be mounted on a semiconductor module substrate 2210. The semiconductor module 2200 may further include a microprocessor (MP) 2220 mounted on a module substrate 2010. Input/output (I/O) terminals 2240 may be disposed on at least one side of the module substrate 2210.

Figure 47C:
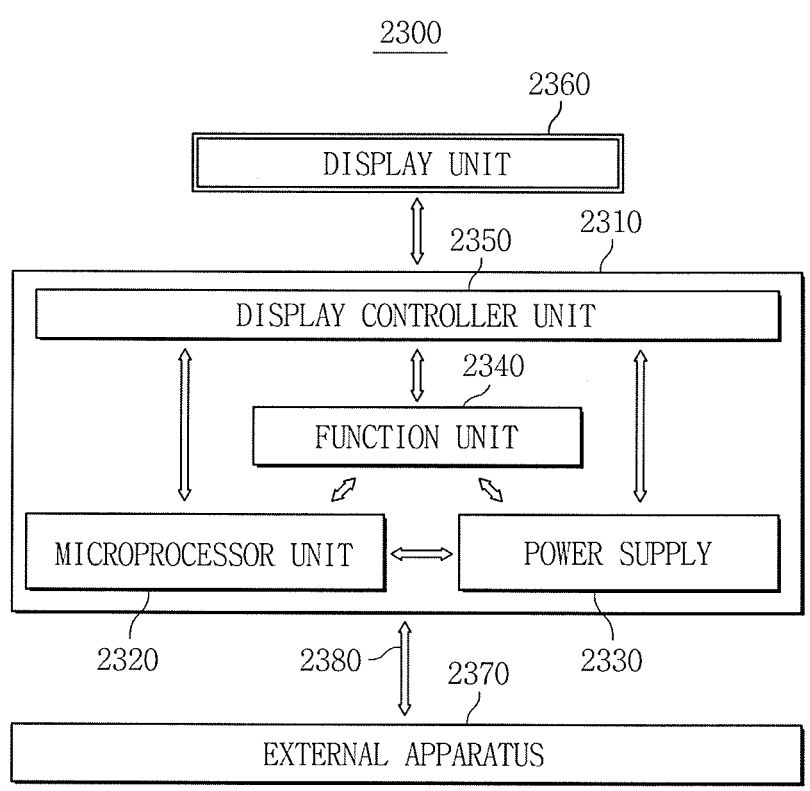
FIGS. 47C and 47D are diagrams of electronic systems according to embodiments of the inventive concept.

FIG. 47C is a schematic block diagram of an electronic system 2300 including at least one of semiconductor device according to embodiments of the inventive concept.

Referring to FIG. 47C, the semiconductor devices 10 and 20 according to embodiments of the inventive concept may be applied to an electronic system 2300. The electronic system 2300 may include a body 2310. The body 2310 may include an MP unit 2320, a power supply 2330, a function unit 2340, and a display controller unit 2350. The body 2310 may be a system board or mother board including a PCB. The MP unit 2320, the power supply 2330, the function unit 2340, and the display controller unit 2350 may be mounted on the body 2310. The display unit 2360 may be disposed on a top surface of the body 2310 or outside the body 2310. For example, the display unit 2360 may be disposed on the surface of the body 2310 and display an image processed by the display controller unit 2350. The power supply unit 2330 may function to receive a predetermined voltage from an external battery (not shown), divide the voltage into various required voltage levels, and supply the divided voltages to the MP unit 2320, the function unit 2340, and the display controller unit 2350. The MP unit 2320 may receive a voltage from the power supply unit 2330 and control the function unit 2340 and the display unit 2360. The function unit 2340 may serve various functions of the electronic system 2300. For example, when the electronic system 2300 is a mobile electronic device, such as a portable phone, the function unit 2340 may include several components capable of serving various functions of the portable phone, for example, outputting an image to the display unit 2360 or outputting a voice to a speaker, by dialing or communicating with an external apparatus 2370. When a camera is also mounted, the function unit 2340 may serve as a camera image processor.

In an embodiment, when the electronic system 2300 is connected to a memory card to increase capacity, the function unit 2340 may be a memory card controller. The function unit 2340 may transmit/receive signals to/from the external apparatus 2370 through a wired or wireless communication unit 2380. Furthermore, when the electronic system 2300 requires a universal serial bus (USB) to increase functionality, the function unit 2340 may serve as an interface controller. The semiconductor devices according to embodiments of the inventive concept may be applied to at least one of the MP unit 2320 and the function unit 2340.

Figure 47D:
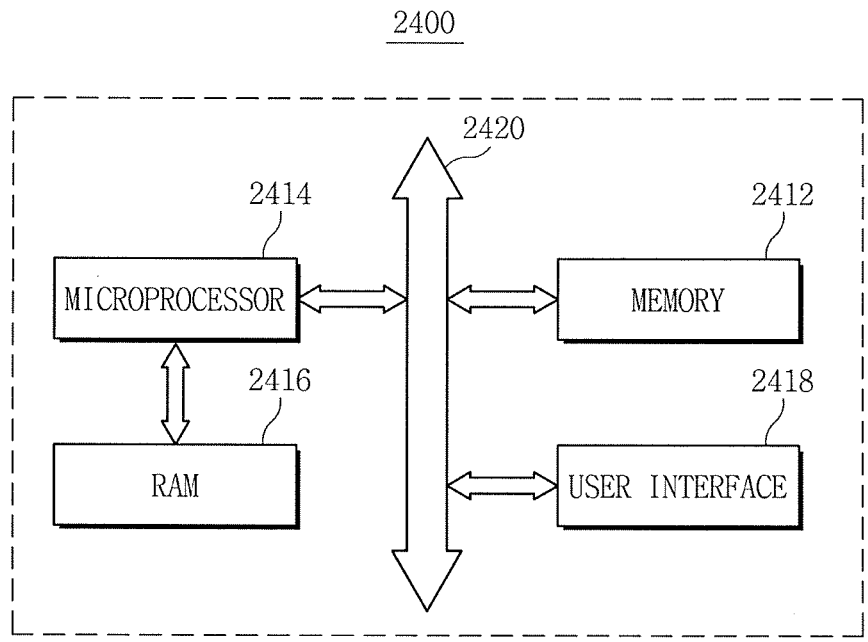

FIG. 47D is a schematic block diagram of an electronic system 2400 including at least one of the semiconductor devices according to embodiments of the inventive concept. Referring to FIG. 47D, the electronic system 2400 may include at least one of the semiconductor devices according to embodiments of the inventive concept. The electronic system 2400 may be used to fabricate a mobile device or computer. For example, the electronic system 2400 may include a memory system 2412 and further include an MP 2414, a random access memory (RAM) 2416, and a user interface 2418, which may communicate data using a bus 2420. The MP 2414 may program and control the electronic system 2400. The RAM 2416 may be used as an operation memory of the MP 2414. For example, the MP 2414 or the RAM 2416 may include at least one of semiconductor devices according to embodiments of the inventive concept. The MP 2414, the RAM 2416, and/or other components may be assembled within a single package. The user interface 2418 may be used to input/output data to/from the electronic system 2400. The memory system 2412 may store codes for operating the MP 2414, data processed by the MP 2414, or external input data. The memory system 2412 may include a controller and a memory.

Figure 47E:
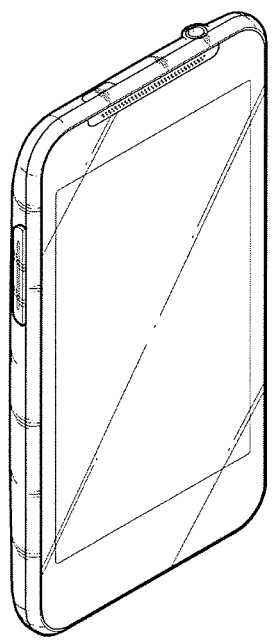
FIG. 47E is a diagram of a wireless mobile phone according to an embodiment of the inventive concept.

FIG. 47E is a schematic diagram of a mobile wireless phone 2500 including at least one of the semiconductor devices according to embodiments of the inventive concept. The mobile wireless phone 2500 may be interpreted as a tablet personal computer (PC). In addition, at least one of the semiconductor devices according to embodiments of the inventive concept may be used not only for a tablet PC but also for a portable computer such as a laptop computer, an MPEG-1 audio layer 3 (MP3) player, an MP4 player, a navigation device, a solid-state disk (SSD), a desktop computer, or electronic devices for automotive and household uses.

According to embodiments of the inventive concept, semiconductor devices can have improved alignment margins, and conductive components can have low electrical resistances and be reliably isolated from one another. Since patterns can be formed using a self-alignment process without adding a photolithography process, unit cost of production can be reduced, and productivity can increase. Various other effects of the inventive concept have been mentioned in the specification.

The embodiments described above are illustrative and are not to be construed as limiting thereof. Based on the embodiments described, those skilled in the art will readily appreciate that many modifications are possible without materially departing from the novel teachings and advantages. Accordingly, all such modifications are intended to be included within the scope of this inventive concept as defined in the claims.

What is claimed is:

1. A method of fabricating a semiconductor device, comprising:
   forming a first field region extending in a first direction in a substrate;
   forming a pair of buried gate structures extending across the first field region at a predetermined angle with respect to the first direction; and
   forming a second field region extending in substantially parallel with the buried gate structure, wherein the first field region intersects with the second field region at an intersection region, the intersection region having greater depth than that of the first and the second field regions,
   wherein the forming the pair of buried gate structure comprises:
      forming a gate mask pattern having a pair of gate trench holes on the substrate;
      forming a pair of gate trenches in the substrate using the gate mask pattern as an etch mask; and
      forming a pair of gate capping layers to fill the pair of gate trenches, and
   wherein the forming the second field region comprises:
      recessing the gate mask pattern partially so that each of the gate capping layers includes an upper portion exposed from the recessed the gate mask pattern;
      forming a spacer mask pattern on side surfaces of the upper portions of the gate capping layers and on the recessed gate mask pattern;
      etching the substrate using the spacer mask pattern as an etch mask to form a second field trench in the substrate; and
      forming a second field insulating material to fill the second field trench.

2. The method of claim 1, wherein the forming the spacer mask pattern comprises:
   forming a spacer mask material layer to cover the gate capping layers and the recessed gate mask pattern;
   etching the spacer mask material layer to expose a portion of the gate mask pattern; and
   etching the exposed portion of the gate mask pattern to form a field trench hole exposing the surface of the substrate.

3. The method of claim 2, wherein the forming the gate mask pattern comprises:
   forming a pad insulating layer on the substrate;
   forming a buffer insulating layer on the pad insulating layer; and
   forming the gate mask pattern on the buffer insulating layer.

4. The method of claim 3, further comprising:
   removing the spacer mask pattern to expose the gate mask pattern after forming the second field insulating material.

5. The method of claim 4, further comprising:
   removing the exposed gate mask pattern so that the buffer insulating layer is exposed,
   the upper portions of the pair of gate capping layers are exposed, and an upper portion of the second field insulating material is exposed.

6. The method of claim 5, further comprising:
   forming a sacrificial layer on the exposed buffer insulating layer, the exposed upper portions of the pair of gate capping layers and the exposed upper portion of the second field insulating material.

7. The method of claim 6, further comprising:
removing the sacrificial layer over the first field region to form a landing pad trench.

8. The method of claim 7, further comprising:
forming a landing pad insulating layer including silicon nitride to fill the landing pad trench.

9. The method of claim 8, further comprising:
removing the landing pad insulating layer partially so that top surfaces of the landing pad insulating layer, the gate capping layer and the second field insulating material are substantially planarized.

10. The method of claim 9, further comprising:
removing a remaining portion of the sacrificial layer to form a landing pad hole defined by the landing pad insulating layer and the pair of gate capping layers.

11. The method of claim 10, further comprising:
removing the landing pad insulating layer and the gate capping layers partially so that the landing pad hole is expanded and overlap the buried gate structures partially.

12. The method of claim 11, further comprising:
forming a landing pad in the landing pad hole, the landing pad overlapping the buried gate structures partially.

* * * * *